(12) United States Patent
King et al.

(10) Patent No.: US 9,530,911 B2
(45) Date of Patent: Dec. 27, 2016

(54) SOLAR CELL STRUCTURES FOR IMPROVED CURRENT GENERATION AND COLLECTION

(71) Applicant: The Boeing Company, Seal Beach, CA (US)

(72) Inventors: Richard R. King, Thousand Oaks, CA (US); Christopher M. Fetzer, VAlencia, CA (US); Daniel C. Law, Arcadia, CA (US); Xing-Quan Liu, Arcadia, CA (US); William D. Hong, Los Angeles, CA (US); Kenneth M. Edmondson, Burbank, CA (US); Dimitri D. Krut, Encino, CA (US); Joseph C. Boisvert, Thousand Oaks, CA (US); Nasser H. Karam, La Canada, CA (US)

(73) Assignee: THE BOEING COMPANY, Chicago, IL (US)

( * ) Notice: Subject to any disclaimer, the term of this patent is extended or adjusted under 35 U.S.C. 154(b) by 507 days.

(21) Appl. No.: 13/831,056

(22) Filed: Mar. 14, 2013

(65) Prior Publication Data

US 2014/0261611 A1    Sep. 18, 2014

(51) Int. Cl.
  *H01L 31/044*  (2014.01)
  *H01L 31/0352*  (2006.01)
  *H01L 31/0687*  (2012.01)

(52) U.S. Cl.
  CPC ... *H01L 31/035272* (2013.01); *H01L 31/0352* (2013.01); *H01L 31/035209* (2013.01); *H01L 31/0687* (2013.01); *Y02E 10/544* (2013.01)

(58) Field of Classification Search
  CPC ........ H01L 31/00–31/078; Y02E 10/50–10/60
  USPC .................................. 136/243–265
  See application file for complete search history.

(56) References Cited

U.S. PATENT DOCUMENTS

| | | | |
|---|---|---|---|
| 4,206,002 A * | 6/1980 | Sabnis | H01L 31/065 136/249 |
| 4,688,068 A | 8/1987 | Chaffin et al. | |
| 2003/0070707 A1* | 4/2003 | King | H01L 31/02168 136/255 |
| 2003/0155584 A1* | 8/2003 | Barber | C30B 25/02 257/200 |
| 2007/0137695 A1 | 6/2007 | Fetzer et al. | |
| 2012/0031478 A1* | 2/2012 | Boisvert | H01L 31/072 136/255 |
| 2012/0211068 A1 | 8/2012 | Cornfeld et al. | |
| 2012/0240987 A1 | 9/2012 | King et al. | |

OTHER PUBLICATIONS

European Search Report dated May 8, 2014 for European Application No. 14 158 766.7, 9 pages.

(Continued)

*Primary Examiner* — Bach Dinh
(74) *Attorney, Agent, or Firm* — Smith Moore Leatherwood LLP

(57) ABSTRACT

In one aspect, optoelectronic devices are described herein. In some implementations, an optoelectronic device comprises a photovoltaic cell. The photovoltaic cell comprises a space-charge region, a quasi-neutral region, and a low bandgap absorber region (LBAR) layer or an improved transport (IT) layer at least partially positioned in the quasi-neutral region of the cell.

39 Claims, 40 Drawing Sheets

(56) References Cited

OTHER PUBLICATIONS

Cornfeld et al., "Evolution of a 2.05 eV AlGaInP Top Sub-cell for 5 and 6J-IMM Applications," Photovoltaic Specialists Conference, 2012 38th IEEE, Jun. 3, 2012, pp. 2788-2791.

* cited by examiner

SOLAR CELL STRUCTURES FOR IMPROVED CURRENT GENERATION AND COLLECTION

STATEMENT REGARDING FEDERALLY SPONSORED RESEARCH

This disclosure was made with Government support under the Dual-Use Science and Technology (DUS&T) Program, Contract Nos. F29601-98-2-0207 and FA9453-04-2-0042 awarded by the U.S. Air Force Research Laboratory (AFRL). The Government has certain rights in this disclosure.

FIELD

The present disclosure generally relates to optoelectronic devices, and more specifically, to single junction and multijunction solar cells, to photovoltaic cells having low bandgap absorber regions (LBARs), and to lattice-matched and metamorphic solar cells.

BACKGROUND

A photovoltaic device or solar cell is a device that is capable of converting sunlight to electrical energy by the photovoltaic effect. A solar cell, such as a multijunction solar cell, can have one or more component photovoltaic cells, also called subcells. These component photovoltaic cells, or subcells, may be connected in series to form a multijunction solar cell, but may also be connected in other electrical configurations, such as in parallel, or in a combination of series and parallel connections.

The interest in solar cells has been increasing due to concerns regarding pollution, energy security, and limited available resources. This interest has been for both terrestrial and space applications. In space applications, solar cells have been in use for more than 40 years and the development of higher efficiency solar cells enables increased payload capabilities. In terrestrial applications, higher solar cell efficiency for conversion of sunlight to electricity results in a smaller collecting area required for a given electrical power output, and therefore lower cost per watt, and greater cost effectiveness for a terrestrial photovoltaic system.

The cost per watt of electrical power generation capacity for photovoltaic systems inhibits their widespread use in terrestrial applications. The conversion efficiency of sunlight to electricity is typically of crucial importance for terrestrial PV systems, since increased efficiency results in a reduction of all area-related electricity generation system components (such as cell area, module or collector area, support structures, and land area) for a required power output of the system. For example, in concentrator solar cell systems which concentrate sunlight from around 2 to around 2000 times onto the solar cell, an increase in efficiency typically results in a reduction of an area comprising expensive concentrating optics. Improvements in solar cell efficiency are extremely leveraging at the system level, and the dollar per watt ($/watt) ratio is a typical figure-of-merit applied at the system level. For satellites, solar panels represent <10% of the entire system cost so that a relative improvement in solar cell efficiency of 3% over an existing technology generation results in leveraged cost savings. The same is true of terrestrial concentrator solar power systems where the cost of the solar receiver is a fraction of the overall system cost.

To increase the electrical power output of such cells, multiple subcells or layers having different energy bandgaps have been stacked so that each subcell or layer can absorb a different part of the wide energy distribution in the sunlight. This arrangement, called a multijunction (MJ) solar cell, is advantageous, since each photon absorbed in a subcell corresponds to one unit of charge that is collected at the subcell operating voltage, which increases as the bandgap of the semiconductor material of the subcell increases. Since the output power is the product of voltage and current, an ideally efficient solar cell would have a large number of subcells, each absorbing only photons of energy negligibly greater than its bandgap.

In multijunction solar cells it is often desirable to modify the bandgaps of the semiconductor layers that form the subcells within the multijunction cell, and thereby modify the subcell voltages and wavelength ranges over which the subcells respond to incident light, for instance, to space and terrestrial solar spectra. The specific bandgaps and thicknesses of layers that form the subcells within a multijunction cell determine the subcell voltages, the current densities of each subcell, whether the subcell current densities can be matched to one another as is desired in a series-interconnected multijunction cell, and how the broad solar spectrum is divided into narrower wavelength ranges by the combination of subcell bandgaps to achieve higher sunlight-to-electricity conversion. A crucial technological challenge in the design of multijunction solar cells is how to achieve the optimum or near-optimum combination of subcell layer bandgaps, and how to achieve the desired wavelength ranges of subcell response—the wavelength ranges in which the subcells have photogenerated current that can be collected usefully—in order to maximize the multijunction solar cell efficiency. Often the semiconductors that are readily useable—e.g., semiconductors that are lattice-matched to relatively common, inexpensive substrates; that can be grown with favorable minority-carrier properties such as lifetime and mobility; or that do not cause unwanted doping or impurities in other parts of the cell—do not have the bandgaps that result in the most favorable combination of multijunction subcell bandgaps for conversion of the solar spectrum.

In optimum subcell bandgap combinations for multijunction cells under typical space (AM0) and terrestrial (AM1.5 Direct, or AM1.5D) solar spectra, the desired bandgap of the upper subcell—also referred to as the top cell, or cell 1 (C1), also called subcell 1—is often greater than the bandgap of GaInP at the same lattice constant of cell 2 (C2) upon which the top cell is grown. Therefore, it is desirable to use AlGaInP to raise the bandgap of cell 1. However, Al-containing semiconductors often have diminished minority-carrier properties in practice, such as lifetime, mobility, and diffusion length, compared to their Al-free counterparts, resulting in reduced current collection from Al-containing solar cell layers. This is particularly evident when the top cell emitter is formed from n-type AlGaInP. Thus there is a need for solar cell layers with improved minority-carrier properties and current collection that can be used in a top cell for which the main absorber layer is high-bandgap AlGaInP.

Additionally, in multijunction solar cells some photogeneration layers—defined here as layers in which charge carriers are photogenerated and can be collected, including in a useful manner—have low absorptance due to other design constraints in the solar cell. It is desirable to increase photogeneration in these weakly absorbing structures, and thereby increase current density of the subcell and multijunction cell.

Past approaches to increasing photogenerated current density include increasing the thickness of current generating regions for which there is insufficient light absorption above the bandgap. However, in many cases, absorption of light by the solar cell with photon energy above the solar cell bandgap is nearly complete, so increasing the thickness has little effect on the current, or can cause the current to decrease due to poorer collection of photogenerated charge carriers from thicker solar cell layers. Another approach has been to lower the bandgap of the semiconductors used to form the current generating regions of a solar cell. However, this approach also lowers the solar cell voltage. In addition, lowering the bandgap by changing the semiconductor composition often changes the crystal lattice constant, creating a greater lattice mismatch with other layers in the solar cell, which can lead to a higher density of harmful dislocations in the lattice-mismatched subcell.

There exists a need for solar cells and other optoelectronic devices having 1) semiconductor layers that photogenerate a greater quantity of charge carriers; 2) semiconductor layers that facilitate collection of photogenerated minority charge carriers in the solar cell to form useful current density; 3) a more nearly optimum combination of subcell bandgaps and subcell wavelength response ranges in multijunction devices for better energy conversion efficiency; and 4) device structures that increase the photogeneration in and usefully collected current from weakly absorbing or incompletely absorbing photogeneration layers in the solar cell.

SUMMARY

The present disclosure provides device structures that, in some implementations, 1) result in greater photogeneration of charge carriers, 2) result in greater collected current density from photogenerated charge carriers, 3) result in more advantageous combinations of bandgaps and wavelength response ranges in multijunction solar cells and other optoelectronic devices, and/or 4) enhance the current density from weakly absorbing photogeneration layers. These device performance aspects can interact strongly with one another in a solar cell or other optoelectronic device, and the disclosed device structures may have one or more of these advantageous features. Thus, in some cases, the disclosed devices offer increased efficiency and performance.

In some implementations, a device described herein is an inorganic semiconductor device. Moreover, a device described herein can comprise a photodiode or a photovoltaic device, such as a multijunction photovoltaic device.

In accordance with the disclosure, a semiconductor structure is disclosed that, in some implementations, achieves greater photogenerated current density due to one or more low-bandgap absorber region (LBAR) layers positioned in part or entirely in the quasi-neutral region or regions of a solar cell. For reference purposes herein, a LBAR layer is an absorbing layer that has a lower bandgap than one or both of the two immediately adjacent semiconductor layers. The low bandgap of an LBAR layer may be achieved by various means, as detailed below. Additionally, for reference purposes herein, an immediately adjacent semiconductor layer, in some implementations, is in contact or forms a junction with the LBAR layer.

An absorbing layer, for reference purposes herein, comprises a layer that absorbs incident electromagnetic radiation and generates an electron-hole pair or extractable charge carriers as a result. Further, the quasi-neutral region, as understood by one of ordinary skill in the art, is a non-space-charge region. Thus, in some implementations, the quasi-neutral region comprises the region within the emitter layer and/or base layer of a semiconductor structure that is not the space-charge region. Moreover, as understood by one of ordinary skill in the art, the boundaries of a space-charge region of a semiconductor structure can be affected by one or more of the semiconductor materials used, the doping level of the materials, and the applied bias or open-circuit voltage. In addition, for reference purposes herein, an emitter layer is in front of or above a base layer, such that the emitter layer is the photogeneration layer that is closer to the incident radiation.

In another aspect, a semiconductor structure is disclosed that, in some implementations, achieves greater semiconductor device current density, voltage, fill factor, and/or energy conversion efficiency due to one or more improved transport (IT) layer(s) positioned in part or entirely in the quasi-neutral region or regions (non-space-charge region or regions) of a semiconductor device such as a solar cell or photodetector. For reference purposes herein, an transport (IT) layer can be a layer with higher minority-carrier lifetime, minority-carrier mobility, minority-carrier diffusion length, majority-carrier mobility, majority-carrier conductance, charge-carrier saturation velocity in an electric field, and/or collected photogenerated current density than in the primary photogeneration layers, one or more adjacent photogeneration layers, a replacement layer having the same composition as one or more adjacent photogeneration layers, or the bulk of the other semiconductor layers of the semiconductor device. A replacement layer, for reference purposes herein, comprises a hypothetical layer that can replace an IT layer in a semiconductor structure. For example, in some implementations, an IT layer has a higher photogenerated current density than an immediately adjacent photogeneration layer or a replacement layer having the same composition as an immediately adjacent photogeneration layer, such as a higher collected photogenerated current density. In some implementations, an IT layer has a higher minority-carrier diffusion length than an immediately adjacent photogeneration layer or a replacement layer having the same composition as an immediately adjacent photogeneration layer. In some implementations, an IT layer has a higher minority-carrier lifetime and/or minority-carrier mobility than an immediately adjacent photogeneration layer or a replacement layer having the same composition as an immediately adjacent photogeneration layer. The improved transport properties may be achieved by various means, as detailed below.

In another aspect, the low-bandgap absorber region (LBAR) layer(s) described herein may also be improved transport (IT) layer(s). Throughout this disclosure, described herein means described in this patent disclosure.

In another aspect, the improved transport (IT) layer(s) described herein may also be low-bandgap absorber region (LBAR) layer(s).

Thus, in some cases, the LBAR layer and the IT layer of a device described herein are the same layer. Alternatively, in other implementations, a device comprises an LBAR layer and an IT layer, wherein the LBAR layer and the IT layer are different layers.

In another aspect, the one or more LBAR and/or IT layers are positioned partly in a quasi-neutral region of a solar cell, and partly in a space-charge region. In another aspect, the one or more LBAR and/or IT layers are positioned entirely in a quasi-neutral region of a solar cell. In another aspect, the one or more LBAR and/or IT layers are positioned in part or entirely in the quasi-neutral region of the emitter of a solar cell. In another aspect, the one or more LBAR and/or IT layers are positioned in part or entirely in the quasi-neutral region of the base of a solar cell.

In another aspect, the one or more LBAR and/or IT layers form the entirety of a functional layer within a solar cell. For reference purposes herein, a functional layer of a cell can comprise a layer that generates charge carriers or facilitates the extraction of charge carriers. For example, in some implementations, a functional layer comprises an emitter layer, base layer, window layer, or back-surface-field (BSF) layer.

In another aspect, the one or more LBAR and/or IT layers are positioned in the solar cell emitter in one of the following configurations: partly in the emitter quasi-neutral region and partly in the emitter space-charge region; entirely in the emitter quasi-neutral region; or entirely in the emitter space-charge region. The LBAR thickness may range from 0% to 100% of the total emitter thickness, and may be varied to affect current balance in a multijunction cell.

In another aspect, the one or more LBAR and/or IT layers form the entire emitter layer of a solar cell, and are positioned partly in the emitter quasi-neutral region and partly in the emitter space-charge region. For example, in some implementations, a cell further comprises a window layer, a BSF layer, a base layer, and an emitter layer, and the LBAR layer or IT layer forms the entirety of an emitter layer and the base layer and the emitter layer form a photoabsorber layer disposed between the window layer and the BSF layer.

In another aspect, the one or more LBAR and/or IT layers are positioned partly in the emitter quasi-neutral region and partly in the emitter space-charge region, are positioned such that at least one LBAR and/or IT layers is in contact with the base layer of a given base doping type (n-type, p-type, or intrinsic), and are positioned such that the one or more LBAR and/or IT layers are separated from the window layer by an additional part of the emitter with different doping type from that of the base. For example, in some implementations, the LBAR layer or the IT layer forms a first portion of an emitter layer of the cell and the cell further comprises a window layer; a back-surface-field (BSF) layer; a base layer; and a second portion of the emitter layer. The first portion of the emitter layer is disposed between the base layer and the second portion of the emitter layer. The first portion of the emitter layer is positioned partially in the space-charge region of the emitter layer and partially in the quasi-neutral region of the emitter layer.

In another aspect, the one or more LBAR and/or IT layers are positioned partly in the emitter quasi-neutral region and partly in the emitter space-charge region, are separated from the base layer by part of the emitter, and are separated from the window layer by an additional part of the emitter.

In another aspect, the one or more LBAR and/or IT layers are positioned entirely in the emitter quasi-neutral region, are positioned such that at least one LBAR and/or IT layer is in contact with the window layer, and are separated from the base layer by an additional part of the emitter. For example, in some implementations, the LBAR layer or the IT layer forms a first portion of an emitter layer of the cell and the cell further comprises a window layer; a back-surface-field (BSF) layer; a base layer; and a second portion of the emitter layer. The second portion of the emitter layer is disposed between the base layer and the first portion of the emitter layer. The first portion of the emitter layer is adjacent the window layer. And the first portion of the emitter layer is positioned entirely in the quasi-neutral region of the emitter layer.

In another aspect, the one or more LBAR and/or IT layers are positioned entirely in the emitter quasi-neutral region, are separated from the base layer by a first additional part of the emitter, and are separated from the window layer by second additional part of the emitter.

In another aspect, the one or more LBAR and/or IT layers form the entire emitter region, in a solar cell having a base with higher bandgap and/or reduced thickness with respect to the emitter, such that the emitter layer is a major photoabsorbing region of the solar cell, such that 30-100%, and preferably 50-100%, of the photogeneration in the solar cell comes from the emitter layer.

In some implementations, the emitter layer has a thickness that is between about 50% and about 100% of the total thickness of the photoabsorber of the cell. For reference purposes herein, the photoabsorber of the cell, in some cases, consists of the emitter layer and any base layer that is present in the cell. It is also possible for the emitter layer to be thinner than the base layer of the cell. For example, in some cases, the emitter layer has a thickness that is up to about 20% or up to about 30% of the sum of the emitter layer thickness plus the base layer thickness. In some implementations, the emitter layer has a thickness that is between about 1% and about 20% of the sum of the emitter layer thickness plus the base layer thickness.

Moreover, an emitter comprising one or more LBAR and/or IT layers may be partly in the solar cell quasi-neutral region, and partly in the solar cell space-charge region. The LBAR thickness may range from 5% to 100% of the total solar cell photoabsorber thickness, and may be varied to affect current balance in a multijunction cell.

In another aspect, the one or more LBAR and/or IT layers form the entire emitter region of a solar cell, comprising a p-n junction between the emitter layer and a back surface field (BSF) layer with higher bandgap than the emitter layer, and for which there is no base layer (zero thickness base layer) with the same or lower bandgap as the emitter layer but where the BSF layer may also be thought of as having the dual role of a base layer since it forms a p-n junction with the emitter, such that the emitter layer is a major photoabsorbing region of the solar cell, such that 50-100%, and preferably 90-100%, of the photogenerated current density in the solar cell comes from the emitter layer. The one or more LBAR and/or IT layers may be partly in the solar cell quasi-neutral region, and partly in the solar cell space-charge region.

In another aspect, a solar cell comprises emitter layers having bandgaps lower than the base, BSF, and window regions, having improved charge carrier transport properties in the emitter and/or forming one or more low-bandgap absorber regions (1st level LBARs) in the emitter, and further having a lower bandgap absorber region (2nd level LBAR) with lower bandgap than the 1st level LBARs. The 2nd level LBAR may be partly in the space-charge region and partly in the quasi-neutral region of the solar cell, entirely within the space-charge region, or entirely within the quasi-neutral region.

In another aspect, the one or more LBAR and/or IT layers are positioned in the solar cell base in one of the following configurations: partly in the base quasi-neutral region and partly in the base space-charge region; entirely in the base quasi-neutral region; or entirely in the base space-charge region. The LBAR thickness may range from 0% to 100% of the total base thickness, and may be varied to affect current balance in a multijunction cell.

In another aspect, the one or more LBAR and/or IT layers are positioned partly in the base quasi-neutral region and partly in the base space-charge region, are positioned such that one or more of the LBAR and/or IT layers is in contact with the emitter layer of a given doping type (n-type, p-type or intrinsic), and are positioned such that the one or more LBAR and/or IT layers are separated from the back surface field (BSF) layer by an additional part of the base with doping type different from that of the emitter. For example, in some implementations, the LBAR layer or the IT layer forms a first portion of a base layer of the cell and the cell further comprises a window layer; a back-surface-field (BSF) layer; an emitter layer; and a second portion of the base layer. The first portion of the base layer is disposed between the emitter layer and the second portion of the base layer. The second portion of the base layer is adjacent the BSF layer, and the first portion of the base layer is positioned partially in the space-charge region of the base layer and partially in the quasi-neutral region of the base layer.

In another aspect, the one or more LBAR and/or IT layers are positioned partly in the base quasi-neutral region and partly in the base space-charge region, are separated from the emitter layer by a first additional part of the base, and are separated from the back surface field (BSF) layer by a second additional part of the base. For example, in some implementations, the LBAR layer or the IT layer forms a first portion of a base layer of the cell and the cell further comprises a window layer; a back-surface-field (BSF) layer; an emitter layer; a second portion of the base layer; and a third portion of the base layer. The first portion of the base layer is disposed between the second and third portions of the base layer. The first portion of the base layer is positioned partially in the space-charge region of the base layer and partially in the quasi-neutral region of the base layer.

In another aspect, the one or more LBAR and/or IT layers are positioned entirely in the base quasi-neutral region, are separated from the emitter layer by an additional part of the base, and are positioned such that at least one LBAR and/or IT layer is in contact with the back surface field (BSF) layer. For example, in some implementations, the LBAR layer or the IT layer forms a first portion of a base layer of the cell and the cell further comprises a window layer; a back-surface-field (BSF) layer; an emitter layer; and a second portion of the base layer. The first portion of the base layer is disposed between the BSF layer and the second portion of the base layer. The second portion of the base layer is adjacent the emitter layer, and the first portion of the base layer is positioned entirely in the quasi-neutral region of the base layer.

In another aspect, the one or more LBAR and/or IT layers are positioned entirely in the base quasi-neutral region, are separated from the emitter layer by a first additional part of the base, and are separated from the back surface field (BSF) layer by a second additional part of the base.

In another aspect, the one or more LBAR and/or IT layers form the entire base region in a solar cell having an emitter with higher bandgap and/or reduced thickness with respect to the base, such that the base layer is a major photoabsorbing region of the solar cell, such that 30-100%, and preferably 50-100%, of the photogeneration in the solar cell comes from the base layer. The base comprising one or more LBAR and/or IT layers may be partly in the solar cell quasi-neutral region, and partly in the solar cell space-charge region. The LBAR thickness may range from 5% to 100% of the total solar cell photoabsorber thickness, and may be varied to affect current balance in a multijunction cell.

In another aspect, the one or more LBAR and/or IT layers form the entire base region of a solar cell, comprising a p-n junction between the base layer and a window layer with higher bandgap than the base layer, and for which there is no emitter layer (zero thickness emitter layer) with the same or lower bandgap as the base layer but where the window layer may also be thought of as having the dual role of an emitter layer since it forms a p-n junction with the base, such that the base layer is a major photoabsorbing region of the solar cell, such that 50-100%, and preferably 90-100%, of the photogenerated current density in the solar cell comes from the base layer. The one or more LBAR and/or IT layers may be partly in the solar cell quasi-neutral region, and partly in the solar cell space-charge region.

In another aspect, a solar cell comprises base layers having bandgaps lower than the emitter, window, and BSF regions, having improved charge carrier transport properties in the base and/or forming one or more low-bandgap absorber regions (1st level LBARs) in the base, and further having a lower bandgap absorber region (2nd level LBAR) with lower bandgap than the 1st level LBARs. The 2nd level LBAR may be partly in the space-charge region and partly in the quasi-neutral region of the solar cell, entirely within the space-charge region, or entirely within the quasi-neutral region.

In another aspect, the LBAR(s) and/or IT layer(s) comprise one or more zero-aluminum-content (aluminum-free) or low-aluminum-content semiconductor layers, where the primary photogeneration regions of the solar cell have a finite, non-zero aluminum content, and where low-aluminum-content is defined as having lower aluminum composition than that of the primary photogeneration regions or adjacent photogeneration regions of the solar cell, for example, the solar cell base or emitter. For example, in some implementations, the LBAR layer or the IT layer is free or substantially free of aluminum and at least one semiconductor layer immediately adjacent the LBAR layer or the IT layer includes aluminum and has a higher bandgap than the LBAR layer or the IT layer. In some implementations, the LBAR layer or the IT layer comprises no more than about 15 mole percent aluminum relative to the total amount of group III elements present in the layer and at least one semiconductor layer immediately adjacent the LBAR layer or the IT layer includes a higher mole percent of aluminum than the LBAR layer or the IT layer and has a higher bandgap than the LBAR layer or the IT layer. Further, in some implementations, the cell of a device described herein further comprises an emitter layer and a base layer, and the LBAR layer or the IT layer comprises no more than about 15 mole percent aluminum relative to the total amount of group III elements present in the layer, and is positioned in or composes the entirety of the emitter layer. In addition, the base layer includes a higher mole percent of aluminum than the LBAR layer or the IT layer and has a higher bandgap than the LBAR layer or the IT layer.

Moreover, in some implementations, the LBAR layer or the IT layer of a cell described herein forms a first portion of a base layer of the cell and the cell further comprises a window layer; a back-surface-field (BSF) layer; an emitter layer; a second portion of the base layer; and a third portion of the base layer. The first portion of the base layer is disposed between the second portion of the base layer and the third portion of the base layer. The second portion of the base layer is adjacent the emitter layer. The third portion of the base layer is disposed between the first portion of the base layer and the BSF layer. The first portion of the base layer is positioned entirely in the quasi-neutral region of the base layer, entirely in the space-charge region, or partly in the quasi-neutral region and partly in the space-charge region. Additionally, the first portion of the base layer has a lower aluminum mole percent and lower bandgap than the second and third portions of the base layer.

For reference purposes herein, a layer that is aluminum-free comprises no aluminum or no intentionally added aluminum. A layer that is substantially free of aluminum can comprise no more than about 1 atom percent aluminum, no more than about 0.1 atom percent aluminum, or no more than about 0.01 atom percent aluminum, based on the total amount of Group III elements.

In another aspect, the zero- or low-aluminum-content LBAR(s) and/or IT layer(s) form part or all of the solar cell emitter, where the base of the solar cell has a finite, non-zero aluminum content.

In another aspect, the LBAR and/or IT layers comprise a zero-aluminum-content (Al-free) GaInP layer forming the entire emitter of a solar cell with an AlGaInP base, where the improved charge carrier transport properties and lower bandgap of the emitter compared to the base are due to the absence of aluminum (Al) in the emitter composition. The GaInP emitter and the AlGaInP base may be ordered, disordered, or have varying degrees of ordering on the group III sublattice.

In another aspect, the LBAR and/or IT layers comprise a low-aluminum-content AlGaInP layer forming the entire emitter of a solar cell with an AlGaInP base, where the AlGaInP emitter layer has low aluminum content with respect to the Al composition of the base, and where the improved charge carrier transport properties and lower bandgap compared of the emitter to the base are due to the lower content of aluminum (Al) in the emitter composition. The low-Al-content AlGaInP emitter and the AlGaInP base may be ordered, disordered, or have varying degrees of atomic ordering on the group-III sublattice.

In another aspect, the zero- or low-aluminum-content LBAR(s) and/or IT layer(s) form part or all of the solar cell base, where the emitter of the solar cell has a finite, non-zero aluminum content.

In another aspect, any of the semiconductor device structures in this patent disclosure using an Al-free GaInP may instead have a low-Al-content AlGaInP IT and/or LBAR layer, with low Al composition with respect to other photogeneration layers in the solar cell.

In another aspect, the LBAR(s) and/or IT layers are formed from regions with a higher or greater degree of group-III sublattice ordering, e.g., ordering of Ga and In in GaInP, or ordering of Al, Ga, and In in AlGaInP, and lower bandgap with respect to adjacent regions with higher group-III sublattice disorder and higher band gap. For reference purposes herein, a layer having a higher or greater degree of group-III sublattice ordering exhibits a lower bandgap at the same lattice constant compared to a layer having a lower degree of group-III sublattice ordering. In addition, a layer having a higher or greater degree of group-III sublattice ordering exhibits a higher order parameter than exhibited by a layer having a lower degree of group-III sublattice ordering. For example, a layer having an order parameter of less than about 0.2 can be considered to have a relatively low degree of group-III sublattice ordering and can be referred to as being disordered. A layer having an order parameter of about 0.2 or more can be considered to have a higher degree of group-III sublattice ordering and may be referred to as being ordered. Intermediate values of the order parameter are also possible.

In another aspect, the LBAR(s) and/or IT layers are formed from regions with a different degree of group-V sublattice ordering, e.g., ordering of As and Sb in GaAsSb, with respect to adjacent regions or layers.

In another aspect, the LBAR(s) and/or IT layers are formed from regions with a different degree of anion or cation sublattice ordering in a semiconductor family, e.g., ordering in III-V, II-VI, I-III-VI, III-IV-VI semiconductors, with respect to adjacent regions.

In another aspect, a solar cell comprises an AlGaInP base, an Al-free GaInP emitter forming an LBAR and improved transport (IT) layer in the emitter, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the GaInP emitter is lattice-matched and unstrained with respect to the AlGaInP solar cell base.

In another aspect, the LBAR(s) and/or IT layers are formed from regions with higher indium content, and in compressive strain, e.g., higher-In GaInP, AlGaInP, GaInAs, AlGaInAs, GaInPAs, or AlGaInPAs regions or layer, with respect to adjacent regions or layers with lower or zero indium content, e.g., GaAs, AlGaAs, GaPAs, or lower-In GaInP, AlGaInP, GaInAs, AlGaInAs, GaInPAs, or AlGaInPAs regions.

In another aspect, the LBAR(s) or IT layers are formed in a strain-balanced structure comprising alternating layers of compressively-strained (compressive) and tensile-strained (tensile) semiconductor layers.

In another aspect, the compressive layers in a strain-balanced structure are LBARs with lower bandgap than the adjacent tensile layers, e.g., GaInAs LBARs strain-balanced with GaPAs tensile (barrier) layers.

In another aspect, a solar cell comprises an AlGaInP base, with a pseudomorphic, Al-free GaInP emitter in compressive strain with respect to the AlGaInP base, forming an LBAR and improved transport (IT) layer in the emitter, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the compressively-strained GaInP emitter balances the tensile strain in the AlInP window.

In another aspect, a solar cell comprises an AlGaInP base, with a pseudomorphic, AlGaInP emitter in compressive strain with respect to the AlGaInP base and with Al content in the emitter such that the emitter bandgap may be less than, the same as, or greater than the AlGaInP base, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the compressively-strained AlGaInP emitter balances the tensile strain in the AlInP window.

In another aspect, a solar cell comprises a GaInP or AlGaInP base, with LBARs and strain compensation regions (SCRs) which may take the form of layers. The LBARs and strain compensation regions may be partly in the space-charge region and partly in the quasi-neutral region of the base, or may be partly in the space-charge region and partly in the quasi-neutral region of the emitter, or may be partly in the space-charge region and partly in the quasi-neutral regions of both the emitter and the base, or may be entirely in the quasi-neutral region of the base, or may be entirely in the quasi-neutral region of the emitter, or may be entirely in the space-charge region. Any of the examples described herein with an improved transport (IT) and/or LBAR layer in the cell structure may instead use a combination of LBARs and strain compensation regions.

In another aspect, the LBAR(s) and/or IT layers are formed from regions with higher arsenic or antimony content, and in compressive strain, e.g., higher-As GaInPAs or higher-Sb GaInAsSb regions, with respect to adjacent regions with lower or zero arsenic or antimony content.

In another aspect, the improved transport (IT) layers have a bandgap or bandgaps that are the same as or higher than other layers in the solar cell, such as layers in or the entirety of the solar cell base or emitter. These other layers in the solar cell, other than the IT layers, may form the main photogeneration layers in the solar cell, or the IT layers themselves may form the main photogeneration layers in the solar cell. These other layers in the solar cell, other than the IT layers, may be adjacent to the IT layers or separated from the IT layers.

In another aspect, the improved transport (IT) layers are formed from a high-Ga GaInP first layer in the emitter or window layer of a solar cell, in tensile strain with respect to other parts of the emitter or window and/or to other layers in the solar cell such as the solar cell base, which is strain-balanced by a high-In AlGaInP or AlInP second layer, in the emitter, window, or base layers of the solar cell, adjacent to and in compressive strain with respect to the first high-Ga GaInP first layer in the emitter or window. The Al content in the AlGaInP or AlInP second layer may be such that its bandgap is the same as, lower than, or higher than the GaInP first layer. In the latter case, the GaInP first layer may form an LBAR with respect to the adjacent layers. The combined high-Ga GaInP first layer and high-In AlGaInP or AlInP second layer may both form an IT layer together, and may have compositions such that the bandgaps of both layers are the same as, higher than, or lower than surrounding solar cell structures such as layers within or the entirety of the solar cell base and/or window layers. In the former cases, where the bandgaps of both layers in the strain-balanced IT layer may be chosen to be the same as or higher than that of the base layer, the relatively high bandgap of the strain-balanced IT layer increases the voltage of the solar cell with respect to the case with lower bandgap IT layers. In the latter case, where the bandgaps of both layers in the strain-balanced IT layer are lower than that of the base and/or window layers, the combined IT layer may form an LBAR with respect to the surrounding solar cell layers such as the solar cell base, increasing the current density of the solar cell. In this context, high-Ga in the GaInP first layer refers to that layer having a Ga composition that results in a lattice constant that is smaller than that of the base layer, smaller than the other main photogeneration layers in the solar cell, and/or smaller than the average lattice constant of the layers in the solar cell. In this context, high-In in the AlGaInP or AlInP second layer refers to that layer having an In composition that results in a lattice constant that is larger than that of the base layer, larger than the other main photogeneration layers in the solar cell, and/or larger than the average lattice constant of the layers in the solar cell.

In a particular implementation, the high-Ga GaInP first layer and high-In AlGaInP or AlInP second layer may have compositions and strain levels such that the bandgaps of the first layer and the second layer are the same or approximately the same, and that these bandgaps are the same, approximately the same, or higher than the bandgap of the layer or layers forming the bulk of the solar cell base. In this implementation, the base may be chosen to have an AlGaInP base layer, the high-Ga GaInP first layer may be chosen to be in the emitter and to have a Ga composition and tensile strain state such that its bandgap is the same or approximately the same as the AlGaInP base layer, and the high-In AlGaInP or AlInP second layer may be chosen to be in the emitter and to have an In composition, Al composition, and compressive strain state such that its bandgap is the same or approximately the same as the GaInP first layer, and as the AlGaInP base layer. In this context, approximately the same refers to the GaInP first layer and the AlGaInP or AlInP second layer having bandgaps that are less than 0.050 eV different from each other, and/or to the first layer or second layer having a bandgap that is less than 0.050 eV from the AlGaInP base.

In another aspect, the strain-balanced high-Ga GaInP/ high-In AlGaInP IT layer system described herein may be implemented using other elements, material systems, and semiconductor families, including but not limited to the high-Ga GaInAs/high-In AlGaInAs; high-Ga GaInAs/high-In GaInPAs, high-Ga GaAsSb/high-In or high-Sb AlGaInSb, high-Ga GaInAs/high-In or high-Sb GaInNAsSb, high-Si SiGe/low-Si SiGe, AlGaInPAsSb/AlGaInPAsSb, GaInNAsSb/GaInNAsSb, and SiGeSn/SiGeSn material systems.

In another aspect, the LBAR(s) or IT layers are formed from regions with non-zero, dilute nitrogen content, e.g., GaNAs, GaNAs(Sb), GaInNAs, or GaInNAsSb regions with nitrogen content in the range of 0.01% to 10%, with reduced bandgap due to the incorporation of nitrogen in the semiconductor alloy. For example, in some implementations, an LBAR layer or IT layer of a cell described herein includes nitrogen and at least one semiconductor layer immediately adjacent the LBAR layer or the IT layer is free or substantially free of nitrogen and has a higher bandgap than the LBAR layer or the IT layer. In some implemenations, an LBAR layer or IT layer includes nitrogen and at least one semiconductor layer immediately adjacent the LBAR layer or the IT layer includes a non-zero amount of nitrogen, the immediately adjacent semiconductor layer having a higher bandgap than the LBAR layer or the IT layer and a lower mole percent of nitrogen than the LBAR layer or the IT layer. Moreover, in some implementations, a cell described herein further comprises an emitter layer and a base layer having a higher bandgap than the emitter layer, wherein the LBAR layer including nitrogen is disposed in the emitter layer, and the base layer has a lower nitrogen content than the LBAR layer and forms an IT layer. In other instances, a cell described herein comprises a base layer and an emitter layer having a higher bandgap than the base layer wherein an LBAR layer including nitrogen is disposed in the base layer and an emitter layer having a higher bandgap and a lower nitrogen content than the LBAR layer forms an IT layer.

In another aspect, a solar cell comprises a dilute nitride GaInNAs(Sb) emitter layer forming an LBAR in the emitter due to the reduction in bandgap due to nitrogen incorporation, and a GaAs, GaInAs, or low-nitrogen-content GaInNAs(Sb) base, with lower N content and higher bandgap with respect to the emitter, forming an improved transport (IT) layer in the base, due to the absence or lower concentration of N in the base layers.

In another aspect, a solar cell comprises a dilute nitride GaInNAs(Sb) base layer forming an LBAR in the base due to the reduction in bandgap due to nitrogen incorporation, and a GaAs, GaInAs, or low-nitrogen-content GaInNAs(Sb) emitter, with lower N content and higher bandgap with respect to the base, forming an improved transport (IT) layer in the emitter, due to the absence or lower concentration of N in the emitter layers.

In another aspect, a solar cell comprises a thick dilute nitride GaInNAs(Sb) emitter layer, forming an LBAR due to the reduction in bandgap due to nitrogen incorporation, such that the emitter layer is a major photoabsorbing region of the solar cell, such that 30-100%, and preferably 50-100%, of the photogeneration in the solar cell comes from the emitter layer, and with an optional GaAs, GaInAs, or low-nitrogen-content GaInNAs(Sb) base, with lower N content and higher bandgap with respect to the emitter.

In another aspect, a solar cell comprises a dilute nitride GaInNAs(Sb) layer within the base, forming an LBAR in the base due to the reduction in bandgap due to nitrogen incorporation, and with additional base layers and emitter layers composed of GaAs, GaInAs, or low-nitrogen-content GaInNAs(Sb), having lower N content and higher bandgap with respect to the base LBAR layer, forming improved transport (IT) layers in the base and emitter, due to the absence or lower concentration of N.

In another aspect, the LBAR(s) or IT layers are formed from regions with higher nitrogen content, and in tensile strain, e.g., higher-N GaNAs, GaNAs(Sb), GaInNAs, or GaInNAsSb regions with nitrogen content in the range of 0.01% to 10%, with respect to adjacent regions with lower or zero nitrogen content.

In another aspect, the LBAR(s) or IT layers are formed from Ge, SiGe, or SiGeSn regions with lower silicon content with respect to adjacent SiGe or SiGeSn regions.

In another aspect, the tensile layers in a strain-balanced structure are LBARs with lower bandgap than the compressive layers in between, e.g., GaNAs LBARs strain-balanced with higher bandgap compressive layers in between.

In another aspect, both the compressive and tensile layers in a strain-balanced structure are both lower in bandgap than regions surrounding the strain-balanced structure, and thus both compressive and tensile layers contribute to the thickness of an LBAR with the thickness of the overall strain-balanced structure, e.g., GaInAs(Sb) low-bandgap compressive layers strain-balanced with GaNAs(Sb) low-bandgap tensile layers in between, forming a wide LBAR with the thickness equal to the sum of the GaInAs(Sb) and GaNAs(Sb) layer thicknesses, with bandgap lower than that of the GaAs or GaInAs host material (e.g., layers in the solar cell base or emitter) adjacent to the strain-balanced structure.

In another aspect, a solar cell comprises alternating GaNAs(Sb) layers in the base in tensile strain, and GaInAs(Sb) layers in the base in compressive strain balancing the strain in the tensile-strain layers, such that both tensile and compressive layers have lower bandgap than a GaAs or low-indium-content GaInAs base layer, forming LBARs in both the tensile GaNAs(Sb) and compressive GaInAs(Sb) layers in the base, and additionally forming improved transport (IT) layers in the compressive GaInAs(Sb) layers, due partly to the absence of nitrogen.

In another aspect, the IT and/or LBAR layers may be semiconductor layers in a solar cell emitter and/or window layer, with elimination, reduction, addition, or increase of a single element with respect to the semiconductor composition of the main photogeneration layer or layers in the solar cell such as layers in the solar cell base or emitter, for binary (n=2), ternary (n=3), quaternary (n=4), pentanary (n=5) semiconductor compositions or semiconductor compositions with n=6 or greater in the main photogeneration layers, where n is the number of different elements in the semiconductor composition of the main photogeneration layer or layers.

In another aspect, the IT and/or LBAR layers may be semiconductor layers in a solar cell emitter and/or window layer, with elimination, reduction, addition, or increase of two or more elements with respect to the semiconductor composition of the main photogeneration layer or layers in the solar cell such as layers in the solar cell base or emitter, for binary (n=2), ternary (n=3), quaternary (n=4), pentanary (n=5) semiconductor compositions or semiconductor compositions with n=6 or greater in the main photogeneration layers, where n is the number of different elements in the semiconductor composition of the main photogeneration layer or layers.

In another aspect, the IT and/or LBAR layers may consist of an emitter or window with no nitrogen or reduced nitrogen content relative to one or more nitrogen-containing layers in the base, intrinsic region, or space-charge region of a solar cell that includes nitrogen in its semiconductor composition. In a particular implementation, the nitrogen-containing layer or layers may include a main photogeneration layer or layers of the solar cell. In a particular implementation, the base region, intrinsic region, or space-charge region layer may be composed of GaInNAs or GaInNAsSb, and the emitter and/or window layer may be composed of GaAs, GaInAs, GaAsSb, or GaInAsSb.

In another aspect, the IT and/or LBAR layers may consist of a base, back-surface-field (BSF) layer, or back heterojunction layer with no nitrogen or reduced nitrogen content relative to one or more nitrogen-containing layers in the window, emitter, intrinsic region, or space-charge region of a solar cell that includes nitrogen in its semiconductor composition. In a particular implementation, the nitrogen-containing layer or layers may include a main photogeneration layer or layers of the solar cell. In a particular implementation, the emitter region, intrinsic region, or space-charge region layer may be composed of GaInNAs or GaInNAsSb, and the base, back-surface-field (BSF) layer, and/or back heterojunction layer may be composed of GaAs, GaInAs, GaAsSb, or GaInAsSb.

In another aspect, the IT and/or LBAR layers may consist of an intrinsic region or space-charge region layer with no nitrogen or reduced nitrogen content relative to one or more nitrogen-containing layers in the window, emitter, base, back-surface field (BSF) layer, or back heterojunction layer of a solar cell that includes nitrogen in its semiconductor composition. In a particular implementation, the nitrogen-containing layer or layers may include a main photogeneration layer or layers of the solar cell. In a particular implementation, the intrinsic region, or space-charge region layer may be composed of GaInNAs or GaInNAsSb, and the window, emitter, base, back-surface-field (BSF) layer, and/or back heterojunction layer may be composed of GaAs, GaInAs, GaAsSb, or GaInAsSb.

In a preferred implementation, the nitrogen composition of the nitrogen-containing layer or layers may be chosen to be between 0.1% and 10% nitrogen, and more preferably between 0.2% and 5% nitrogen, and still more preferably between 0.5% and 3% nitrogen.

In still another implementation, the nitrogen composition of the nitrogen-containing layer or layers may be chosen to be between 45% and 50% nitrogen, and more preferably between 49% and 50% nitrogen, and still more preferably 50% nitrogen such that nitrogen forms the entirety of the group-V elemental component of the semiconductor, for example, as in GaN, AlN, InN, AlGaN, GaInN, AlInN, and AlGaInN semiconductors.

In another aspect, a solar cell comprises an AlGa(In)As base, with an Al-free Ga(In)As or low-Al-content AlGa(In)As layer in the emitter and/or base, forming an LBAR and/or improved transport (IT) layer, where the improved charge carrier transport properties may result from the absence or low concentration of aluminum (Al) in the LBAR and/or IT layer. The LBAR and/or IT layer may be partly in the space-charge region and partly in the quasi-neutral region of the base, or may be partly in the space-charge region and partly in the quasi-neutral region of the emitter, or may be partly in the space-charge region and partly in the quasi-neutral regions of both the emitter and the base, or may be entirely in the quasi-neutral region of the base, or may be entirely in the quasi-neutral region of the emitter, or may be entirely in the space-charge region. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

In another aspect, a solar cell comprises a Ga(In)PAs base, with an P-free Ga(In)As or low-P-content Ga(In)PAs layer within the emitter and/or base, forming an LBAR and/or improved transport (IT) layer, where the improved charge carrier transport properties may result from the absence or low concentration of phosphorus (P) in the LBAR and/or IT layer. The LBAR and/or IT layer may be partly in the space-charge region and partly in the quasi-neutral region of the base, or may be partly in the space-charge region and partly in the quasi-neutral region of the emitter, or may be partly in the space-charge region and partly in the quasi-neutral regions of both the emitter and the base, or may be entirely in the quasi-neutral region of the base, or may be entirely in the quasi-neutral region of the emitter, or may be entirely in the space-charge region. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

In another aspect, a solar cell comprises a Ga(In)(N)(P)As base, and with an Sb-containing Ga(In)(N)(P)AsSb layer within the emitter and/or base, forming an LBAR and/or improved transport (IT) layer, where the improved charge carrier transport properties may result from the presence of antimony (Sb) in the LBAR and/or IT layer, or during the growth of the LBAR and/or IT layer. The LBAR and/or IT layer may be partly in the space-charge region and partly in the quasi-neutral region of the base, or may be partly in the space-charge region and partly in the quasi-neutral region of the emitter, or may be partly in the space-charge region and partly in the quasi-neutral regions of both the emitter and the base, or may be entirely in the quasi-neutral region of the base, or may be entirely in the quasi-neutral region of the emitter, or may be entirely in the space-charge region. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

In another aspect, the improved transport (IT) layers described herein may be positioned partly or entirely within the space charge region of a solar cell. In this configuration the improved charge-carrier mobility, charge-carrier recombination lifetime, and/or charge-carrier saturation velocity in an electric field resulting from the chemical composition, degree of sublattice ordering, strain state, low concentration of crystal defects present, and/or type of crystal defects present in the IT layer enhances carrier transport in the solar cell space charge region, increasing the solar cell current density, voltage, and/or fill factor, resulting in higher solar cell efficiency.

In another aspect, the material bandgap of the one or more LBARs is from 0 to 50 milli-electron volts (meV) less than that of the bulk of photogeneration or light-absorbing material in a solar cell or other optoelectronic device, or of the one or more layers adjacent to the one or more LBARs.

In another aspect, the material bandgap of the one or more LBARs is from 50 to 150 meV less than that of the bulk of photogeneration or light-absorbing material in a solar cell or other optoelectronic device, or of the one or more layers adjacent to the one or more LBARs.

In another aspect, the material bandgap of the one or more LBARs is from 150 to 300 meV less than that of the bulk of photogeneration or light absorbing material in a solar cell or other optoelectronic device, or of the one or more layers adjacent to the one or more LBARs.

In another aspect, the material bandgap of the one or more LBARs is more than 300 meV lower than that of the bulk of photogeneration or light-absorbing material in a solar cell or other optoelectronic device, or of the one or more layers adjacent to the one or more LBARs.

In another aspect, the LBAR or improved transport (IT) layers described herein may be combined in a solar cell with a reflector structure incorporated into the solar cell structure, where the reflector structure reflects light back into the one or more LBAR, IT, or other subcell layers, such that the light has a non-zero probability of being absorbed and producing useful current in the solar cell, and/or increasing solar cell voltage after being reflected back into the LBAR, IT, or other subcell layers, and where the reflector structure is chosen from a list of reflector types including:
- a semiconductor layer with different refractive index than one or more semiconductor layers in the solar cell forming a semiconductor layer reflector;
- a stack of semiconductor layers with different refractive indices forming a semiconductor Bragg reflector;
- a dielectric layer with different refractive index than one or more semiconductor layers in the solar cell forming a dielectric layer reflector;
- a stack of dielectric layers with different refractive indices forming a dielectric Bragg reflector;
- a metal layer, patterned metal regions, or unpatterned conductive particles, nanowires, or regions;
- a composite semiconductor/metal layer reflector structure;
- a composite semiconductor/patterned metal region reflector structure, where the metal regions may be imbedded in the semiconductor material;

a composite semiconductor/unpatterned conductive particle, nanowire, or region reflector structure, where the conductive particles, nanowires, or regions may be imbedded in the semiconductor material;

a composite dielectric/metal layer reflector structure;

a composite dielectric/patterned metal region reflector structure, where the metal regions may be imbedded in the dielectric material;

a composite dielectric/unpatterned conductive particle, nanowire, or region reflector structure; and combinations of the above components in a reflector structure.

The reflector structures may be designed such that they efficiently transmit light with photon energy that can be used effectively by subcells in a multijunction solar cell structure positioned beneath the reflector structure, or with photon energy that cannot be used effectively by the LBAR or IT layers, or other parts of the subcell, above the reflector structure, or both.

In another aspect, a reflector structure described herein combined with one or more LBAR or IT layers reflects light incident on the solar cell that is not fully absorbed by the LBAR or IT layers in its initial pass through the layers, but that has a photon energy that is either greater than the lowest bandgap of the LBAR or IT layers, or is no more than 4 kT less than the lowest bandgap of the LBAR or IT layers (where k is the Boltzmann constant and T is the operating temperature of the solar cell in Kelvin), such that the light has a non-zero probability of being absorbed and producing useful current in the solar cell, and/or increasing solar cell voltage after the light is reflected by the reflector structure back into the LBAR or IT layers for a second pass or for multiple passes through the LBAR or IT layers.

In another aspect, a reflector structure described herein combined with one or more LBAR or IT layers reflects light emitted by radiative recombination of electrons and holes in the one or more LBAR or IT layers, such that the emitted photons are reflected back into the one or more LBAR or IT layers and may be reabsorbed in the LBAR or IT layers to produce electron-hole pairs through the physical mechanism of electron-hole pair photogeneration which is the inverse mechanism of radiative recombination, increasing photon recycling in the LBAR or IT layers, and thereby decreasing the net rate of electron-hole recombination, increasing the effective minority-carrier recombination lifetime, increasing the splitting of electron and hole quasi-Fermi levels, and increasing the voltage and efficiency of the solar cell.

In another aspect, the LBAR or IT layers described herein may comprise a semiconductor material selected from a list of preferred materials including: InP, GaInP, AlInP, AlGaInP, GaAs, AlGaAs, GaInAs, AlInAs, AlGaInAs, GaPAs, InPAs, GaInPAs, AlInPAs, AlGaInPAs, GaNAs, GaInNAs, GaNAsSb, GaInNAsSb, GaSb, GaInSb, AlGaInSb, GaAsSb, GaInAsSb, AlGaInAsSb, Si, Ge, SiGe.

In another aspect, layers between the LBAR or IT layers described herein, such as strain-compensation-region (SCR) layers, may comprise a semiconductor material selected from a list of preferred materials including: InP, GaInP, AlInP, AlGaInP, GaAs, AlGaAs, GaInAs, AlInAs, AlGaInAs, GaPAs, InPAs, GaInPAs, AlInPAs, AlGaInPAs, GaNAs, GaInNAs, GaNAsSb, GaInNAsSb, GaSb, GaInSb, AlGaInSb, GaAsSb, GaInAsSb, AlGaInAsSb, Si, Ge, SiGe.

In another aspect, the LBAR or IT layers described herein may be used in a solar cell for which the base layer, emitter layer, and/or primary photogeneration layer (the layer in the solar cell for which photogenerated current density is greatest) comprises a semiconductor material selected from a list of preferred materials including: InP, GaInP, AlInP, AlGaInP, GaAs, AlGaAs, GaInAs, AlInAs, AlGaInAs, GaPAs, InPAs, GaInPAs, AlInPAs, AlGaInPAs, GaNAs, GaInNAs, GaNAsSb, GaInNAsSb, GaSb, GaInSb, AlGaInSb, GaAsSb, GaInAsSb, AlGaInAsSb, Si, Ge, SiGe.

In another aspect, the LBAR or IT layers described herein may comprise, layers between the LBAR or IT layers such as strain-compensation-region (SCR) layers may comprise, or the LBAR or IT layers described herein may be used in a solar cell for which the base layer, emitter layer, and/or primary photogeneration layer (the layer in the solar cell for which photogenerated current density is greatest) comprises, a semiconductor material selected from an expanded list of materials including: InP, GaInP, AlInP, AlGaInP, GaAs, InAs, AlGaAs, GaInAs, AlInAs, AlGaInAs, GaPAs, InPAs, AlGaPAs, GaInPAs, AlInPAs, AlGaInPAs, GaNAs, GaInNAs, GaNAsSb, GaInNAsSb, GaNP, GaInNP, GaN, AlGaN, GaInN, GaSb, GaInSb, AlGaInSb, GaAsSb, GaInAsSb, AlGaInAsSb, GaPAsSb, GaInPAsSb, AlGaInPAsSb, Si, Ge, SiGe, SiSn, GeSn, SiGeSn, CSiGeSn, ZnO, CdS, ZnSe, CdSe, ZnTe, CdTe, CuInS, CuGaInS, CuInSe, CuGaInSe, CuGaInSSe.

In another aspect, the LBAR or IT layers described herein may comprise, layers between the LBAR or IT layers such as strain-compensation-region (SCR) layers may comprise, or the LBAR or IT layers described herein may be used in a solar cell for which the base layer, emitter layer, and/or primary photogeneration layer (the layer in the solar cell for which photogenerated current density is greatest) comprises, a semiconductor material selected from a further expanded list of materials including: AlP, GaP, InP, AlGaP, GaInP, AlInP, AlGaInP, AlAs, GaAs, InAs, AlGaAs, GaInAs, AlInAs, AlGaInAs, AlPAs, GaPAs, InPAs, AlGaPAs, GaInPAs, AlInPAs, AlGaInPAs, AlNAs, GaNAs, InNAs, AlGaNAs, GaInNAs, AlInNAs, AlGaInNAs, AlNAsSb, GaNAsSb, InNAsSb, AlGaNAsSb, GaInNAsSb, AlInNAsSb, AlGaInNAsSb, AlNP, GaNP, InNP, AlGaNP, GaInNP, AlInNP, AlGaInNP, GaInNPAs, GaInNPAsSb, AlGaInNPAsSb, AlN, GaN, InN, AlGaN, GaInN, AlInN, AlGaInN, AlSb, GaSb, InSb, AlGaSb, GaInSb, AlInSb, AlGaInSb, AlAsSb, GaAsSb, InAsSb, AlGaAsSb, GaInAsSb, AlInAsSb, AlGaInAsSb, AlPAsSb, GaPAsSb, InPAsSb, AlGaPAsSb, GaInPAsSb, AlInPAsSb, AlGaInPAsSb, C, Si, Ge, SiGe, SiSn, GeSn, SiGeSn, CSi, CGe, CSn, CSiGe, CGeSn, CSiSn, CSiGeSn, ZnO, CdO, ZnS, CdS, ZnSe, CdSe, ZnTe, CdTe, CuGaS, CuInS, CuGaInS, CuGaSe, CuInSe, CuGaInSe, CuGaSSe, CuInSSe, CuGaInSSe.

In another aspect, a cell described herein incorporating one or more LBAR or IT layers forms a subcell within a multijunction solar cell.

In another aspect, a cell described herein incorporating one or more LBAR or IT layers forms a subcell within a multijunction solar cell having one or more tunnel junctions between subcells, and may optionally have graded buffer layers in inverted metamorphic (IMM) and/or upright metamorphic (UMM) cells, dielectric/metal bonding layers, semiconductor bonding layers between the subcells in the multijunction cell.

In another aspect, a cell described herein incorporating LBAR or IT layers forms at least one subcell within a 2-junction solar cell, 3-junction solar cell, 4-junction solar cell, 5-junction solar cell, 6-junction solar cell, 7-junction solar cell, or 8-junction solar cell. In another aspect, a cell described herein incorporating LBAR or IT layers forms at least one subcell within a multijunction solar cell with 9 or more junctions.

In another aspect, a multijunction solar cell described herein incorporating LBAR or IT layers comprises subcells with the preferred subcell semiconductor compositions and/or bandgaps listed in FIGS. 34-40.

In another aspect, a multijunction solar cell described herein comprises a top subcell, or cell 1 (C1) having a base with a bandgap selected within a preferred range 1.7 to 2.7 eV, or from a more preferred range of 1.85 to 2.3 eV, and further comprising a combined LBAR and IT layer that forms the top subcell emitter with a bandgap selected within a preferred range 1.6 to 2.2 eV, or from a more preferred range of 1.75 to 2.1 eV.

In another aspect, a cell described herein incorporating LBAR or IT layers forms a subcell within a multijunction solar cell comprising subcells with one or more of the following types of solar cell structure and orientation:
- an upright epitaxially-grown structure, with sunward layers grown after layers away from sun and/or high bandgap subcells grown after subcells with lower bandgap;
- an upright lattice-matched (ULM) multijunction cell structure;
- an upright metamorphic (UMM) multijunction cell structure;
- an inverted epitaxially-grown structure, with sunward layers grown before layers away from sun and/or high bandgap subcells grown before subcells with lower bandgap;
    - an inverted lattice-matched (ILM) multijunction cell structure;
    - an inverted metamorphic (IMM) multijunction cell structure;
- a semiconductor-to-semiconductor bonded multijunction cell structure;
- a dielectric bonded multijunction cell structure;
- a metal bonded multijunction cell structure;
- an adhesive bonded multijunction cell structure; and
- an spectral splitting system in which solar cells are optically integrated.

In another aspect, a cell described herein incorporating LBAR or IT layers forms a subcell within a multijunction solar cell with one or more of the following types of solar cell interconnection structure:
- upright epitaxially-grown tunnel junction structures, with layers closer to the sun in normal solar cell operation grown after layers farther from the sun;
- inverted epitaxially-grown tunnel junction structures, with layers closer to the sun in normal solar cell operation grown before layers farther from the sun;
- semiconductor-to-semiconductor bonded interface interconnection structure;
- dielectric-bonded interface interconnection structure;
- metal-bonded interface interconnection structure;
- adhesive-bonded interface interconnection structure;
- transparent-conductive-coating bonded interface interconnection structure;
- hybrid dielectric/metal bonded interface interconnection structure;
- hybrid adhesive/metal bonded interface interconnection structure;
- hybrid dielectric/adhesive bonded interface interconnection structure; and
- optical integration between subcells, as in a spectral splitting system.

In another aspect, other optoelectronic devices are described herein. In some implementations, for example, an optoelectronic device comprises a photovoltaic cell, the photovoltaic cell comprising a space-charge region, a quasi-neutral region, a LBAR layer or an IT layer positioned at least partially in the space-charge region, one or more semiconductor layers of a first layer type having a first bandgap and a first amount of strain with respect to the average lattice constant of the cell, and one or more semiconductor layers of a second layer type having a second bandgap that is greater than the first bandgap and a second amount of strain. The layers of the second layer type are in tensile strain with respect to the layers of the first layer type and the strain of the layers of the first layer type is balanced with the strain of the layers of the second layer type such that the layers of both layer types remain pseudomorphic and retain a coherent lattice structure with a crystal defect areal density lower than about $10^6$ cm$^{-2}$. In other implementations, an optoelectronic device comprises a photovoltaic cell with the structure described above, but with the LBAR layer or IT layer positioned at least partially in a quasi-neutral region.

In yet another aspect, still other optoelectronic devices are described herein. In some implementations, for example, an optoelectronic device comprises a photovoltaic cell, the photovoltaic cell comprising a space-charge region; a quasi-neutral region; a low bandgap absorber region (LBAR) layer or an improved transport (IT) layer; one or more semiconductor layers of a first layer type having a first nitrogen content, a first indium or antimony content, a first bandgap, and a first strain value; and one or more semiconductor layers of a second layer type having a second nitrogen content, a second indium or antimony content, a second bandgap, and a second strain value. The second nitrogen content is zero, substantially zero, or less than the first nitrogen content. The second indium or antimony content is greater than the first indium or antimony content. The second bandgap is lower than a replacement layer having zero indium content and zero antimony content. The layers of the second layer type are in compressive strain with respect to the layers of the first layer type, and the first and second strain values are strain balanced such that the first and second layer types remain pseudomorphic and retain a coherent lattice structure with a crystal defect areal density lower than $10^6$ cm$^{-2}$.

In addition, in some implementations, the cell further comprises a photoabsorber region composed of an emitter layer and a base layer, the LBAR layer is composed of one or more layers of a first layer type strain-balanced with one or more layers of a second layer type, and the bandgap of the first layer type and the bandgap of the second layer type are lower than the bandgap of at least one other layer in the photoabsorber region. Moreover, in some implementations, the LBAR layer is composed of one or more layers of a first layer type strain-balanced with one or more layers of a second layer type, and the LBAR layer forms all or substantially all of the photoabsorber region of the cell.

One advantage of the present disclosure, in some implementations, is to increase photogeneration of charge carriers in solar cells and other optoelectronic devices. Another advantage of the present disclosure, in some implementations, is to increase the collected photogenerated current density of a solar cell in a given solar spectrum. Another advantage, in some implementations, is to improve the minority-carrier transport properties of one or more layers in a solar cell, such as minority-carrier lifetime, mobility, and diffusion length, and to improve the short wavelength response of a solar cell. Still another advantage, in some implementations, is to improve the majority-carrier transport properties of one or more layers in a solar cell, such as majority-carrier mobility and conductance. Another advantage, in some implementations, is to allow the use of wider bandgap top subcells in a multijunction cell, without degrading the minority-carrier properties and short wavelength response associated with the top cell emitter. Another advantage of the present disclosure, in some implementations, is to increase the energy conversion efficiency of a multijunction solar cell. Another advantage, in some implementations, is to provide a method for tuning the effective bandgap of one or more subcells in a multijunction solar cell while maintaining a given lattice constant in a subcell. Another advantage, in some implementations, is to improve the match of the subcell effective bandgap combination to that of the solar spectrum and improve the solar cell efficiency.

Other features and advantages of the present disclosure will be apparent from the following more detailed description implementation, taken in conjunction with the accompanying drawings, which illustrate, by way of example, the principles of the disclosure implementation

BRIEF DESCRIPTION OF THE DRAWINGS

The drawings referenced herein form a part of the specification. Features shown in the drawings are meant as illustrative of some, but not all, implementations of the disclosure, unless otherwise explicitly indicated, and implications to the contrary are otherwise not to be made. Wherever possible, the same reference numbers will be used throughout the drawings to represent the same or similar, though not necessarily identical, components and/or features. However, for the sake of brevity, reference numerals or features having a previously described function may not necessarily be described in connection with other drawings in which such components and/or features appear.

DETAILED DESCRIPTION

Figure 1:
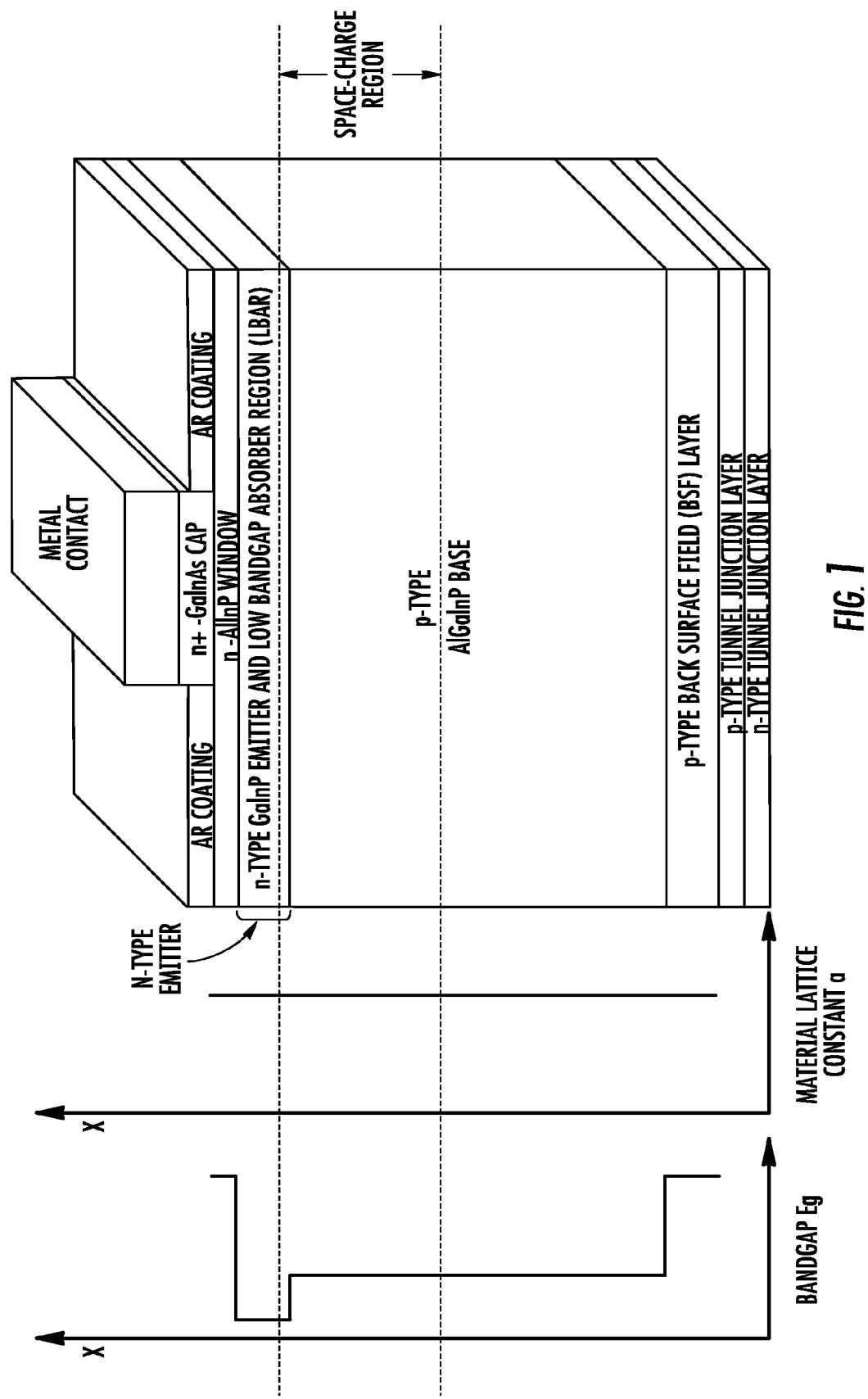
FIG. 1 illustrates a device according to one implementation described herein.

In the following detailed description of representative implementations of the disclosure, reference is made to the accompanying drawings that form a part hereof, and in which are shown by way of illustration specific examples of implementations in which the disclosure may be practiced. While these implementations are described in sufficient detail to enable those skilled in the art to practice the invention, it will nevertheless be understood that no limitation of the scope of the present disclosure is thereby intended. Alterations and further modifications of the features illustrated herein, and additional applications of the principles illustrated herein, which would occur to one skilled in the relevant art and having possession of this disclosure, are to be considered within the scope of this disclosure. Specifically, other implementations may be utilized, and logical, mechanical, electrical, material, and other changes may be made without departing from the spirit or scope of the present disclosure.

Accordingly, the following detailed description is not to be taken in a limiting sense, and the scope of the present disclosure is defined by the appended claims. In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

The present disclosure describes a semiconductor device structure having, in some implementations, increased photogenerated current density and greater collected current density. The device structure may also have increased voltage, and/or increased fill factor of its current-voltage (I-V) characteristics. The device structure incorporates low bandgap absorber regions (LBARs) composed of semiconductor materials to increase photogenerated current density. LBARs may have a lower bandgap by virtue of having a different semiconductor composition than the surrounding material, having a different degree of group-III sublattice or group-V sublattice disordering than the surrounding material for LBARs composed of III-V semiconductors, having a different amount of strain with respect to the surrounding material, or combinations of the above, in addition to other physical phenomena that can cause a lowering of energy bandgap. LBARs may be lattice-matched to the surrounding semiconductor material, having the same material lattice constant as the surrounding semiconductor material, or they may have a material lattice constant that is either larger or smaller than that of the surrounding semiconductor material. Here the material lattice constant is the lattice constant of a material in its unstrained state. LBARs may be unstrained or strained with respect to the surrounding semiconductor material, and any strain in the LBARs may be strain-balanced with strain in the opposite direction in adjacent semiconductor material.

The present disclosure also describes a semiconductor structure that, in some implementations, achieves greater semiconductor device current density, voltage, fill factor, and/or energy conversion efficiency due to one or more improved transport (IT) layer(s) incorporated into the semiconductor device such as a solar cell or photodetector, where the improved charge-carrier transport in the layer is achieved by the elimination, reduction, addition, or increase of one or more elements in the semiconductor chemical composition of the IT layer, alteration of the sublattice ordering in the IT layer, alteration of the compressive or tensile strain in the IT layer, reduction of the density of crystal defects in the IT layer, reduction of impurities in the IT layer, and/or alteration of the type of crystal defects in the IT layer, where the above changes in the IT layer are made relative to the primary photogeneration layers, adjacent photogeneration layers, other semiconductor layers, or the bulk of other semiconductor layers in the semiconductor device. Improved transport (IT) layer(s) are defined as layer(s) with higher minority-carrier lifetime, minority-carrier mobility, minority-carrier diffusion length, majority-carrier mobility, majority-carrier conductance, charge-carrier saturation velocity in an electric field, and/or collected photogenerated current density than in the primary photogeneration layers, adjacent photogeneration layers, other semiconductor layers, or the bulk or other semiconductor layers in the semiconductor device.

The low-bandgap absorber region (LBAR) layer or layers described herein may or may not also function as improved transport (IT) layer(s), and the IT layer or layers described herein may or may not also function as LBAR layer(s).

LBARs and/or IT layers may be positioned in different regions of a solar cell, such as in the quasi-neutral region of the emitter of a solar cell, in the space-charge region of the emitter, in the space-charge region of the base of a solar cell, in the quasi-neutral region of the base, in the space-charge region of an isotype junction formed by semiconductors of the same doping type but with different carrier concentrations and/or different semiconductor compositions (heterojunction), in the quasi-neutral region of a window layer, in the quasi-neutral region of a back-surface field (BSF) layer, and elsewhere in a solar cell, as well as in combinations of these solar cell regions. Further, LBARs and/or IT layers may be positioned in a lattice-matched device, (e.g., one in which the majority of the semiconductor material in the device has the same material lattice constant as a growth substrate, other layers, and/or other devices grown in the same semiconductor stack), or may be positioned in a lattice-mismatched device, (e.g., one in which the majority of the semiconductor material in the device has a different material lattice constant than that of a growth substrate, other layers, and/or other devices grown in the same semiconductor stack). LBARs and/or IT layers may be positioned in various functional elements of a semiconductor device. For example, LBARs and/or IT layers may be positioned in the emitter, base, window, back surface field (BSF) layer, or other layers of a solar cell, photodetector, or other type or optoelectronic device. LBARs and/or IT layers may be positioned in a single junction solar cell, in a subcell of a multijunction solar cell, in a photodetector, or in other types of optoelectronic devices. LBARs and/or IT layers may be positioned in a lattice-matched subcell of a multijunction cell in which all other subcells are also lattice-matched, or in a lattice-matched subcell of a multijunction cell in which one or more of the other subcells is lattice-mismatched, or metamorphic, or in a lattice-mismatched or metamorphic subcell of a multijunction solar cell. LBARs and/or IT layers may have a 0-dimensional (0D), 1-dimensional (1D), 2-dimensional (2-D), or 3-dimensional (3D) structure.

LBARs introduced into the solar cell structure may, and often do have improved minority-carrier transport properties, such as improved minority-carrier lifetime, mobility, and diffusion length, which in turn improve the probability of current collection in the solar cell before the minority carriers can recombine. Thus in these cases, the LBARs also function as improved transport (IT) layers.

The improved minority-carrier transport properties in IT layers, which may also function as LBARs, may result from: different composition leading to lower impurity or defect density, such as the elimination, reduction, addition, or increase of one or more chemical elements in a compound semiconductor; different composition leading to lower carrier effective mass and higher carrier mobility; different strain states; different sublattice ordering states; reduced incorporation of chemical impurities, reduced density of crystal lattice defects, different types of crystal lattice defects, and other phenomena in the improved transport (IT) region compared to other parts of the solar cell. Moreover, these improved transport regions may have improved majority-carrier transport properties, such as majority-carrier mobility and conductance, which may result from the differences listed above. Furthermore, these improved transport regions, defined as regions with better minority-carrier and/or better majority carrier properties compared to other parts of the solar cell, may be low bandgap absorber regions (LBARs), but in other cases may also be regions that actually have higher bandgap, or the same bandgap, as adjacent portions of the solar cell, and still be within the definition of the present disclosure.

The LBARs or improved transport (IT) regions may be used in one or more subcells within a multijunction solar cell, where a multijunction cell refers to a solar cell having 2 or more junctions. Because of the limited availability of semiconductors with the optimum bandgaps to form subcells that will result in the highest multijunction solar cell efficiency; because of the practical limitations on minority- and majority-carrier transport parameters in semiconductors that are otherwise suitable in terms of their bandgap and lattice constant; and because of the limited availability of semiconductors with the desired lattice constants to allow semiconductor crystal growth with a minimum of defects that increase minority-carrier recombination, it is often highly desirable to increase the current collection probability in one or more subcells of a multijunction solar cell, through the use of LBARs or improved transport (IT) regions. For example, photogenerated current density may be increased by the use of an LBAR in the top subcell, also referred to as cell 1 (C1), subcell 1, top cell, upper cell, or upper subcell, of a multijunction cell. Further, the collected current density in response to light may be increased by the use of an IT layer in the top subcell, for example, in the emitter of the top subcell, and an LBAR in the top cell may also be an IT layer.

Similarly, because of these constraints of limited availability of semiconductors with the optimum bandgaps; practical limitations on minority- and majority-carrier transport parameters; and limited availability of semiconductors with the desired lattice constants with a minimum of defects, it is often highly desirable to extend the current-producing capability of one or more subcells of a multijunction solar cell to longer wavelengths through the use of LBARs or improved transport (IT) regions.

In multijunction solar cells it is often desirable to increase the bandgap of the top subcell, also referred to as cell 1 (C1), also called subcell 1, top cell, upper cell, or upper subcell, of the multijunction stack, so that photogenerated current in the top cell can be collected at a higher voltage for greater power output. The higher top cell bandgap means that it will not be able to use the longer wavelengths in its former response range, but those wavelengths will be transmitted to cell 2 (C2), also called subcell 2, beneath the top cell, thereby increasing the current density of cell 2.

In practical designs the top cell may be optically thin in order to leak light through to cell 2 in order to match the currents of cell 1 and cell 2. Increasing the cell 1 bandgap allows the multijunction cell designer to increase the cell 1 thickness and still achieve the same cell 1 current for current matching, while actually reducing the amount short wavelength light that is transmitted through cell 1 to cell 2. This not only allows that shorter wavelength light to be used at the higher voltage of cell 1, but also reduces unwanted absorption that does not result in current that can be collected usefully in layers between subcells, such as tunnel junction layers that interconnect the subcells, as well as in subcell layers such as back surface field (BSF) or window layers where minority-carrier properties may be less favorable than in other parts of the subcell. Since the cell 1 thickness is greater, and the use of an extremely thin cell 1 for very high optical transparency is avoided, it can also make it much easier to control the thickness and current generation in cell 1, and thereby to control the current balance between cell 1 and cell 2 for optimum current output and efficiency.

In order to increase the bandgap of the top cell, aluminum (Al) is often added to the top cell semiconductor composition, or the Al composition is increased, e.g., to form an AlGaInP, AlGaAs, AlGaInAs, AlInAs, or AlGaInPAs top cell. Since Al reacts strongly with oxygen (O), more strongly than other group-III elements such as Ga and In react with oxygen, Al atoms tend to react with even small amounts of $H_2O$ and $O_2$ present in the epitaxial growth chamber or in sources used for epitaxial growth, e.g., metal-organic sources such as trimethylaluminum (TMAl) and trimethylindium (TMIn), so that oxygen atoms, and potentially other impurities, are unintentionally incorporated into the semiconductor material in higher concentrations when the Al composition is higher. These Al-induced impurities, and perhaps other Al-related defects as well, tend to increase minority-carrier recombination in Al-containing semiconductors, e.g., AlGaInP, AlGaInAs, or AlGaInSb, and decrease minority-carrier lifetime, mobility, and diffusion length, and can decrease majority-carrier mobility and conductivity, relative to similar semiconductors with no Al content, i.e., Al-free semiconductors, e.g., GaInP, GaInAs, or GaInSb, or to similar semiconductors with reduced Al content.

Other methods to increase the bandgap of the top cell include using compositions with a lower In/Ga ratio. Lowering the In/Ga ratio in the top cell semiconductor composition, e.g., in a top cell with a GaInP base, also changes the semiconductor lattice constant, which may be acceptable, but the tendency for dislocations to form in thick lattice-mismatched layers without a suitable metamorphic buffer to transition from one lattice constant to another must be accounted for in the device design.

The present disclosure describes, in some implementations, a semiconductor device structure having higher minority-carrier lifetime, mobility, and diffusion length, and/or higher majority-carrier mobility and conductance. As described in greater detail herein, this structure with enhanced charge-carrier transport properties, or improved transport (IT) region, may be a low-bandgap absorber region (LBAR), or may comprise one or more LBARs. This improved transport (IT) region, in other cases, may instead have a bandgap greater than or equal to that of other nearby regions in the solar cell, and therefore may be an improved transport (IT) region without being a low-bandgap absorber region (LBAR), and still be included in the present disclosure. The improved transport (IT) region device structure with enhanced charge-carrier transport properties may improve the voltage, current, fill factor, or combinations of these parameters in a solar cell or other optoelectronic device.

In one implementation, it is desirable to achieve higher minority-carrier lifetime, mobility, and diffusion length, and higher majority-carrier mobility and conductance, by incorporating an Al-free emitter, e.g., a GaInP emitter, or a reduced-Al-content emitter, in a solar cell with a base that contains Al, e.g., a solar cell with a base composed of AlGaInP. This forms an LBAR in the quasi-neutral region of the solar cell emitter.

In an implementation, it can be advantageous to achieve greater current density from photogeneration in an LBAR in the quasi-neutral region of the emitter of a subcell, formed by an aluminum-free emitter such as GaInP, or an emitter with reduced aluminum content relative to the base, in a solar cell with an aluminum-containing base such as AlGaInP. The phrase "AlGaInP subcell" is taken to mean a subcell which has a base—or other region or the solar cell which produces the largest amount of photogenerated current density in the device, termed the primary photogeneration region of the solar cell, such as an emitter that is thicker than the base layer—which is composed of AlGaInP. Similarly the phrase "(composition X) subcell" is taken to mean a subcell with a base or other primary photogeneration region that has semiconductor composition X. The greater current density from the LBAR may be advantageous if the effect of any voltage decrease, which may potentially result from the lower bandgap of the LBAR, on the power output of the solar cell is outweighed by the increased current density resulting from the lower bandgap and greater photogeneration in the LBAR. The greater current density from the LBAR may also be advantageous for balancing the photogenerated current densities of subcells in a series-interconnected multijunction stack, where other factors may restrict current balancing by more conventional means, such as changing the thickness of the solar cell, or by changing the bandgap of both the entire base and emitter of the solar cell.

Subcells may have AlGaInP forming part or all of the subcell base, with other parts of the solar cell such as the emitter and other parts of the base composed of GaInP or lower-Al-content AlGaInP, in order to retain the better minority-carrier recombination properties, and better minority-carrier and majority-carrier mobility properties, that GaInP or lower-Al-content AlGaInP often have in practice compared to AlGaInP. The GaInP or lower-Al-content AlGaInP layer with improved minority-carrier and/or majority-carrier properties may make take up the entire width of the solar cell emitter, so that it constitutes the solar cell emitter, or may make up only part of the emitter region. The GaInP or lower-Al-content AlGaInP layer with improved minority-carrier and/or majority-carrier properties may also make up part or all of the solar cell base or of other layers in the solar cell.

LBARs of general composition and construction may be placed in the emitter region of a solar cell. The LBAR or LBARs may be placed in the space-charge region associated with the solar cell emitter, in the quasi-neutral region of the solar cell emitter, partly in the space-charge region and partly in the quasi-neutral region of the solar cell emitter. The one or more LBARs may take up the entire width of the solar cell emitter, so that the one or more LBARs constitute the solar cell emitter. In general the LBAR or LBARs may have portions in the quasi-neutral region of the emitter, space-charge region of the emitter, space-charge region of the base, and/or in the quasi-neutral region of the base. The collection of carriers will be aided by the electric field in the space-charge region, but current collection from carrier diffusion can still be quite appreciable and beneficial for LBARs positioned in the quasi-neutral regions, particularly those portions of the quasi-neutral regions adjacent to the space-charge region.

LBARs have higher photogeneration by virtue of their lower bandgap than surrounding semiconductor layers, and charge carriers may leave the LBAR by thermal escape, tunneling through barriers, and/or field-assisted escape. When the charge carriers escape the LBARs, and are collected, e.g., at a p-n junction, the LBARs increase the current density of the solar cell. The lower bandgap of the LBARs compared to surrounding semiconductor material allows them to make use of lower energy photons in the incident light spectrum to produce useful current, than the solar cell or other optoelectronic device would otherwise be able to use, for example: because it would require a metamorphic or lattice-mismatched solar cell composition with a tendency to have a greater number of dislocations and undesirable carrier recombination centers which lower minority-carrier lifetime and solar cell voltage; because of the unavailability of semiconductor materials with high-quality bulk properties for the needed composition with the desired bandgap; or because of the expense of the materials. LBARs in one or more of the subcells of a multijunction cell may be used to increase the current of that subcell beyond that which would be practical, convenient, or cost-effective in a solar cell without LBARs, allowing the wavelength responses of the multijunction cell to more closely approximate the ideal division of the solar spectrum for high-efficiency energy conversion, and to be current matched in a series-interconnected multijunction cell.

LBARs may be incorporated into arrays with layers having alternating larger and smaller material lattice constant to form a strain-balanced structure, e.g. of multiple pseudomorphic tensile energy barriers and compressive energy wells, or LBARs, to increase the optical thickness and current generating ability of the LBARs without allowing the low bandgap, large lattice constant semiconductor layers to relax their crystalline structure, forming dislocations that are highly active recombination sites, as they may in very thick layers without intervening tensile strain-balancing layers. LBARs may also be formed with no strain with respect to the surrounding material, or in tensile strain with respect to the surrounding material. When unstrained, LBARs may be formed in thick layers, or regions large enough to have negligible quantum effects on the energy levels of charge carriers in the LBARs or energy wells, and may be formed without accompanying strain-balance layers or barrier layers. When the strain is relatively small, LBARs may also be formed in thick layers, or regions large enough to have negligible quantum effects on the energy levels of charge carriers in the LBARs or energy wells, and may be formed with or without accompanying strain-balance layers or barrier layers, and remain pseudomorphic.

LBARs may have a bandgap that is lower than: the bandgap of the semiconductor material elsewhere in the device; the bandgap of the bulk of photogeneration or light-absorbing material in a solar cell or other optoelectronic device such as a multijunction solar cell or other multijunction optoelectronic device; the bandgap of the bulk of photogeneration or light-absorbing material in the base and/or emitter of a solar cell or other optoelectronic device; and/or the bandgap of layers disposed between the LBARs. The layers disposed between the LBARs may be strain-balance layers, i.e., layers that balance the strain introduced by the LBARs themselves with strain in the opposite direction. The LBARs may be strained or unstrained with respect to the other photogeneration or light-absorbing materials in a solar cell or other optoelectronic device, and may be strained or unstrained with respect to any layers that may be disposed between the LBAR layers. Layers between the LBARs may have a smaller or larger material lattice constant than the material lattice constant of the LBARs, where the material lattice constant of a semiconductor is the unstrained lattice constant for that semiconductor composition. Layers between the LBARs may have a bandgap higher than, lower than, or equal to that of the bulk of photogeneration or light-absorbing material in a solar cell or other optoelectronic device.

The LBARs may have a variety of geometrical configurations, influenced by ease of manufacture and/or ability to produce the desired effect of increasing current density or other effect in the solar cell or other optoelectronic device. Multiple LBARs may be used in the same solar cell or other device, including to increase light absorption by the LBARs.

In addition to other structures described herein, LBARs described herein, in some implementations, can comprise a quantum confined structure. For example, in some cases, one or more LBARs may be 2-dimensional (2-D) sheets or layers, 1-dimensional (1-D) linear features, or 0-dimensional (0-D) point-like (dot) features. The LBARs, whether 2-D, 1-D, or 0-D features, may have size scales small enough that the confined carriers show a change in energy level due to quantum mechanical effects (quantum confinement), or may have size scales large enough that the confined carriers have a small or negligible change in energy level, where a small or negligible change may be considered to be less than or equal to ½ kT (0.5 kT), where k is the Boltzmann constant and T is the absolute temperature in kelvins. For example, quantum wells (2-D), quantum wires (1-D), or quantum dots (0-D) may be used, or in the other extreme, relatively large regions in comparison to the quantum confinement distance scale, or the entirety of the space charge region, base quasi-neutral region, and/or emitter quasi-neutral region, and combinations thereof, may be of a lower bandgap than the rest of the cell, in a sheet-like (2-D), rod-like (1-D), or granule-like (0-D) configuration in which energy levels are not shifted or are shifted only to a small degree due to quantum mechanical effects.

In one implementation, a single junction solar cell with unstrained low bandgap absorber regions (LBARs), or multijunction solar cell in which at least one of the subcells has unstrained low bandgap absorber regions (LBARs), is disclosed, where the well material and the barrier material or other parts of the solar cell with larger bandgap than the LBARs have the same lattice constant but different bandgaps. For example, some exemplary structures include the following:

1. ordered GaInP LBAR(s) or energy well(s) with adjacent disordered GaInP barrier(s), or other parts of the solar cell with higher bandgap than the LBAR(s), e.g., the base or emitter of a solar cell, at a lattice constant between that of GaP and InP, including at the GaAs or Ge lattice constant;
2. zero-Al-% or low-Al-% (Al)GaInP LBAR(s) or energy well(s) with adjacent high-Al-% AlGaInP barrier(s), or other parts of the solar cell with higher bandgap than the LBAR(s), e.g., the base or emitter of a solar cell, at a lattice constant between that of GaP and InP, including at the GaAs or Ge lattice constant;
3. zero-Al-% or low-Al-% (Al)GaInAs LBAR(s) or energy well(s) with adjacent high-Al-% AlGaInAs barrier(s), or other parts of the solar cell with higher bandgap than the LBAR(s), e.g., the base or emitter of a solar cell, at a lattice constant between that of GaAs and InAs, including at the GaAs, Ge, or InP lattice constant;
4. zero-P-% or low-P-% GaIn(P)As LBAR(s) or energy well(s) with adjacent high-P-% GaInPAs barrier(s), or other parts of the solar cell with higher bandgap than the LBAR(s), e.g., the base or emitter of a solar cell, at a lattice constant between that of GaAs and InAs, including at the GaAs, Ge, or InP lattice constant;
5. zero-In-% or low-In-% Ga(In)PAs LBAR(s) or energy well(s) with adjacent high-P-% GaInPAs barrier(s), or other parts of the solar cell with higher bandgap than the LBAR(s), e.g., the base or emitter of a solar cell, at a lattice constant between that of Si and GaAs, including at the Si, GaP, or GaAs lattice constant; and
6. Ga(In)NAs(Sb) LBAR(s) or energy well(s) with adjacent Ga(In)(N)(P)As(Sb) barrier(s), or other parts of the solar cell with higher bandgap than the LBAR(s), e.g., the base or emitter of a solar cell, at a lattice constant between that of GaAs and GaSb, including at the GaAs, Ge, InP, InAs, or GaSb lattice constant.

In one implementation, a multijunction solar cell in which at least one of the subcells has strain-balanced low band-gap absorber regions (LBARs) is disclosed. The barrier material and the well material are strain-balanced such that the average lattice constant of the well and barrier material, weighted by their thicknesses, is the same or nearly the same as the lattice constant of other parts of the cell. For example, some exemplary structures include the following:

1. high-In-% GaInAs LBAR(s) or energy well(s) with adjacent zero-In % or low-In-% Ga(In)As barrier(s), or other parts of the solar cell with higher bandgap than the LBAR(s), e.g., the base or emitter of a solar cell, and at a lattice constant between that of GaAs and InAs, including at the GaAs, Ge, InP, or InAs lattice constant;
2. GaInAs LBAR(s) or energy well(s) with adjacent GaPAs barrier(s), or other parts of the solar cell with higher bandgap than the LBAR(s), e.g., the base or emitter of a solar cell, and at a lattice constant between that of GaAs and InAs, including at the GaAs, Ge, InP, or InAs lattice constant;
3. low-P-% GaPAs LBAR(s) or energy well(s) with adjacent high-P-% GaPAs barriers, or other parts of the solar cell with higher bandgap than the LBAR(s), e.g., the base or emitter of a solar cell, at a lattice constant between that of Si and GaAs, including at the Si, GaP, or GaAs lattice constant;
4. GaIn(P)As LBAR(s) or energy well(s) with adjacent Ga(In)PAs barrier(s), or other parts of the solar cell with higher bandgap than the LBAR(s), e.g., the base or emitter of a solar cell, and at a lattice constant between that of Si and InAs, including at the Si, GaP, GaAs, Ge, InP, or InAs lattice constant;
5. high-In-% GaInP LBAR(s) or energy well(s) with adjacent low-In-% GaInP barriers, or other parts of the solar cell with higher bandgap than the LBAR(s), e.g., the base or emitter of a solar cell, at a lattice constant between that of Si and GaAs, including at the Si, GaP, or GaAs lattice constant;
6. high-In-% GaInP LBAR(s) or energy well(s) with adjacent low-In-% GaInP barriers, or other parts of the solar cell with higher bandgap than the LBAR(s), e.g., the base or emitter of a solar cell, at a lattice constant between that of GaAs and InP, including at the GaAs, Ge, or InP lattice constant;
7. high-Sb-% GaAsSb LBAR(s) or energy well(s) with adjacent low-Sb-% GaAsSb barriers, or other parts of the solar cell with higher bandgap than the LBAR(s), e.g., the base or emitter of a solar cell, at a lattice constant between that of GaAs and GaSb, including at the GaAs, Ge, InP, InAs, or GaSb lattice constant; and
8. Ga(In)NAs(Sb) LBAR(s) or energy well(s) with adjacent Ga(In)(N)(P)As(Sb) strain balance layer(s), barrier(s), or other parts of the solar cell with higher bandgap than the LBAR(s), e.g., the base or emitter of a solar cell, at a lattice constant between that of GaAs and GaSb, including at the GaAs, Ge, InP, InAs, or GaSb lattice constant.

If desired, in some implementations comprising a plurality of LBAR layers, the LBAR layers may have differing thicknesses from one another. Furthermore, one or more strained or barrier layers may have differing thickness form one another. For example, an array of (n−1) LBARs of thickness x may be interleaved with n strained or barrier layers for strain balance of thickness y, where n is an integer, and additional LBARs of thickness x/2 may be placed at each end of the array of LBARs and strained or barrier layers, to complete the strain balance of the overall array. In another example, an array of n LBARs of thickness x may be interleaved with (n−1) strained or barrier layers for strain balance of thickness y, where n is an integer, and additional strained or barrier layers of thickness y/2 may be placed at each end of the array of LBARs and strained or barrier layers, to complete the strain balance of the overall array.

Moreover, a semiconductor structure described herein may include differing numbers of LBAR layers and strained or barrier layers. For example, an array of n LBARs of thickness x may be interleaved with (n−1) strained or barrier layers for strain balance of thickness y, where n is an integer, where the LBAR and strained or barrier layer thicknesses and compositions are tuned in order to strain balance the overall array, such that the LBARs are on the outside of the array, which may help with carrier escape in some instances, and/or may help to improve semiconductor interface quality for some layer compositions. In another example, an array of n LBARs of thickness x may be interleaved with (n+1) strained or barrier layers for strain balance of thickness y, where n is an integer, where the LBAR and strained or barrier layer thicknesses and compositions are tuned in order to strain balance the overall array, such that the strained or barrier layers are on the outside of the array, which may help to suppress minority-carrier concentration and recombination at interfaces in some instances, may help to confine charge carriers, may help to confine, increase, decrease dopant species concentration, may help to suppress diffusion of dopant atoms, and/or may help to improve semiconductor interface quality for some layer compositions.

In some instances, LBARs with lower bandgap than the solar cell base or emitter have a composition which also causes them to have a larger material lattice constant than, and to be in compressive strain with respect to the solar cell base or emitter. Similarly, strain-compensation regions (SCRs)—with a material lattice constant less than, and tensile strain with respect to the solar cell base or emitter and to the LBARs, designed to strain-balance the compressive LBARs—have a composition which also causes them to have higher bandgap than the solar cell base and than the LBARs.

Thus, in some implementations, a single LBAR in compressive strain may have its strain compensated, or be strain balanced, by a single strain compensation region (SCR) in tensile strain, with a larger lattice constant than the LBAR. In one implementation, the emitter of a solar cell may be an LBAR in compressive strain, for which the strain is compensated by a window layer in tensile strain with a higher bandgap than the emitter LBAR. In an implementation, the emitter of a solar cell may have a composition such that it is in tensile strain with a higher bandgap than for an unstrained composition of the same semiconductor family, and the window of a solar cell may have a composition such that it is in compressive strain, strain-balancing the tensile strain of the emitter. In an implementation, the window layer which strain-compensates the strain in the emitter may have a bandgap that is higher than, lower than, the same as, or nearly the same as the bandgap of the emitter layer. When the emitter and/or window have higher bandgap than they would for their lattice-matched, unstrained compositions, an advantage is that the light transmission of those layers is increased to layers beneath that are better able to use light at the transmitted wavelengths. In an implementation, multiple LBARs in compressive strain with bandgap lower than the solar cell layer into which they are inserted may alternate in position with SCRs in tensile strain with bandgap higher than the LBARs and higher than the solar cell layer into which they are inserted.

It need not always be the case that LBARs, with low bandgap compared to the solar cell layer in which they are imbedded, are in compressive strain, and it need not always be the case that SCRs in tensile strain have higher bandgap than the solar cell layer in which they are imbedded, and the LBARs which they strain compensate. In an implementation, LBARs with a low bandgap for enhanced photoabsorption and photocurrent generation and relatively large material lattice constant may be strain-compensated with SCRs with relatively small material lattice constant which also have low bandgap for enhanced photoabsorption and photocurrent generation. In an implementation, both LBARs and SCRs are incorporated into a solar cell base, and both LBARs and SCRs have bandgaps that are lower than that of the solar cell base. In an implementation, the LBARs have larger material lattice constant than the SCRs, and are in compressive strain with respect to the SCRs within the array of LBARs and SCRs, while the SCRs have smaller material lattice constant than the LBARs, and are in tensile strain with respect to the LBARs within the array of LBARs and SCRs. In an implementation, an extended low bandgap absorber region may be formed from alternating compressive and tensile LBAR and SCR layers, all of which have low bandgap for enhanced photoabsorption and photocurrent generation, where the extended low bandgap absorber region has a thickness larger, and potentially much larger than the thickness at which either the strained LBAR material or the strained SCR material could remain pseudomorphic, with a coherent, high-quality, low-dislocation, single crystalline structure. In an implementation, this extended low bandgap absorber region comprising alternating compressive and tensile low bandgap layers forms part of the solar cell base or emitter, for instance, a part of the base or emitter within the space-charge region near the p-n junction, a part of the emitter quasi-neutral region, a part of the base quasi-neutral region, or combinations thereof. In an implementation, this extended low bandgap absorber region comprising alternating compressive and tensile low bandgap layers forms all of the solar cell base or emitter. In other implementations, the LBAR and/or SCR layers described above as being incorporated into a solar cell base and/or emitter may also be incorporated into the back-surface field (BSF) layer, window, and/or any other layer in the structure of a solar cell, or any combination of the above layers of a solar cell structure. In other implementations, the LBAR and/or SCR layers with bandgaps higher, lower, or the same as a solar cell base and/or emitter, may also be designed with bandgaps higher, lower, or the same as the BSF layer, window, or any other layer in the structure of a solar cell, or any combination of the above layers of a solar cell structure.

When layers with smaller lattice constant than that of the solar cell base are used to counteract the compressive strain of 2D (sheets), 1D (wires), or 0D (dots) LBARs with larger lattice constant than that of the solar cell base, those small-lattice-constant strain-compensation layers tend to have higher bandgap than that of the LBARs or the solar cell base, since within the same or similar semiconductor material system there is a tendency for bandgap to rise as one alters the composition to lower the lattice constant. This higher bandgap of the strain-compensation layers between the LBARs may be detrimental to solar cell performance, since 1) these higher bandgap regions limit the number of LBARs and their cumulative thickness available for light absorption that can be placed in a given thickness of the solar cell, e.g., in space-charge regions or quasi-neutral regions of a solar cell; and 2) higher bandgap layers are barriers for carrier transport that can block the flow of useful current photogenerated in the LBAR to the collecting p-n junction and to the solar cell terminals.

However, some semiconductors exhibit a decrease in bandgap as the lattice constant is decreased, e.g., dilute nitride GaNAs, GaInNAs, and GaInNAsSb semiconductor compositions with 0 to 5 atomic percent nitrogen, and more preferably 0.5-3.0% nitrogen. This allows the LBAR/strain-compensation layer structure to be engineered such that both the LBARs and the SCRs have a lower bandgap than the solar cell base, thus maximizing the thickness available for light absorption and increased current photogeneration, and removing high bandgap barriers to current flow. The bandgap in the LBARs and SCRs may be made approximately equal to each other if desired.

In an implementation, a solar cell may incorporate LBARs composed of GaInAs with low bandgap for enhanced photocurrent generation and compressive strain, and may incorporate SCRs composed of GaNAs which also have low bandgap for enhanced photocurrent generation, but which have smaller material lattice constant than that of the GaInAs LBARs, and which have tensile strain in order to compensate the strain of the LBARs, thus forming a pseudomorphic, extended low bandgap absorber region which is much thicker than the maximum thickness at which either the strained LBAR material or the strained SCR material can remain pseudomorphic.

A thick low bandgap layer may also be produced by allowing the elements of the LBAR and the SCRs to form a homogeneous LBAR with the same lattice constant as the solar cell base, for instance, an LBAR formed from GaInNAs with a lower bandgap, but the same lattice constant as a GaInAs solar cell base. It may be desirable in some cases to separate certain elements from others, to avoid undesirable interactions in the crystal lattice that cause unwanted recombination, e.g. the formation of In—N pairs in GaInNAs, or to avoid gas phase reactions during growth, by introducing reactive precursor gases into the reaction chamber at different times. This can be accomplished by using the LBAR/SCR structure described above, e.g., with high-In GaInAs LBARs combined with GaNAs SCRs, achieving a low bandgap region, but with lower recombination rate due to the separation of In and N in their respective layers.

LBARs may have a wide range of spatial extents: they may be quite wide with widths from 0.1 micron to about 1 micron or more; they may be in a middle range with widths from approximately 100 Angstroms (Å) to about 1000 A, or they may be quite narrow in a range from greater than 0 to about 100 A in which there is a strong effect of quantum confinement on the energy levels of carriers within the LBARs. The width of the LBARs and the SCRs is primarily determined by the constraints of how lattice-mismatched the layers are from each other and the solar cell base, and how thick each layer can become while remaining pseudomorphic, i.e., before the crystal lattice relaxes and develops dislocations.

In the case of GaInAs LBARs and GaNAs SCRs, the LBARs may be relatively thick, or they may be extremely thin with thickness on the order of one to several lattice constants, to form a metamaterial of GaInAs and GaNAs layers with properties different from a homogeneous alloy of GaInNAs. These same concepts can be extended to other semiconductor material systems as well.

In another implementation the tensile-strained layer or layers and the compressive strained layer or layers incorporated into the solar cell structure, may both have bandgaps higher than that of the solar cell base, emitter, BSF layer, window, or other solar cell structure or combination of structures. In some instances and in some solar cell structures, the reduced minority-carrier recombination that can result from the higher bandgap of these layers or layers may be more desirable than the increased photogenerated current that can result from a lower bandgap layer, and may thus result in an improved transport (IT) layer. In another implementation the tensile-strained layer or layers and the compressive strained layer or layers incorporated into the solar cell structure, may both have bandgaps the same as that of the solar cell base, emitter, BSF layer, window, or other solar cell structure or combination of structures.

In another implementation the tensile-strained layer or layers may have a bandgap or bandgaps that is/are higher than that of the solar cell base, emitter, BSF layer, window, or other solar cell structure or combination of structures, while the compressive strained layer or layers incorporated into the solar cell structure may have a bandgap or bandgaps that is/are lower than that of the solar cell base, emitter, BSF layer, window, or other solar cell structure or combination of structures. In another implementation the tensile-strained layer or layers may have a bandgap or bandgaps that is/are lower than that of the solar cell base, emitter, BSF layer, window, or other solar cell structure or combination of structures, while the compressive strained layer or layers incorporated into the solar cell structure may have a bandgap or bandgaps that is/are higher than that of the solar cell base, emitter, BSF layer, window, or other solar cell structure or combination of structures.

In another implementation the tensile-strained layer or layers and/or the compressive strained layer or layers may fully replace the solar cell base, emitter, BSF layer, window, or other solar cell structure or combination of structures. In another implementation the tensile-strained layer or layers and/or the compressive strained layer or layers may replace part of, or be incorporated into, the solar cell base, emitter, BSF layer, window, or other solar cell structure or combination of structures.

Low bandgap absorber regions, or LBARs, can also be formed from materials that are unstrained or have little strain with respect to the solar cell semiconductor structure in which they are incorporated, e.g., the solar cell base. In this case, SCRs are not needed to balance the strain of the LBARs, since they have no strain or little strain. For this situation, very wide LBARs can be formed, since there is no longer any maximum thickness constraint for the material to remain pseudomorphic in the unstrained case, or this thickness is very large in the case with very small strain. This enhances the ability of the LBAR to absorb light and generate current since the thickness is not limited by strain concerns. Even within finite thicknesses imposed by other features in the cell, such as the width of the space charge region width in the case for which it is desired to have the LBAR within the space charge region, this allows greater photoabsorption, photogeneration of electron-hole pairs, and photocurrent collection, since all of this thickness can be taken up with the LBAR, with none of it consumed with high bandgap SCRs.

In an implementation, a solar cell may incorporate an LBAR or LBARs which have the same material lattice constant as the solar cell structures in which they are incorporated, and thus have no strain or little strain, and thus require no SCRs. In an implementation, the LBAR or LBARs have the same composition and same material lattice constant as the solar cell base, but are lower in bandgap due to a greater amount of atomic ordering of two or more elements in the semiconductor crystal structure. In an implementation, the LBAR or LBARs have the same composition and same material lattice constant as the solar cell base, but are lower in bandgap due to a greater amount of atomic ordering on the group-III sublattice of the semiconductor crystalline structure in the LBAR or LBARs. In an implementation, the LBAR or LBARs have the same composition and same material lattice constant as the solar cell base, but are lower in bandgap due to a greater amount of atomic ordering on the group-V sublattice of the semiconductor crystalline structure in the LBAR or LBARs.

In an implementation, the LBAR or LBARs are composed of GaInP with the same composition and same material lattice constant as a GaInP solar cell base, but with lower bandgap in the LBAR or LBARs due to an ordered or partially ordered arrangement of Ga and In atoms on the group-III sublattice, thus lowering their bandgap with respect to a disordered or partially disordered GaInP base. Since the GaInP LBARs are of the same or similar composition as the GaInP base, SCRs are not needed for strain balancing.

In an implementation, a solar cell may incorporate an LBAR or LBARs which have the same or a similar lattice constant to the solar cell structure into which they are incorporated, such as a solar cell base, but have lower bandgap due to a different semiconductor composition in the LBAR (or LBARs) and the solar cell base. Again, since the lattice constant is the same or similar in the LBAR (or LBARs) and in the solar cell base, no SCRs are needed for strain compensation.

In an implementation, LBARs with GaInP or lower-Al AlGaInP composition may be incorporated into a solar cell base with higher-Al AlGaInP composition, with the same or similar material lattice constant in the LBAR or LBARs as in the solar cell base. In an implementation, LBARs with GaAs or lower-Al AlGaAs composition may be incorporated into a solar cell base with higher-Al AlGaAs composition, with the same or similar material lattice constant in the LBAR or LBARs as in the solar cell base. In an implementation, LBARs with GaAs, GaInAs, or lower-Al AlGaInAs composition may be incorporated into a solar cell base with higher-Al AlGaInAs composition, with the same or similar material lattice constant in the LBAR or LBARs as in the solar cell base. In an implementation, LBARs with GaInAs or GaInPAs composition may be incorporated into a solar cell base with GaInPAs or GaInP composition, with the same or similar material lattice constant in the LBAR or LBARs as in the solar cell base. In an implementation, LBARs with GaN or lower-Al AlGaN composition may be incorporated into a photovoltaic cell base with higher-Al AlGaN composition, with the same or similar material lattice constant in the LBAR or LBARs as in the photovoltaic cell base. In an implementation, LBARs with GaSb or lower-Al AlGaSb composition may be incorporated into a solar cell base with higher-Al AlGaSb composition, with the same or similar material lattice constant in the LBAR or LBARs as in the solar cell base. In an implementation, LBARs with GaInAs or GaInAsSb composition may be incorporated into a solar cell base with GaInAsSb or GaAsSb composition, with the same or similar material lattice constant in the LBAR or LBARs as in the solar cell base. In an implementation, LBARs with InAsSb or GaInAsSb composition may be incorporated into a solar cell base with GaInAsSb or GaInSb composition, with the same or similar material lattice constant in the LBAR or LBARs as in the solar cell base.

In an implementation, a solar cell or photovoltaic cell may incorporate small-lattice-constant strain-compensation regions (SCRs) such that the material lattice constant and thickness of the SCRs strain balances the strain in the LBAR layers, so that all layers may remain pseudomorphic with high crystal quality at the same in-plane lattice constant. In an implementation, the solar cell incorporates only LBARs, without SCRs. In an implementation, the solar cell incorporates only SCRs, without LBARs. In an implementation, the solar cell incorporates both LBARs and SCRs.

In an implementation, the LBARs and the solar cell base may be composed of the same elements, but with the composition of the LBARs giving a lower bandgap than the solar cell base. In an implementation, the SCRs and the solar cell base may be composed of the same elements, but with the composition of the SCRs giving a material lattice constant which results in a strain-balanced or zero net strain array. In an implementation, the LBARs and the SCRs may be composed of the same elements, but with the composition of the LBARs giving a lower bandgap than the solar cell base, and the composition of the SCRs giving a material lattice constant which results in a strain-balanced or zero net strain array when combined with the LBARs within the solar cell. In an implementation, the LBARs, the SCRs, and the solar cell base may be composed of the same elements, but with the composition of the LBARs giving a lower bandgap than the solar cell base, and the composition of the SCRs giving a material lattice constant which results in a strain-balanced or zero net strain array when combined with the LBARs within the solar cell.

In an implementation, the LBARs and the SCRs may be composed of different elements, with the composition of the LBARs giving a lower bandgap than the solar cell base, and the composition of the SCRs giving a material lattice constant which results in a strain-balanced or zero net strain array when combined with the LBARs within the solar cell. In an implementation, the LBARs, the SCRs, and the solar cell or photovoltaic cell base may be composed of different elements, with the composition of the LBARs giving a lower bandgap than the solar cell base, and the composition of the SCRs giving a material lattice constant which results in a strain-balanced or zero net strain array when combined with the LBARs within the solar cell.

In an implementation, the SCRs may be positioned between each pair of LBARs. In an implementation, the LBARs may be positioned between each pair of SCRs.

In an implementation the solar cells with LBARs and/or SCRs incorporated are subcells within a multijunction cell, for which the solar spectrum utilization is improved and the energy conversion efficiency is made more efficient through the change in spectral response resulting from incorporation of the LBARs and/or SCRs.

The present disclosure further describes a high-efficiency multijunction (MJ) photovoltaic (PV) cell that may be used with, for example, a terrestrial concentrator photovoltaic (CPV) electricity generation system, or a satellite for use in space. One example of a multijunction PV cell is a 3-junction GaInP/Ga(In)As/Ge cell, but the multijunction cell structure is by no means limited to a 3-junction structure, and in fact a wide variety of multijunction cell configurations are envisioned in the present disclosure.

The multijunction solar cell may have 2, 3, 4, 5, 6, 7, 8, or 9 or more subcells, also referred to a p-n junctions or simply "junctions," in order to convert the incident spectrum, such as the concentrated or unconcentrated solar spectrum, more efficiently. Multijunction solar cells and the subcells of the multijunction cell are both types of solar cell, and are referred to collectively as solar cells in the following text. The multijunction solar cells and the subcells of the multijunction cell may have a variety of structures and configurations, as described below.

In one implementation, one or more of the solar cells described herein may be a lattice-mismatched or metamorphic solar cell with lattice constant different from that of a growth substrate. In one implementation, one or more of the solar cells described herein may be a lattice-matched solar cell with lattice constant approximately the same as that of a growth substrate. In one implementation, two or more of the subcells in the multijunction cell may be lattice-matched to each other. In one implementation, all of the subcells in the multijunction cell may be lattice-matched to each other. In one implementation, all of the subcells in a multijunction cell may be lattice-matched to a growth substrate. In another implementation, one or more lattice-matched subcells may be integrated with one or more lattice-mismatched or metamorphic cells in the multijunction cell. In another implementation, all the subcells in the multijunction cell may be lattice-mismatched or metamorphic.

In one implementation, one or more of the solar cells described herein may be grown in an inverted configuration, where an inverted growth configuration is defined such that the layers of the solar cell designed to be toward the sun or other light source during solar cell operation (layers toward the sunward surface) are grown first, followed by the rest of the solar cell layers, finishing with the layers of the solar cell designed to be away from the sun or other light source during solar cell operation (layers away from the sunward surface). In one implementation, one or more of the solar cells described herein may be grown in an upright configuration, where an upright growth configuration is defined such that the layers of the solar cell designed to be away from the sun or other light source during solar cell operation (layers away from the sunward surface) are grown first, followed by the rest of the solar cell layers, finishing with the layers of the solar cell designed to be toward the sun or other light source during solar cell operation (layers toward the sunward surface). Such an upright configuration is in contrast to an inverted configuration. In one implementation, the multijunction cell may comprise one or more subcells grown with an upright configuration, and one or more subcells grown with an inverted configuration.

In one implementation, one or more of the solar cells described above may be an inverted metamorphic cell, with an inverted growth configuration as defined above, and with a base or primary photogeneration or absorber layer having a material lattice constant that is different from that of a growth substrate. In one implementation, one or more of the solar cells described above may be an inverted lattice-matched cell, with an inverted growth configuration as defined above, and with a base or primary photogeneration or absorber layer having a material lattice constant that is approximately the same as that of a growth substrate.

In one implementation, solar cells described herein may have semiconductor layers that are grown by an epitaxial semiconductor growth process, such as metal-organic vapor-phase epitaxy (MOVPE), molecular beam epitaxy (MBE), metal-organic molecular beam epitaxy (MOMBE), liquid phase epitaxy (LPE), vapor phase epitaxy (VPE), and other growth methods. In one implementation, one or more layers of the solar cells described herein may be formed by physical vapor deposition (PVD), chemical vapor deposition (CVD), plasma-enhanced chemical vapor deposition (PECVD), low-pressure chemical vapor deposition (LP-CVD), evaporation, sputtering, screen printing, spray coating, spin coating, doctor blade application, surface wetting by a liquid, electroless plating, electroplating, photolithography, shadow mask deposition, isotropic etching, composition-selective etching, orientation-selective etching, directionally-selective etching, photopatterning of a resist layer followed by etching a layer of the solar cell, photopatterning of a first layer of the solar cell followed by etching a second layer of the solar cell using the patterned first layer as an etch mask in a self-aligned process, photopatterning of a resist layer followed by deposition of a material and dissolution of the resist layer to remove part of the deposited material in a liftoff process, or photopatterning of a photosensitive layer that is a layer of the solar cell.

In addition, in some implementations comprising multijunction solar cells, the subcells may be mechanically, optically, and electrically integrated together to form the multijunction solar cell in a variety of ways. In one implementation, for example, the subcells may be integrated or joined together by epitaxially growing the constituent semiconductor layers of one subcell, followed by growth of an interconnection series of layers that provides optical and electrical coupling between subcells, such as a tunnel junction, followed by growth of the constituent semiconductor layers of an additional subcell to be integrated with the subcell or subcells already grown, and repeating as many times as needed to form and interconnect all the subcells in the multijunction cell, or in the portion of the multijunction cell that is being grown.

Subcells or combinations of subcells grown on separate growth substrates may also be joined together using a broad class of structures and modes of subcell integration referred to as bonding structures. Such a multijunction solar cell can be referred to as a bonded multijunction solar cell. In one implementation, one or more interfaces between subcells in the multijunction solar cell is a bonding structure, chosen from the following group of bonding structures and subcell integration modes:

1) transparent adhesive bonding combined with a patterned metal conductor or interconnect;
2) transparent adhesive bonding combined with a patterned or unpatterned transparent conductor;
3) transparent inorganic layer bonding, using materials such as but not limited to oxides or nitrides, combined with a patterned metal conductor;
4) transparent inorganic layer bonding, using materials such as but not limited to such as oxides or nitrides, combined with a patterned or unpatterned transparent conductor;
5) bonding of transparent conductive coatings such as but not limited to zinc oxide or indium tin oxide;
6) direct semiconductor-to-semiconductor bonding, or semiconductor bonding technology; or
7) other subcell integration configuration.

The transparent adhesive layers in 1) and 2) and the transparent inorganic layers in 3) and 4) may be relatively compliant to surface nonuniformities, softened, or liquid under the bonding conditions, or may be relatively rigid in their mechanical properties. Likewise, the metal or transparent conductors imbedded in a transparent medium may be relatively compliant, softened, or molten under the bonding conditions, or may be relatively rigid. The metal or non-transparent conductors in methods 1) and 3) can be patterned or distributed such that they cover only a small fraction, typically between 0.5% and 10% of the cell surface, so that the bonded interface as a whole remains largely transparent, allowing light of the desired wavelengths, e.g. sunlight that is transmitted by the upper subcells, to be efficiently transmitted to the subcells beneath the bonded interface. The bonding methods in 1), 2), 3), and 4) are referred to generally here as mechanical stacking of subcells. The bonding methods in 5) and 6) may also be thought of as mechanical stacking of subcells.

Moreover, anti-reflection (AR) coatings and/or transparent conductive coatings (TCCs) may be combined with the transparent layer bonding methods in 1), 2), 3), and 4). The transparent conductive coatings employed may also serve as anti-reflection coatings.

In some implementations, subcells may be grown on separate growth substrates and integrated or bonded together using a transparent adhesive material, such as but not limited to a silicone polymer, combined with a patterned or unpatterned transparent conductor, such as but not limited to transparent conductive oxide particles imbedded in a transparent matrix, or patterned metal conductor to provide electrical connection between the bonded subcells. In one implementation, subcells may be grown on separate growth substrates and integrated or bonded together by forming a bond between transparent inorganic layers on each surface, such as but not limited to silicon dioxide or silicon nitride, combined with a patterned or unpatterned transparent conductor, or patterned metal conductor to provide electrical connection between the bonded subcells. In one implementation, subcells may be grown on separate growth substrates and integrated or bonded together by forming a bond between transparent conductive coatings (TCCs) on each surface, such as but not limited to zinc oxide or indium tin oxide, which allows light to be transmitted through the bonding layers and provides electrical connection between the bonded subcells, and may optionally be combined with an additional patterned or unpatterned transparent conductor or patterned metal conductor to enhance electrical connection between subcells. In one implementation, subcells may be grown on separate growth substrates and integrated or bonded together by forming a semiconductor-to-semiconductor bond, which can be an atomically abrupt direct interface between dissimilar semiconductors that is both optically transparent and electrically conductive. This bonding method involving a direct bond from one semiconductor to another is generally referred to as semiconductor-to-semiconductor bonding, direct semiconductor bonding, or as semiconductor bonding technology (SBT). The semiconductor-to-semiconductor bond is typically atomically abrupt, with the transition from one semiconductor to the other taking place within 1 to 10 monolayers of the crystal lattice.

In some implementations, subcells may be integrated or bonded together to form a multijunction cell using a combination of the above structures, such as a first combination of multiple subcells grown inverted in a monolithic multijunction stack on a first substrate, and bonded to a second combination of multiple subcells grown upright in a monolithic multijunction stack on a second substrate using adhesive bonding technology, transparent inorganic layer bonding technology, transparent conductive coating bonding technology, or semiconductor bonding technology (SBT), followed by removal of the substrate on the sunward surface to allow light to enter the sunward cell surface, and optionally, removal of the substrate on the side away from the light source, to confer lighter weight, flexibility, better thermal transfer, lower cost through substrate reuse, or other beneficial quality to the integrated cell.

In one implementation, one or more of the solar cells described herein may be incorporated in a stack of subcells forming a multijunction solar cell that is grown:
1) on a single side of a growth substrate;
2) on both sides of a growth substrate;
3) in a single growth run;
4) in two or more growth runs;
5) in a single growth run on a single side of the growth substrate;
6) in a single growth run on both sides of the growth substrate;
7) in two or more growth runs on a single side of the growth substrate; or
8) in two or more growth runs on both sides of the growth substrate.

In some implementations, a subcell in the a mechanically-stacked, TCC-bonded, or semiconductor-bonded multijunction solar cell described herein may have a different material lattice constant than some other subcells in the multijunction stack, where the subcells are integrated by lattice-mismatched growth, metamorphic growth with a graded buffer layer, mechanical stacking, transparent conductive coating (TCC) bonding, or semiconductor bonding. Such a subcell in the mechanically-stacked, TCC-bonded, or semiconductor-bonded multijunction solar cell may also have approximately the same material lattice constant as other subcells in the multijunction stack, where the subcells are integrated by lattice-matched growth, mechanical stacking, TCC bonding, or semiconductor bonding. Likewise, a subcell in the mechanically-stacked, TCC-bonded, or semiconductor-bonded multijunction solar cell may have been grown on a different growth substrate than some other subcells in the multijunction stack. Such a subcell may also have been grown on the same growth substrate as other subcells in the multijunction stack, where some subsets of subcells in the multijunction stack may be grown on the same growth substrate with an upright growth configuration, with an inverted growth configuration, or both.

In one implementation, the subcells may be electrically interconnected in series using heavily-doped p+/n+ tunnel junctions grown between the subcells. In one implementation, the subcells may be electrically interconnected in series using metal or transparent conductors with partial coverage fraction imbedded in a transparent medium between the subcells. In one implementation, the subcells may be electrically interconnected in series through a bond between one or more transparent conductive coating (TCC) layers, semiconductor layers, or other subcell layers. In another implementation, the subcell electrical terminals may be accessed independently of other subcell terminals at the side, through the front, or through the back of the cells, to combine the electrical output of individual subcells, in a way which need not have the current matching constraints among subcells typical of series-connected multijunction cell configurations, and can therefore have higher efficiencies and have greater tolerance of non-ideal bandgap combinations in the multijunction cell.

Although the example multijunction solar cells above have been described with specific structures achieved by specific modes of integrating the subcells into a multijunction cell, the modes of interconnection may be applied to multijunction solar cells with any number of subcells, and between any combination of subcells, even if different than the examples shown, and may include other modes of interconnection, and still be included within the present disclosure. Examples of other modes of interconnection include optical interconnection among discrete or physically separated single junction or multijunction solar cells in a spectral splitting receiver system, e.g., the combination of a 3-junction (Al)GaInP/(Al)Ga(In)As/Ge solar cell in combination with a silicon solar cell in a spectral splitting optical system, or the combination a 4-junction (Al)GaInP/AlGa(In)As/(Al)Ga(In)As/Ge solar cell in combination with a silicon solar cell in a spectral splitting optical system.

In addition, LBARs and SCRs described herein may also be placed in a solar cell with an ordered GaInP (o-GaInP) base, a disordered GaInP (d-GaInP) base, an ordered AlGaInP base, or a disordered AlGaInP base. The terms ordered and disordered refer to the positions group-III atoms in the periodic table (Al, Ga, In, etc.) on the group-III sublattice. Whether the semiconductor is ordered or disordered in this sense, the crystal lattice can have, and ideally does have, a perfectly periodic crystal structure. At the same semiconductor composition, i.e., ratio of Ga to In, disordered GaInP has a bandgap that is on the order of 100 meV higher than GaInP with partial group-III ordering that is readily achievable in practice (referred to here as ordered GaInP, although the group-III ordering may not be complete, i.e., the ordering parameter may be less than unity), near the GaAs lattice constant. This effect of group-III sublattice disordering on bandgap has been confirmed in metamorphic GaInP solar cells with higher indium composition and lattice constant as well as for GaInP lattice matched to Ge or GaAs, and also occurs in AlGaInP. The bandgap change with disordering diminishes as the GaInP composition approaches that of InP, but for most metamorphic GaInP compositions of interest for solar cells, e.g. from about 0 to 20% In composition, the bandgap change with disordering is still quite significant.

The extension of the long-wavelength response of the solar cell due to the array of LBARs, to increase the photogenerated current density of that solar cell, which may be a subcell in a multijunction solar cell, can be used in general to optimize the current balance among subcells in the multijunction solar cell for a typical range of incident spectra and range of solar cell temperatures, thus increasing the efficiency of the multijunction solar cell, improving its ease of manufacturability, and/or reducing its cost of manufacture, according to one or more implementations of the present disclosure. The principle of using 0-dimensional (0D), 1-dimensional (1D), or 2-dimensional (2D) LBARs to optimize the current balance among subcells in a multijunction cell in the present disclosure, with the LBARs placed in the quasi-neutral regions, or other regions or combinations of other regions of the device, in the top subcell, bottom subcell, or other subcells of the multijunction solar cell or other optoelectronic device, to improve its efficiency or performance in a way that could not easily be accomplished otherwise, can be applied to 2-junction solar cells, 3-junction cells, 4-junction cells, 5-junction cells, 6-junction cells, and solar cells with 7 or more junctions, and to other optoelectronic devices.

Accordingly, a semiconductor structure is disclosed that, in some implementations, achieves higher minority-carrier lifetime, minority-carrier mobility, minority-carrier diffusion length, majority-carrier mobility, majority-carrier conductance—referred to collectively as carrier transport properties—higher photogenerated current density, and/or higher collected current density in response to light, due to one or more low-bandgap absorber regions (LBARs), that may also function as improved transport (IT) layers positioned in the quasi-neutral region of the emitter of a solar cell.

A semiconductor structure is also disclosed that in some implementations, achieves higher carrier transport properties, higher photogenerated current density, and/or higher collected current density in response to light, in particular light at short wavelengths, due to an aluminum-free region that forms part or all of the emitter of a solar cell having an aluminum-containing base, where the aluminum-free region in the emitter forms an IT layer, and may or may not also form a low-bandgap absorber region (LBAR).

A semiconductor structure is also disclosed that, in some implementations, achieves higher carrier transport properties, higher photogenerated current density, and/or higher collected current density in response to light, in particular light at short wavelengths, due to a low-aluminum-content region that forms part or all of the emitter of a solar cell having an aluminum-containing base, where low-aluminum-content is defined as being lower than the aluminum content of the base, where the low-aluminum-content region in the emitter forms an IT layer, and may or may not also form a low-bandgap absorber region (LBAR).

A semiconductor structure is also disclosed that, in some implementations, achieves higher carrier transport properties, higher photogenerated current density, and/or higher collected current density in response to light, due to a nitrogen-free region, foaming an IT layer, that forms part or all of the emitter of a solar cell having an nitrogen-containing base, such as a solar cell comprising a dilute nitride GaInNAs(Sb) base layer.

A semiconductor structure is also disclosed that, in some implementations, achieves higher carrier transport properties, higher photogenerated current density, and/or higher collected current density in response to light, due to one or more low-bandgap absorber regions (LBARs) and/or IT layers positioned in parts of the solar cell other than the emitter, such as the quasi-neutral region of the base or in the space-charge region of a solar cell.

A semiconductor structure is also disclosed with a primary photogeneration layer comprising an integer n chemical elements, with higher carrier transport properties, higher photogenerated current density, and/or higher collected current density in response to light, due to one or more layers with similar composition as the primary photogeneration layer, but with reduced content of one or more of the n chemical elements as compared to the primary photogeneration layer, forming one or more IT layers and/or one or more LBAR layers.

A semiconductor structure is also disclosed with a primary photogeneration layer comprising an integer n chemical elements, with higher carrier transport properties, higher photogenerated current density, and/or higher collected current density in response to light, due to one or more layers with similar composition as the primary photogeneration layer, but with zero content of one or more of the n chemical elements, forming one or more IT layers and/or one or more LBAR layers.

A semiconductor structure is also disclosed with a primary photogeneration layer comprising a binary (n=2), ternary (n=3), quaternary (n=4), pentanary (n=5) semiconductor, or a semiconductor with 6 or more (n≥6) chemical elements in its composition, with higher minority-carrier lifetime, minority-carrier mobility, minority-carrier diffusion length, majority-carrier mobility, majority-carrier conductance, higher photogenerated current density, and/or higher collected current density in response to light, due to one or more layers with similar composition as the primary photogeneration layer, but with reduced or eliminated content of one or more of the n=2, n=3, n=4, n=5, or n≥6 chemical elements as compared to the primary photogeneration layer, forming one or more IT layers and/or one or more LBAR layers.

Examples of semiconductor materials for solar cells and other semiconductor devices having an emitter that comprises an LBAR and/or an IT layer include, but are not limited to, the following combinations of emitter and base materials:
GaInP emitter/AlGaInP base;
low-Al AlGaInP emitter/AlGaInP base;
GaAs or low-Al AlGaAs emitter/AlGaAs base;
GaAs or low-Al AlGaAs emitter/AlGaInAs base;
GaInAs or low-Al AlGaInAs emitter/AlGaAs base;
GaInAs or low-Al AlGaInAs emitter/AlGaInAs base;
GaAs or low-P GaPAs emitter/GaInPAs base;
GaInAs or low-P GaInPAs emitter/GaInPAs base;
GaInAs or low-Al AlGaInPAs emitter/AlGaInPAs base;
GaInAs or low-P AlGaInPAs emitter/AlGaInPAs base;
GaAsSb or low-Al AlGaAsSb emitter/AlGaAsSb base;
GaAsSb or low-Al AlGaInAsSb emitter/AlGaInAsSb base;
GaInAs or low-Al AlGaInPAsSb emitter/AlGaInPAsSb base;
GaInAs or low-P AlGaInPAsSb emitter/AlGaInPAsSb base;
GaInP emitter with high group-III sublattice ordering/GaInP base with low or zero group-III sublattice ordering;
AlGaInP emitter with high group-III sublattice ordering/AlGaInP base with low or zero group-III sublattice ordering;
GaInAs emitter with high group-III sublattice ordering/GaInAs base with low or zero group-III sublattice ordering;
AlGaInAs emitter with high group-III sublattice ordering/AlGaInAs base with low or zero group-III sublattice ordering;
GaAs emitter/GaInNAs or GaInNAsSb base;
GaInAs emitter/GaInNAs or GaInNAsSb base;
low-N GaInNAs emitter/GaInNAs or GaInNAsSb base;
low-N GaInNAsSb emitter/GaInNAs or GaInNAsSb base;
GaInP emitter/GaInNAs or GaInNAsSb base;
AlInP emitter/GaInNAs or GaInNAsSb base;
GaAsSb emitter/GaInNAs or GaInNAsSb base;
GaInAsSb emitter/GaInNAs or GaInNAsSb base;
GaAs emitter/AlGaInNAs or AlGaInNAsSb base;
GaInAs emitter/AlGaInNAs or AlGaInNAsSb base;
low-Al AlGaInNAs emitter/AlGaInNAs or AlGaInNAsSb base;
low-Al AlGaInNAsSb emitter/AlGaInNAs or AlGaInNAsSb base;
GaN emitter/AlGaN base;
GaInN emitter/AlGaInN base;
low-Al AlGaInN emitter/AlGaInN base;
InN emitter/GaInN base.

Some exemplary implementations will now be described with reference to the figures. FIG. 1 illustrates an example of a solar cell according to an implementation of the disclosure, that may form a subcell within a multijunction or single junction solar cell, with one or more layers with improved charge carrier transport properties in the emitter, and forming one or more low-bandgap absorber regions (LBARs) in the emitter. The improved transport (IT) and LBAR layer(s) may be partly in the emitter quasi-neutral region and partly in the emitter space-charge region, or may be entirely in the emitter quasi-neutral region, or may be entirely in the emitter space-charge region. The example in the FIG. 1 shows an AlGaInP-base subcell with Al-free GaInP forming the entire emitter, where the improved charge carrier transport properties and lower bandgap compared to the base are due to the absence of aluminum (Al) in the emitter composition. The GaInP emitter and the AlGaInP base may be either ordered or disordered on the group-III sublattice. The relationships between bandgap and lattice constant of the LBAR layer or layers and other device layers are diagrammed on the left of FIG. 1, as they are in many of the following figures.

Figure 2:
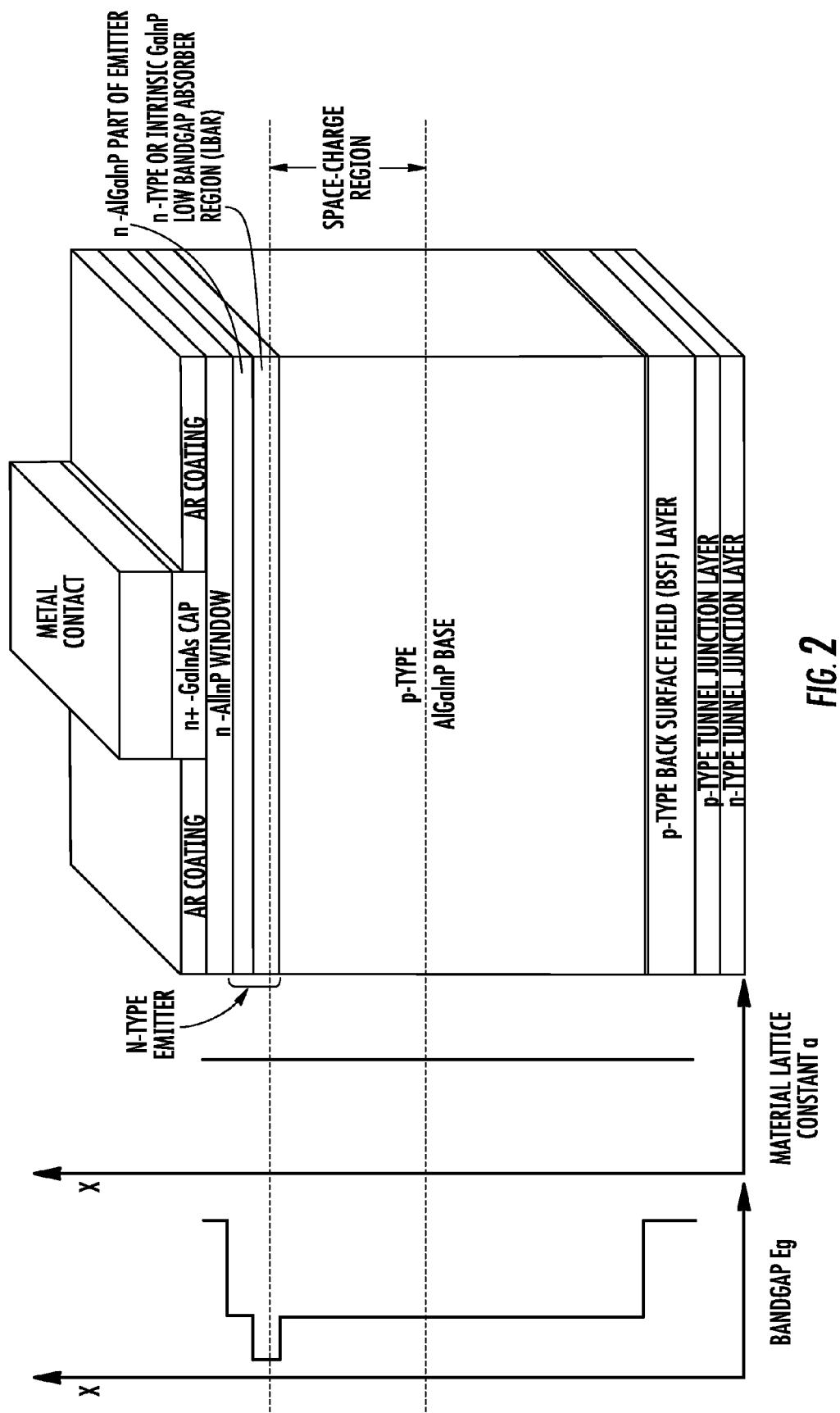
FIG. 2 illustrates a device according to one implementation described herein.

FIG. 2 illustrates an example of a solar cell according to an implementation of the disclosure, that may form a subcell within a multijunction or single junction solar cell, with an AlGaInP base, and with an Al-free GaInP layer within the emitter having improved charge carrier transport properties and forming an LBAR in the emitter, where the Al-free GaInP layer is partly in the emitter quasi-neutral region and partly in the emitter space-charge region, is in contact with the p-type AlGaInP base, and is separated from the window layer by an n-type AlGaInP part of the emitter. The LBAR and improved transport layer may be n-type or intrinsic in doping type. The LBAR thickness may range from 0% to 100% of the total emitter thickness, and may be varied to affect current balance in a multijunction cell.

Figure 3:
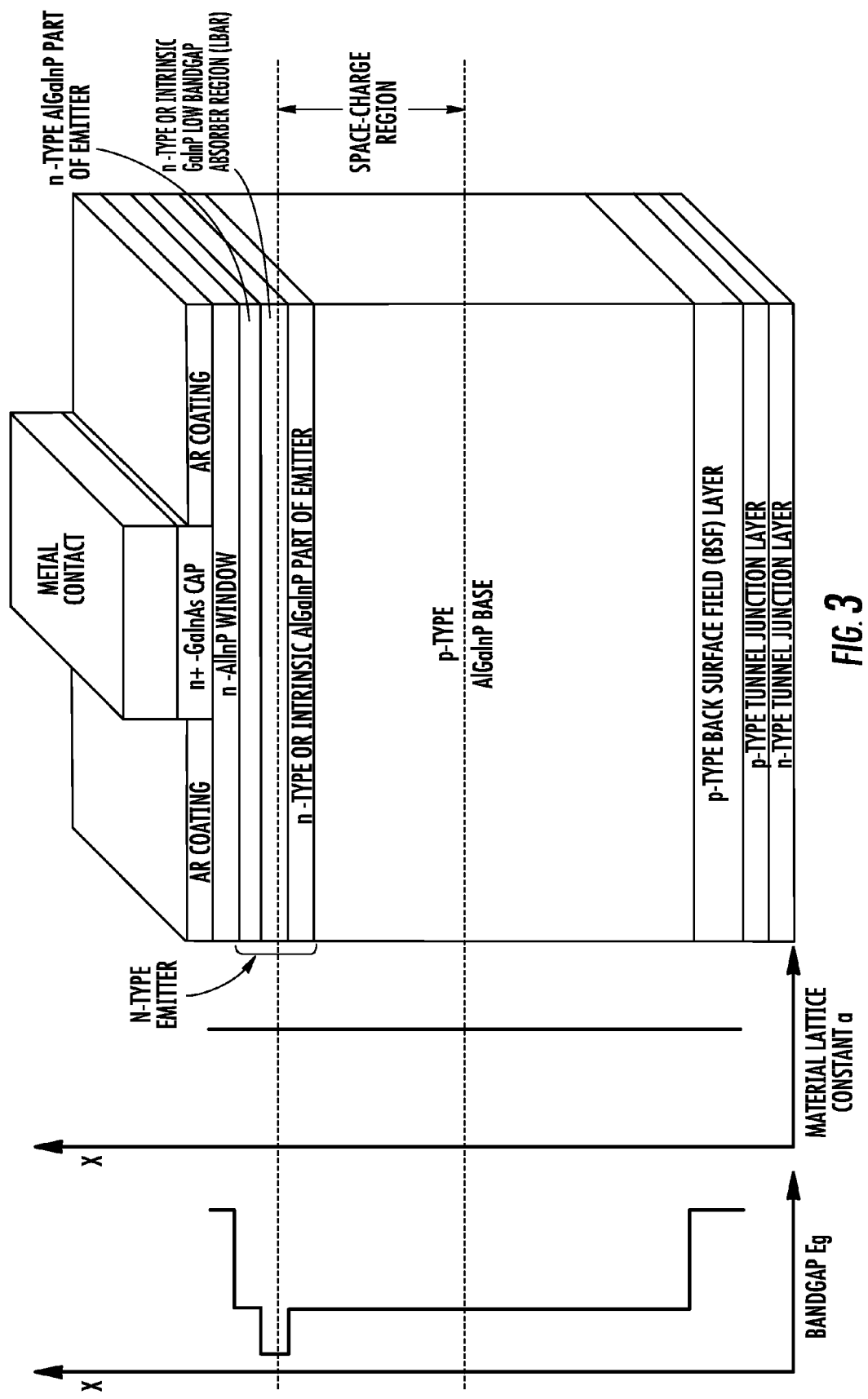
FIG. 3 illustrates a device according to one implementation described herein.

FIG. 3 illustrates an example of a solar cell according to an implementation of the disclosure, that may form a subcell within a multijunction or single junction solar cell, with an AlGaInP base, and with an Al-free GaInP layer within the emitter having improved charge carrier transport properties and forming an LBAR in the emitter, where the Al-free GaInP layer is partly in the emitter quasi-neutral region and partly in the emitter space-charge region, is separated from the base layer by an n-type or intrinsic AlGaInP part of the emitter, and is separated from the window layer by an n-type AlGaInP part of the emitter.

Figure 4:
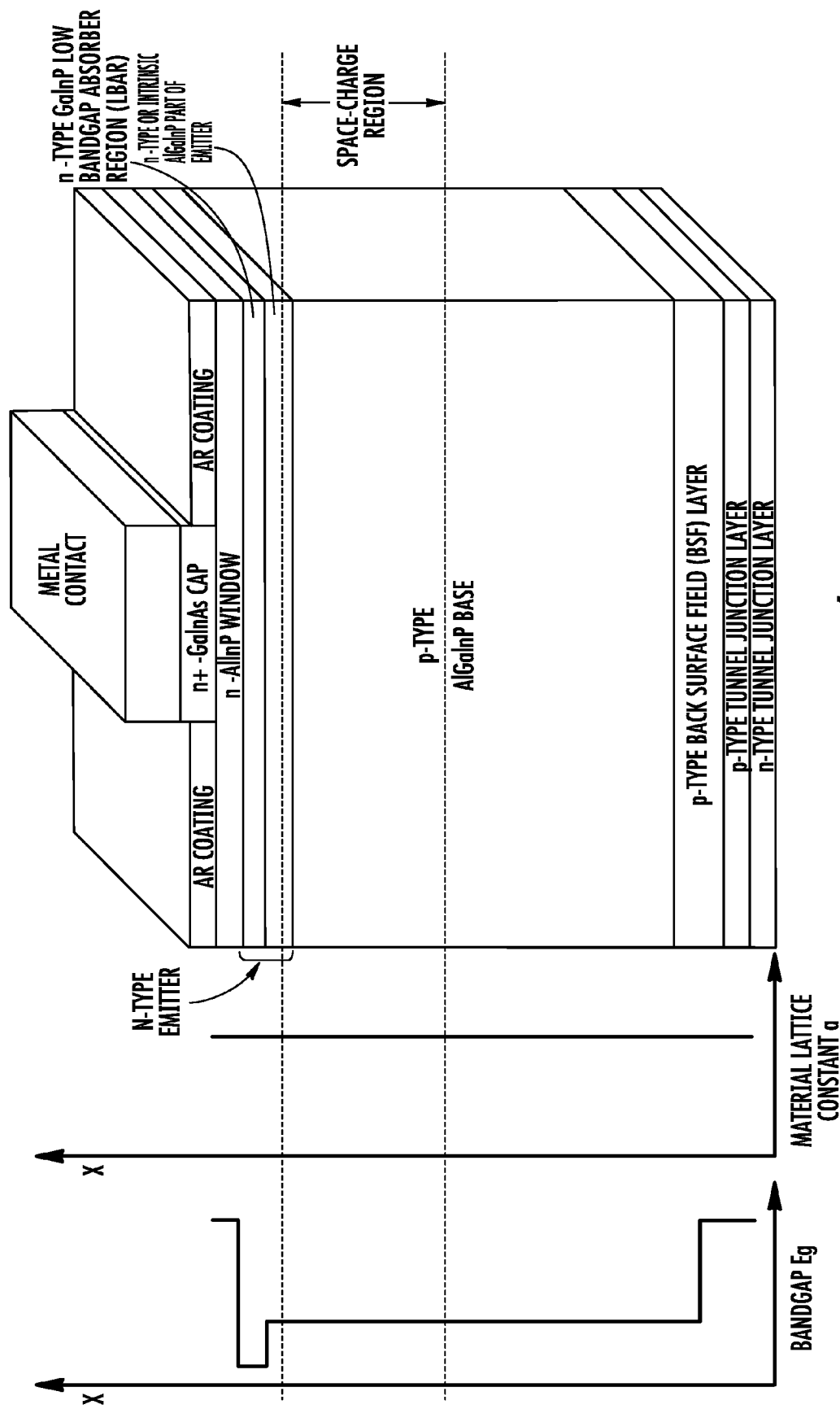
FIG. 4 illustrates a device according to one implementation described herein.

FIG. 4 illustrates an example of a subcell within a solar cell, with an AlGaInP base, and with an Al-free GaInP layer within the emitter having improved charge carrier transport properties and forming an LBAR in the emitter, where the Al-free GaInP layer is entirely in the emitter quasi-neutral region, is in contact with the n-type AlInP window, and is separated from the base layer by an n-type or intrinsic AlGaInP part of the emitter.

Figure 5:
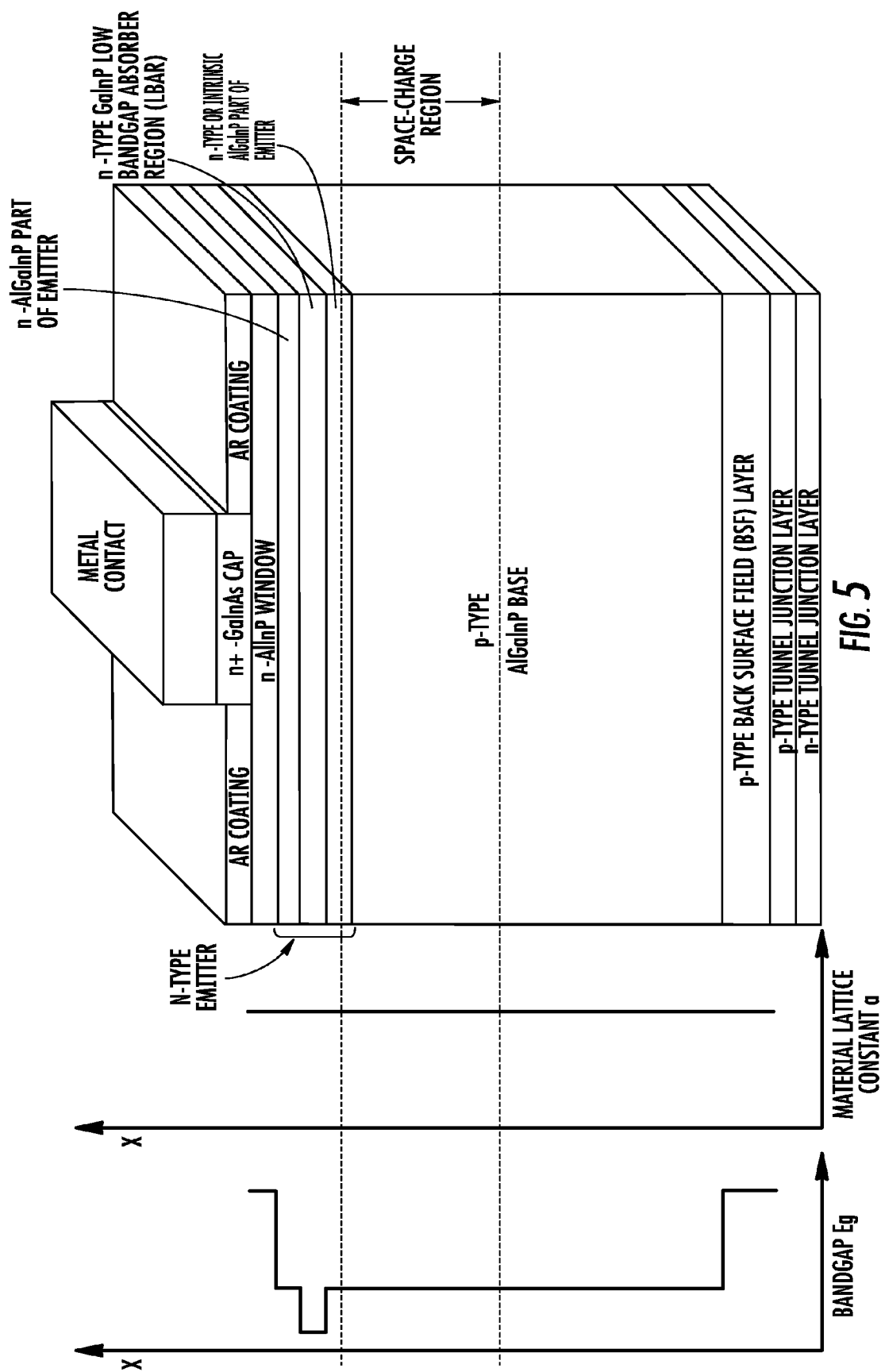
FIG. 5 illustrates a device according to one implementation described herein.

FIG. 5 illustrates an example of a subcell within a solar cell, with an AlGaInP base, and with an Al-free GaInP layer within the emitter having improved charge carrier transport properties and forming an LBAR in the emitter, where the Al-free GaInP layer is entirely in the emitter quasi-neutral region, is separated from the p-type AlGaInP base by an n-type or intrinsic AlGaInP part of the emitter, and is separated from the window layer by an n-type AlGaInP part of the emitter.

Figure 6:
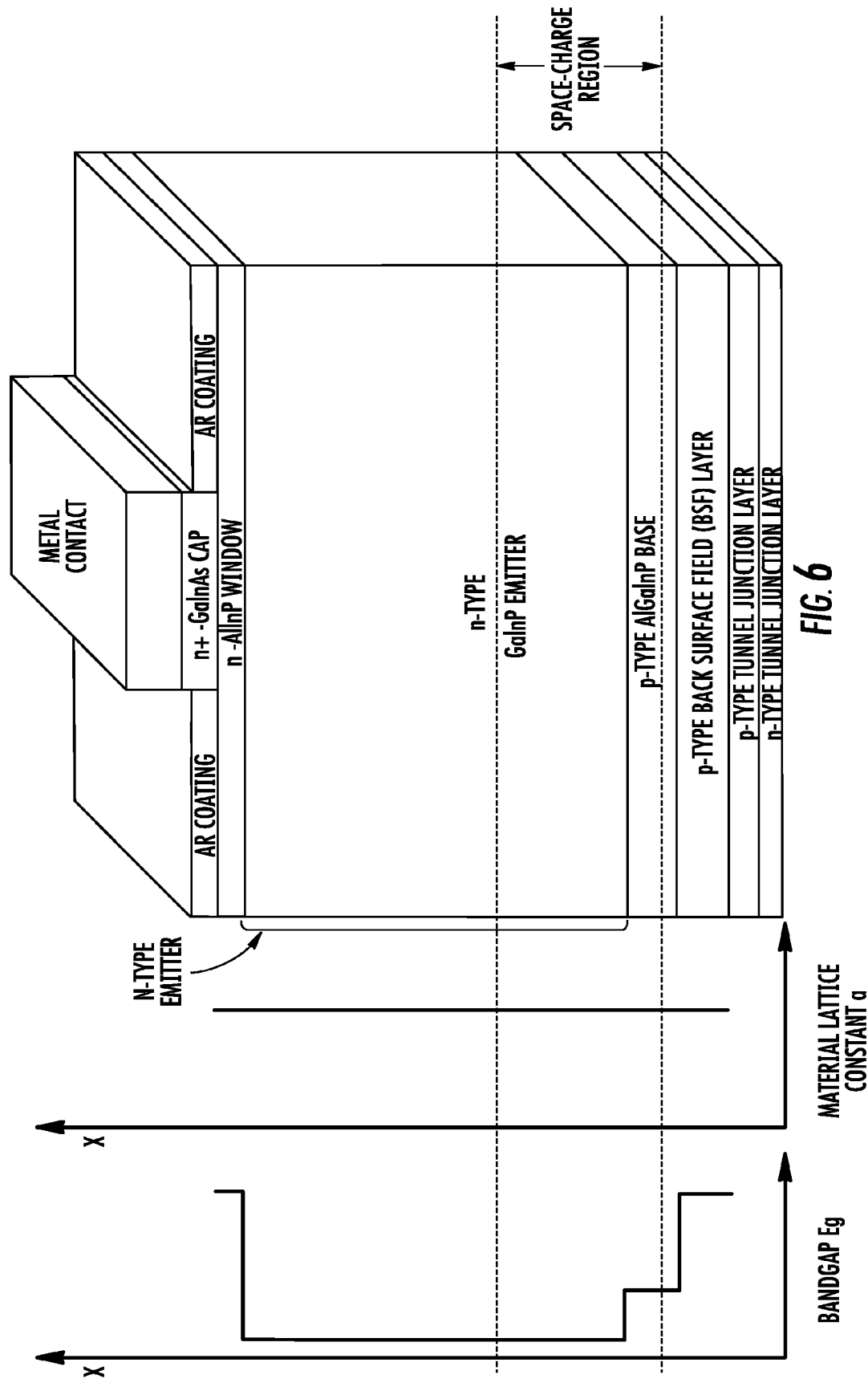
FIG. 6 illustrates a device according to one implementation described herein.

FIG. 6 illustrates an example of a subcell within a solar cell, with an Al-free GaInP layer forming the entire n-type emitter, having improved charge carrier transport properties in the emitter and forming a low-bandgap absorber region (LBAR), and with a p-type AlGaInP base with higher bandgap with respect to the emitter and/or reduced thickness, such that the emitter layer is a major photoabsorbing region of the solar cell, such that 30-100%, and preferably 50-100%, of the photogeneration in the solar cell comes from the emitter layer. The Al-free GaInP emitter is partly in the solar cell quasi-neutral region, and partly in the solar cell space-charge region. The LBAR thickness may range from 5% to 100% of the total solar cell photoabsorber thickness, and may be varied to affect current balance in a multijunction cell.

Figure 7:
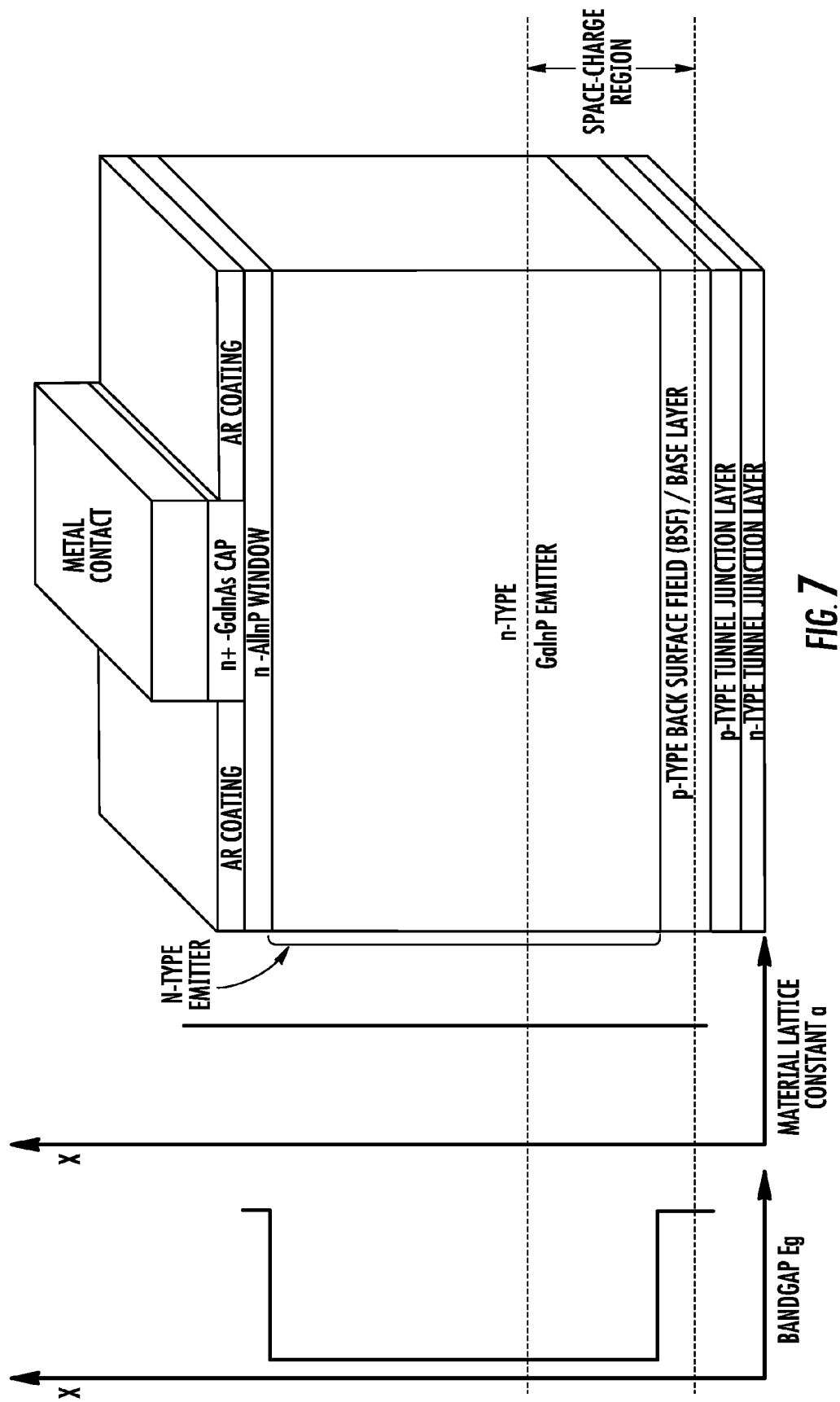
FIG. 7 illustrates a device according to one implementation described herein.

FIG. 7 illustrates an example of a subcell within a solar cell, with an Al-free GaInP layer forming the entire n-type emitter, having improved charge carrier transport properties in the emitter and forming a low-bandgap absorber region (LBAR), and forming a p-n junction between the emitter layer and a back surface field (BSF) layer with higher bandgap than the emitter layer, where there is no base layer (zero thickness base layer) with the same or lower bandgap as the emitter layer but where the BSF layer may also be thought of as having the dual role of a base layer since it forms a p-n junction with the emitter, such that the emitter layer is a major photoabsorbing region of the solar cell, such that 50-100%, and preferably 90-100%, of the photogeneration in the solar cell comes from the emitter layer. The Al-free GaInP emitter is partly in the solar cell quasi-neutral region, and partly in the solar cell space-charge region.

Figure 8:
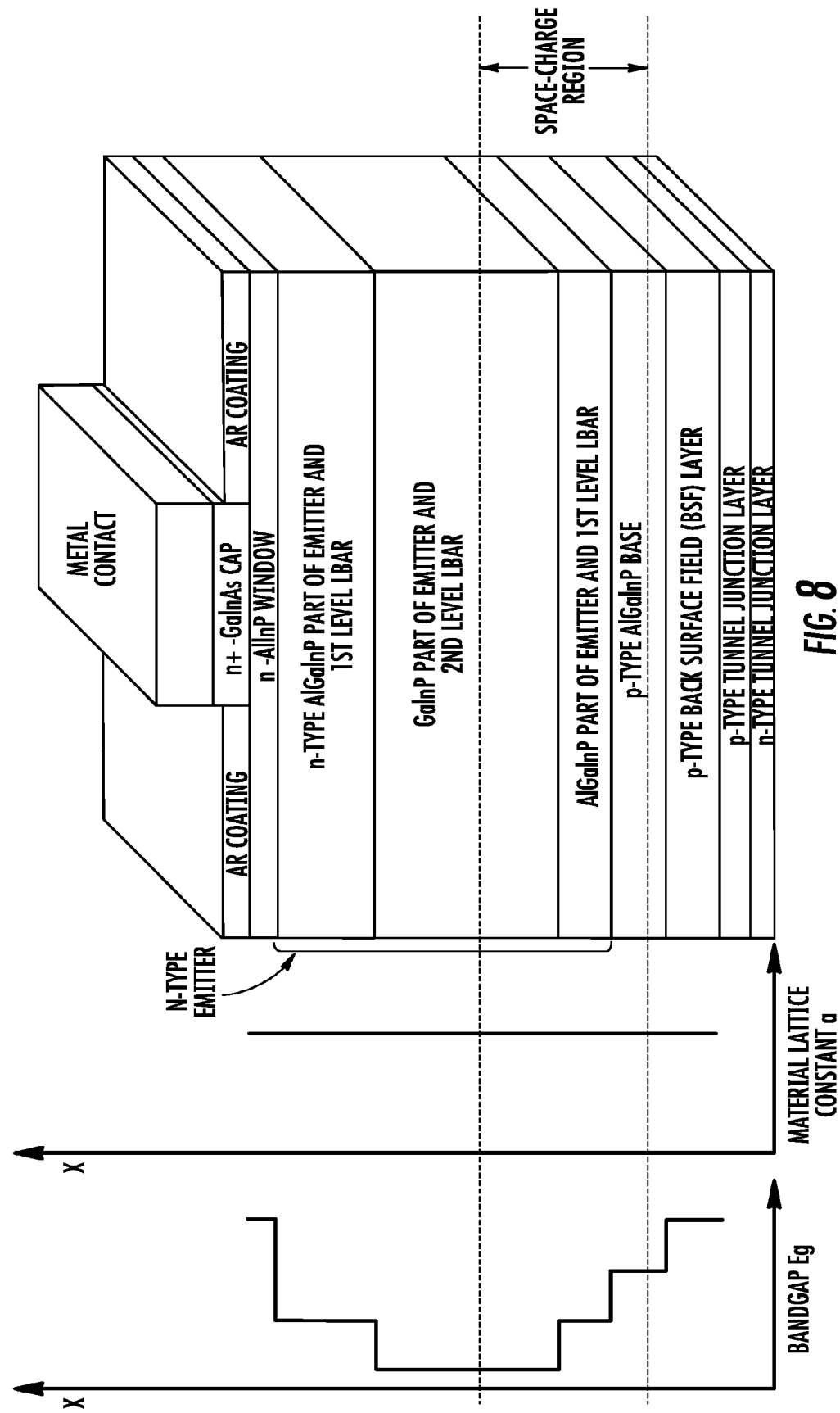
FIG. 8 illustrates a device according to one implementation described herein.

FIG. 8 illustrates an example of a subcell within a solar cell, with emitter layers having bandgaps lower than the p-type base, p-type BSF, and n-type window layers, having improved charge carrier transport properties in the emitter and forming one or more low-bandgap absorber regions (1st level LBARs) in the emitter, and further having a lower bandgap absorber region (2nd level LBAR) with lower bandgap than the 1st level LBARs. The 2nd level LBAR may be partly in the space-charge region and partly in the quasi-neutral region, entirely within the space-charge region, or entirely within the quasi-neutral region. In the example shown in FIG. 8, AlGaInP with lower Al-content than in the base forms the 1st level LBAR layers, and Al-free GaInP forms the 2nd level LBAR, which is partly in the space-charge region and partly in the quasi-neutral region.

Figure 9:
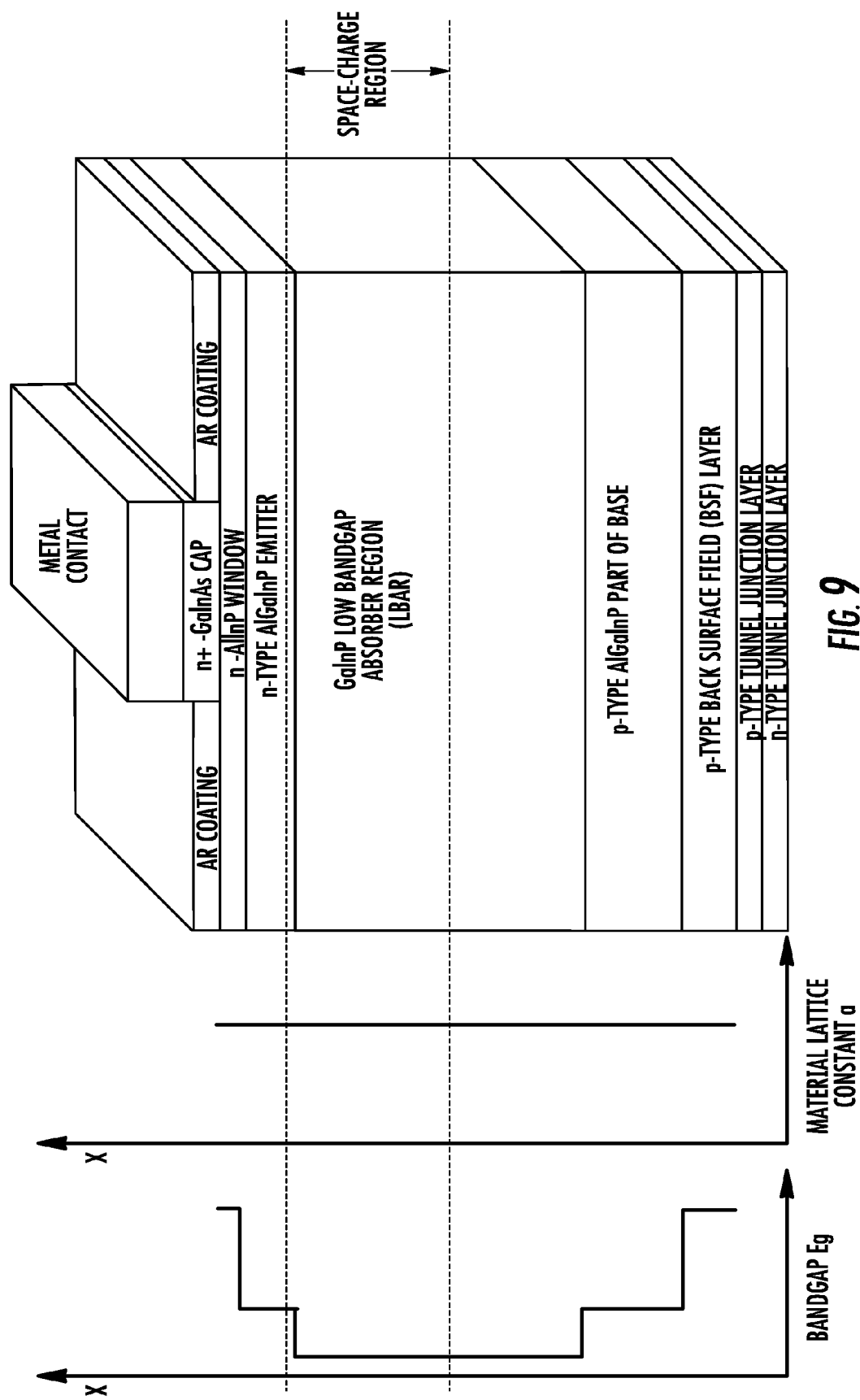
FIG. 9 illustrates a device according to one implementation described herein.

FIG. 9 illustrates an example of a subcell within a solar cell, with one or more layers with improved charge carrier transport properties in the base, and forming one or more low-bandgap absorber regions (LBARs) in the base. The improved transport (IT) and LBAR layer(s) may be partly in the base quasi-neutral region and partly in the base space-charge region, or may be entirely in the base quasi-neutral region, or may be entirely in the base space-charge region. The example in FIG. 9 shows a subcell with an AlGaInP emitter, and with an Al-free GaInP layer within the base having improved charge carrier transport properties and forming an LBAR in the base, where the Al-free GaInP layer is partly in the base quasi-neutral region and partly in the base space-charge region, is in contact with the n-type AlGaInP emitter, and is separated from the back surface field (BSF) layer by a p-type AlGaInP part of the base. The LBAR thickness may range from 0% to 100% of the total base thickness, and may be varied to affect current balance in a multijunction cell.

Figure 10:
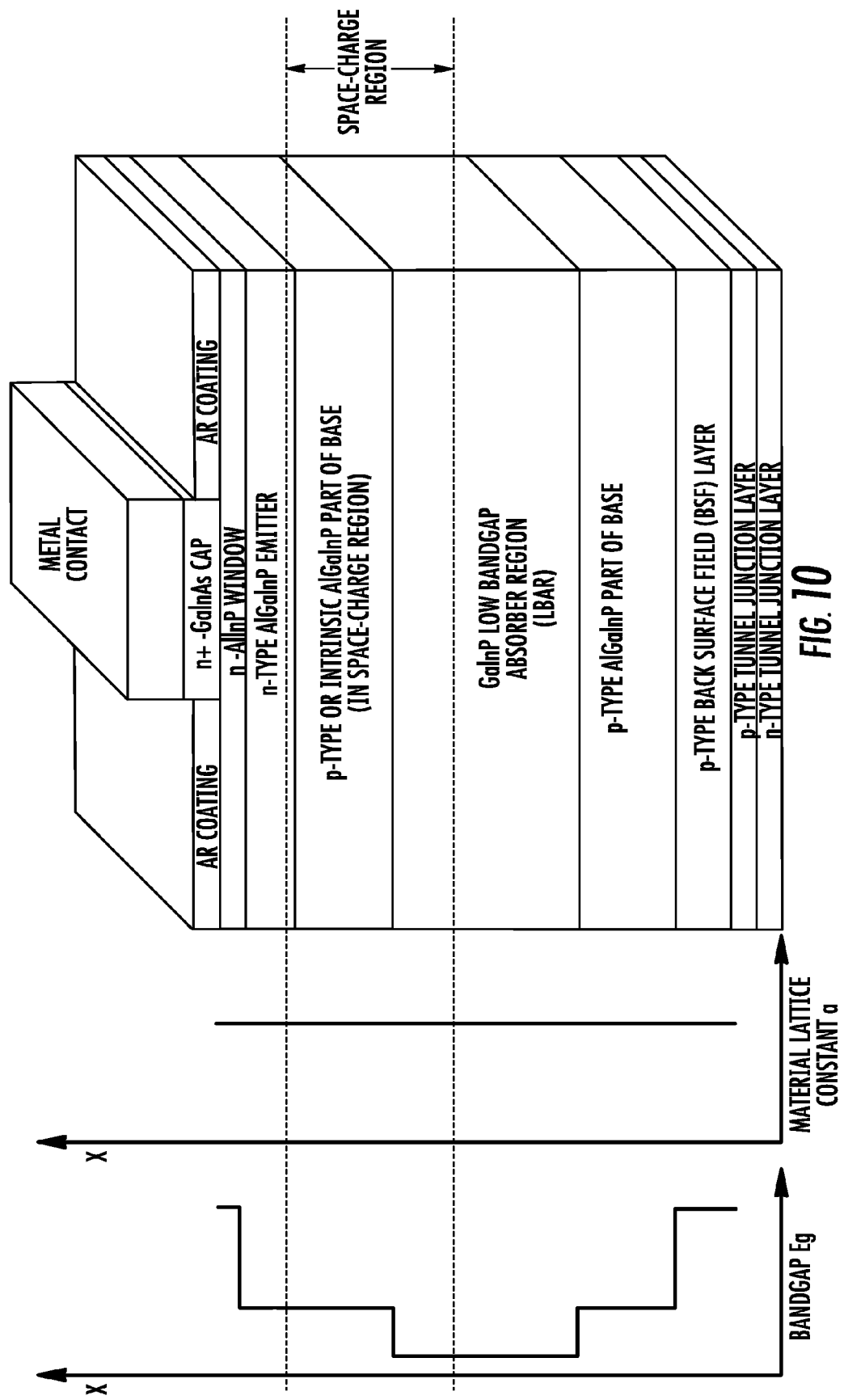
FIG. 10 illustrates a device according to one implementation described herein.

FIG. 10 illustrates an example of a subcell within a solar cell, with an AlGaInP emitter, and with an Al-free GaInP layer within the base having improved charge carrier transport properties and forming an LBAR in the base, where the Al-free GaInP layer is partly in the base quasi-neutral region and partly in the base space-charge region, is separated from the emitter layer by a p-type or intrinsic AlGaInP part of the base, and is separated from the back surface field (BSF) layer by a p-type AlGaInP part of the base.

Figure 11:
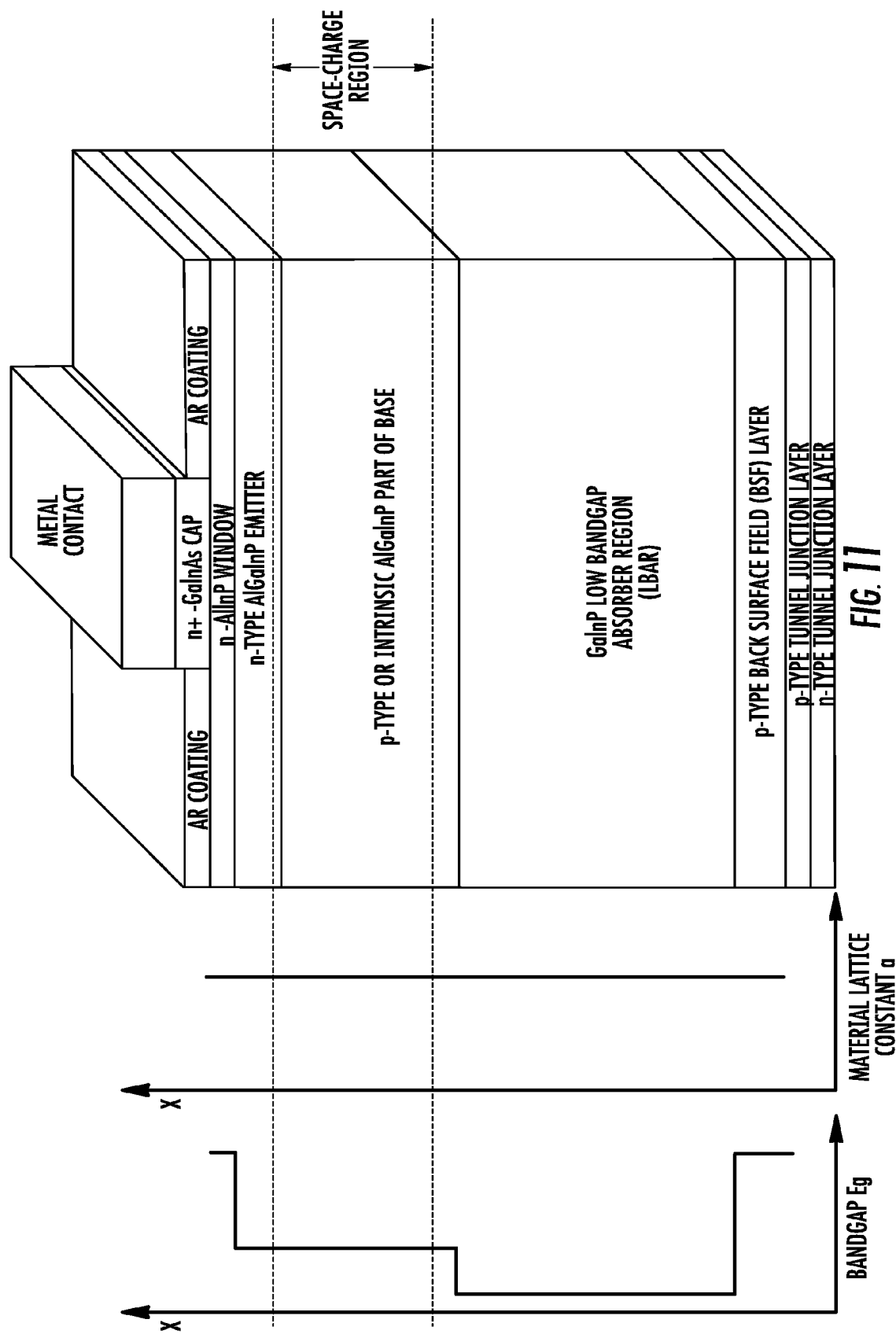
FIG. 11 illustrates a device according to one implementation described herein.

FIG. 11 illustrates an example of a subcell within a solar cell, with an AlGaInP emitter, and with an Al-free GaInP layer within the base having improved charge carrier transport properties and forming an LBAR in the base, where the Al-free GaInP layer is entirely in the base quasi-neutral region, is separated from the emitter layer by a p-type or intrinsic AlGaInP part of the base, and is in contact with the back surface field (BSF) layer.

Figure 12:
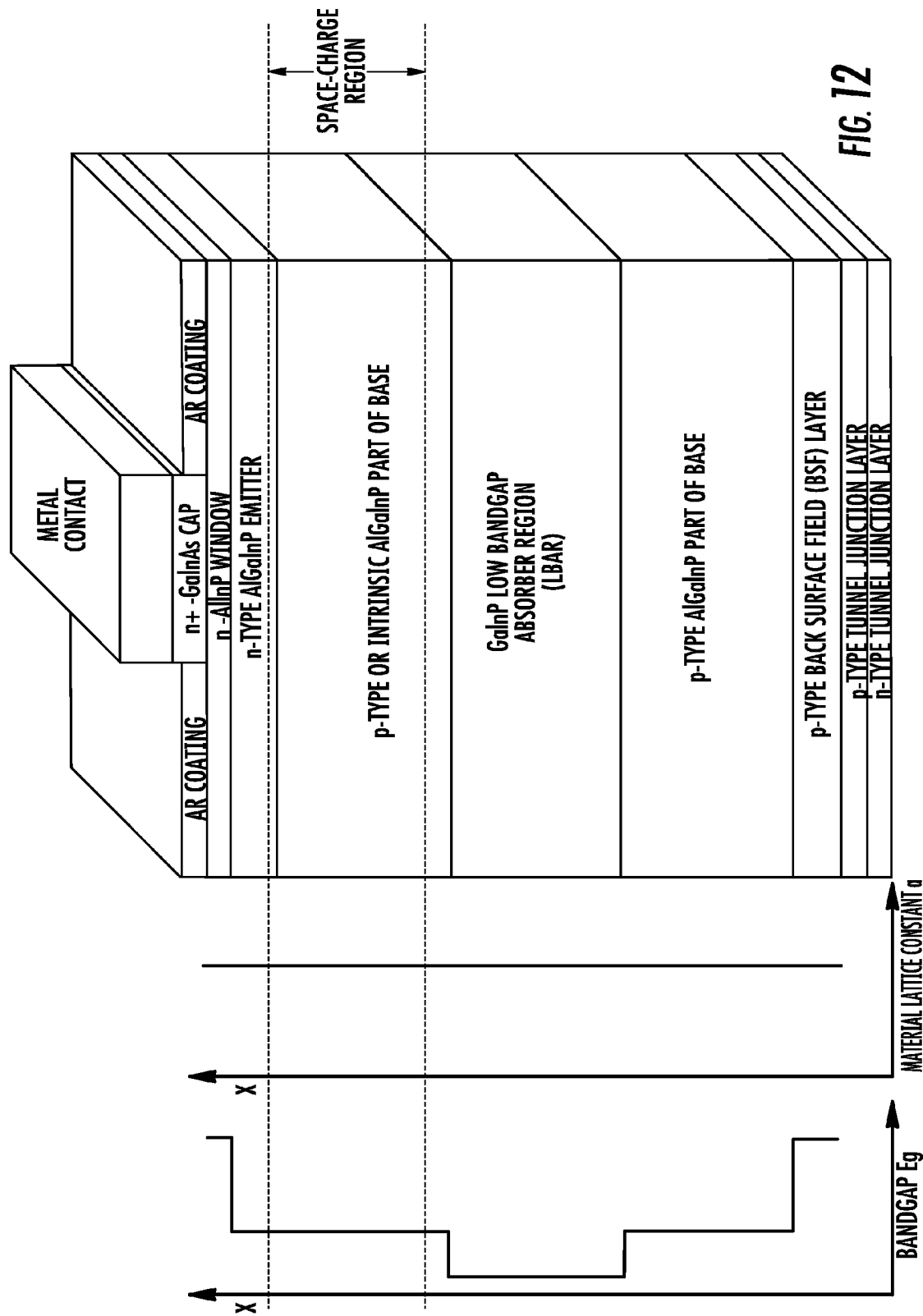
FIG. 12 illustrates a device according to one implementation described herein.

FIG. 12 illustrates an example of a subcell within a solar cell, with an AlGaInP emitter, and with an Al-free GaInP layer within the base having improved charge carrier transport properties and forming an LBAR in the base, where the Al-free GaInP layer is entirely in the base quasi-neutral region, is separated from the emitter layer by a p-type or intrinsic AlGaInP part of the base, and is separated from the back surface field (BSF) layer by a p-type AlGaInP part of the base.

Figure 13:
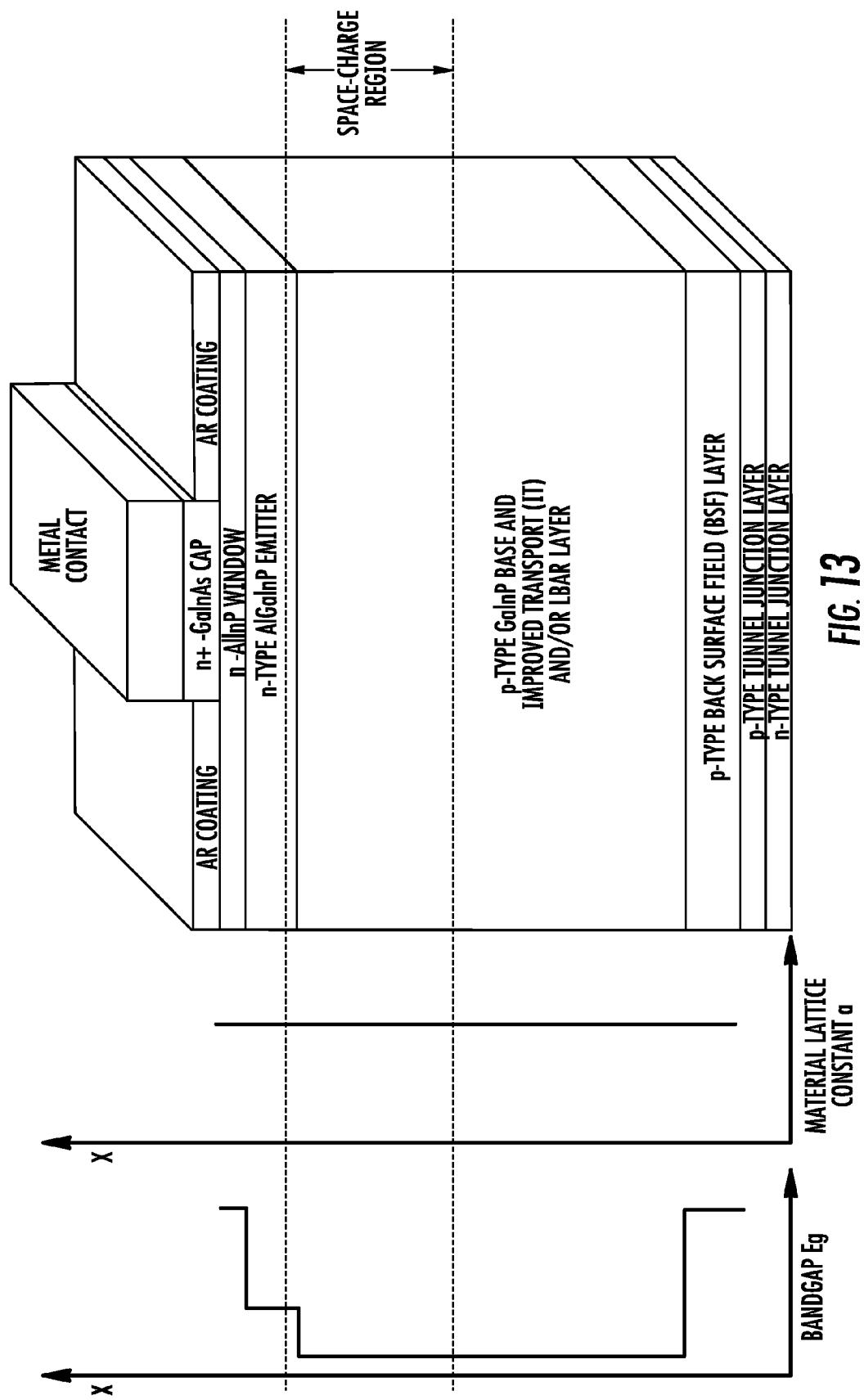
FIG. 13 illustrates a device according to one implementation described herein.

FIG. 13 illustrates an example of a subcell within a solar cell, with an improved charge carrier transport layer and/or low bandgap absorber region (LBAR) forming the entire p-type base, and having an emitter with higher bandgap with respect to the base and/or reduced thickness, such that the base layer is a major photoabsorbing region of the solar cell, such that 30-100%, and preferably 50-100%, of the photogeneration in the solar cell comes from the base layer. The improved transport (IT) and/or LBAR layer in the base is partly in the solar cell quasi-neutral region, and partly in the solar cell space-charge region. The IT and/or LBAR thickness may range from 5% to 100% of the total solar cell photoabsorber thickness, and may be varied to affect current balance in a multijunction cell. In the example shown in FIG. 13, the IT/LBAR base layer and the emitter layer are composed of Al-free GaInP and AlGaInP, respectively, but they may be composed of other materials as well, such as an ordered GaInP base and disordered (Al)GaInP emitter, or an unstrained GaInP base and a tensile-strained pseudomorphic AlInP window/emitter with higher Al content and higher bandgap than for an unstrained lattice matched AlInP layer.

Figure 14:
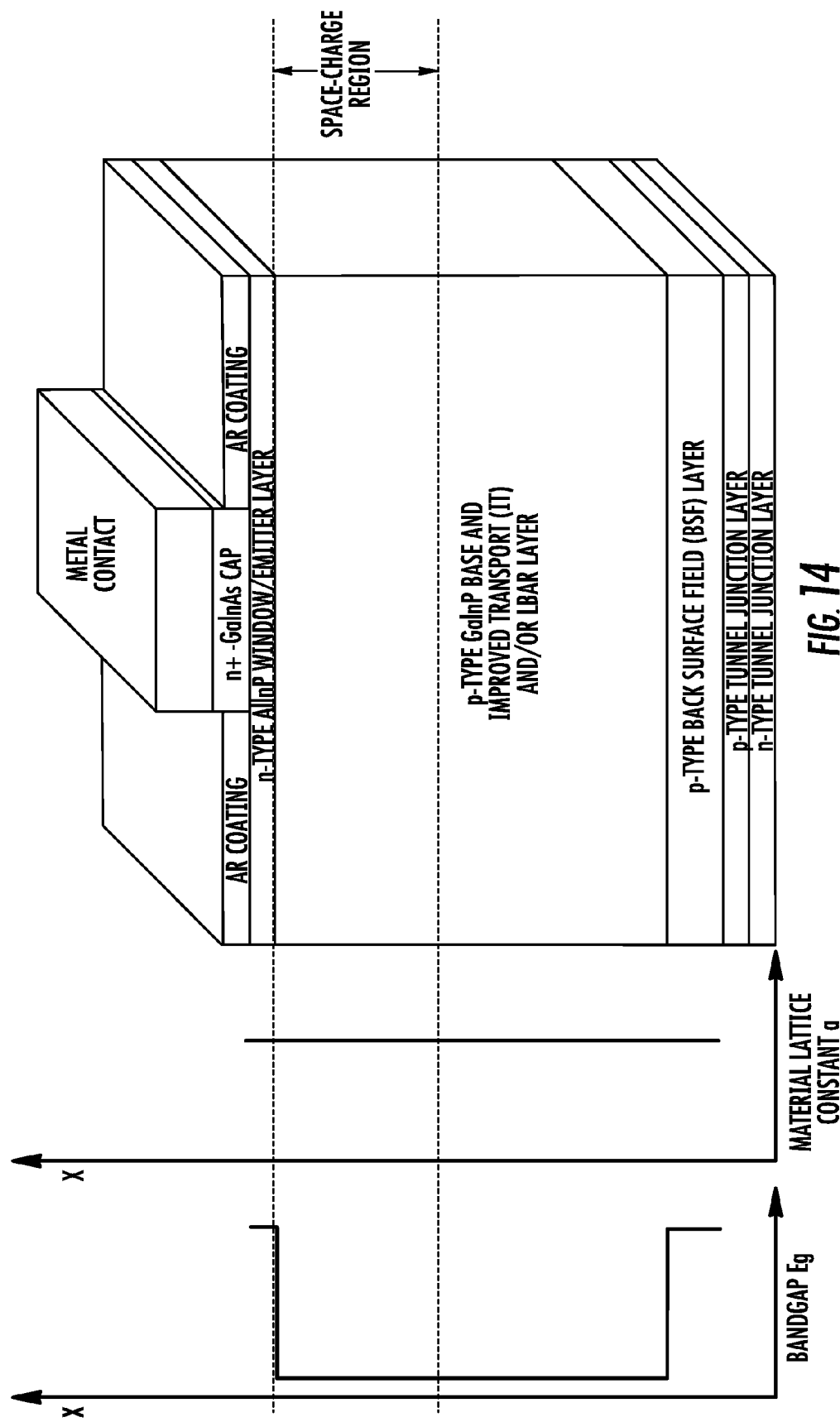
FIG. 14 illustrates a device according to one implementation described herein.

FIG. 14 illustrates an example of a subcell within a solar cell, with an improved charge carrier transport layer and/or low bandgap absorber region (LBAR) forming the entire p-type base, and forming a p-n junction between the base layer and a window layer with higher bandgap than the base layer, where there is no emitter layer (zero thickness emitter layer) with the same or lower bandgap as the base layer but where the window layer may also be thought of as having the dual role of an emitter layer since it forms a p-n junction with the base, such that the base layer is a major photoabsorbing region of the solar cell, such that 50-100%, and preferably 90-100%, of the photogeneration in the solar cell comes from the base layer. The improved transport (IT) and/or LBAR layer in the base is partly in the solar cell quasi-neutral region, and partly in the solar cell space-charge region. In the example shown in FIG. 14, the IT/LBAR base layer and the window/emitter layer are composed of Al-free GaInP and AlInP, respectively, but they may be composed of other materials as well, such as an ordered GaInP base and disordered (Al)(Ga)InP window/emitter, or an unstrained GaInP base and a tensile-strained pseudomorphic AlInP window/emitter with higher Al content and higher bandgap than for an unstrained lattice matched AlInP layer.

Figure 15:
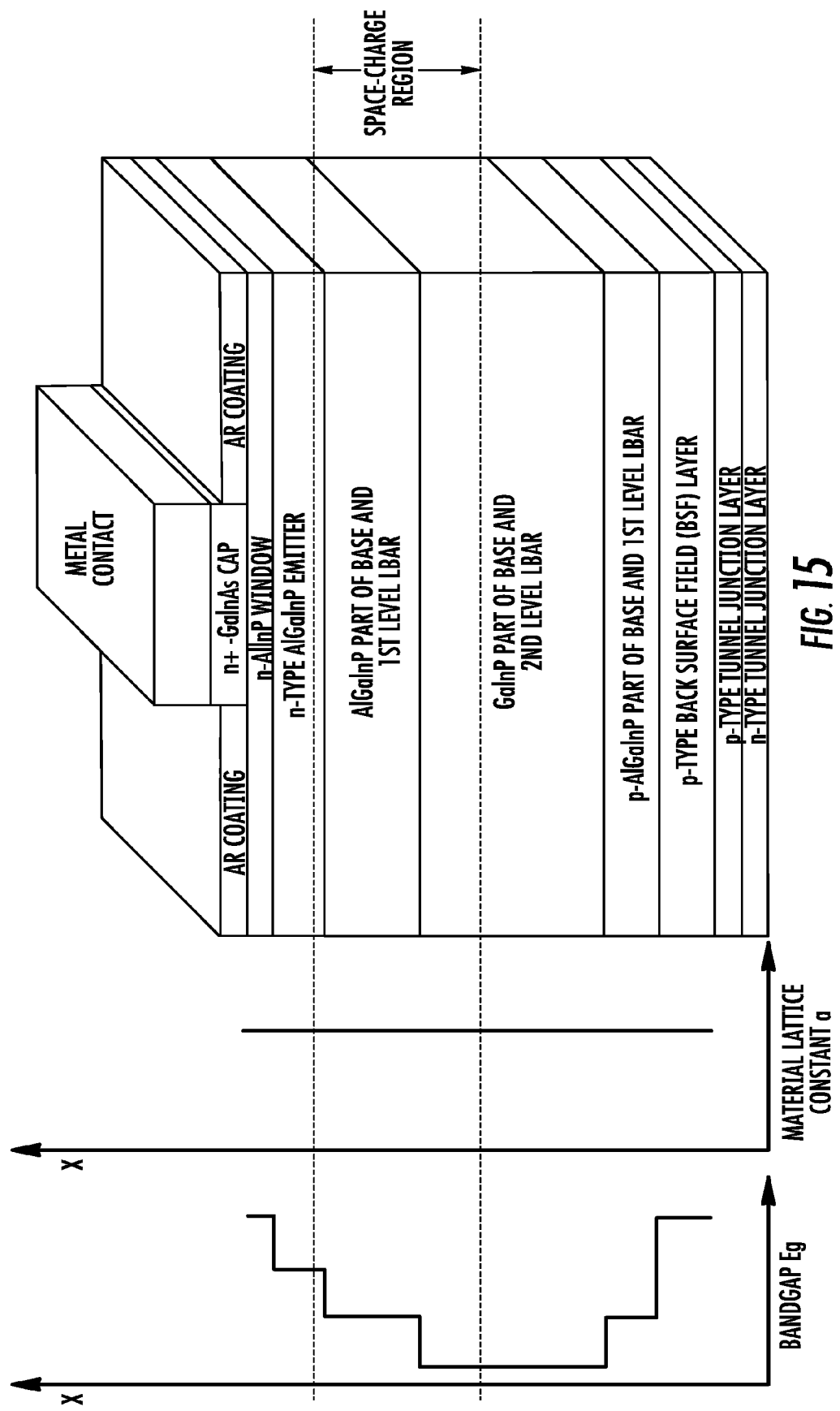
FIG. 15 illustrates a device according to one implementation described herein.

FIG. 15 illustrates an example of a subcell within a solar cell, with base layers having bandgaps lower than the n-type emitter, n-type window, and p-type BSF layers, having improved charge carrier transport properties in the base and forming one or more low-bandgap absorber regions (1st level LBARs) in the base, and further having a lower bandgap absorber region (2nd level LBAR) with lower bandgap than the 1st level LBARs. The 2nd level LBAR may be partly in the space-charge region and partly in the quasi-neutral region, entirely within the space-charge region, or entirely within the quasi-neutral region. In the example shown in FIG. 15, AlGaInP with lower Al-content than in the emitter forms the 1st level LBAR layers, and Al-free GaInP forms the 2nd level LBAR, which is partly in the space-charge region and partly in the quasi-neutral region.

Figure 16:
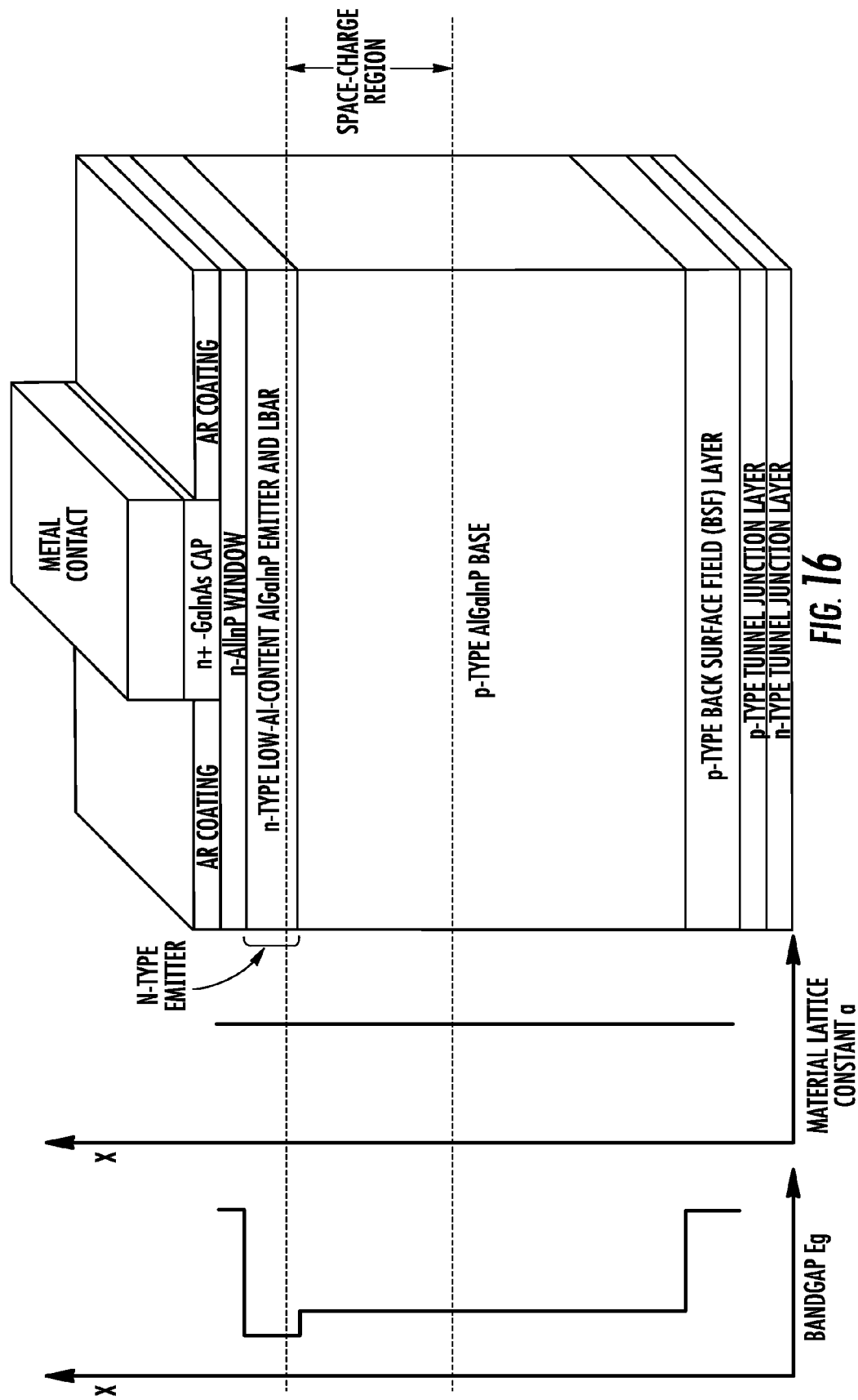
FIG. 16 illustrates a device according to one implementation described herein.

FIG. 16 illustrates an example of a subcell within a solar cell, with an AlGaInP base and a low-Al-content AlGaInP emitter with respect to the Al composition of the base, with improved charge carrier transport properties in the emitter, and forming an LBAR in the emitter. Any of the examples disclosed herein with an improved transport (IT) and/or LBAR layer formed from Al-free GaInP may instead have a low-Al-content AlGaInP IT and/or LBAR layer, with low Al composition with respect to other photogeneration layers in the solar cell.

Figure 17:
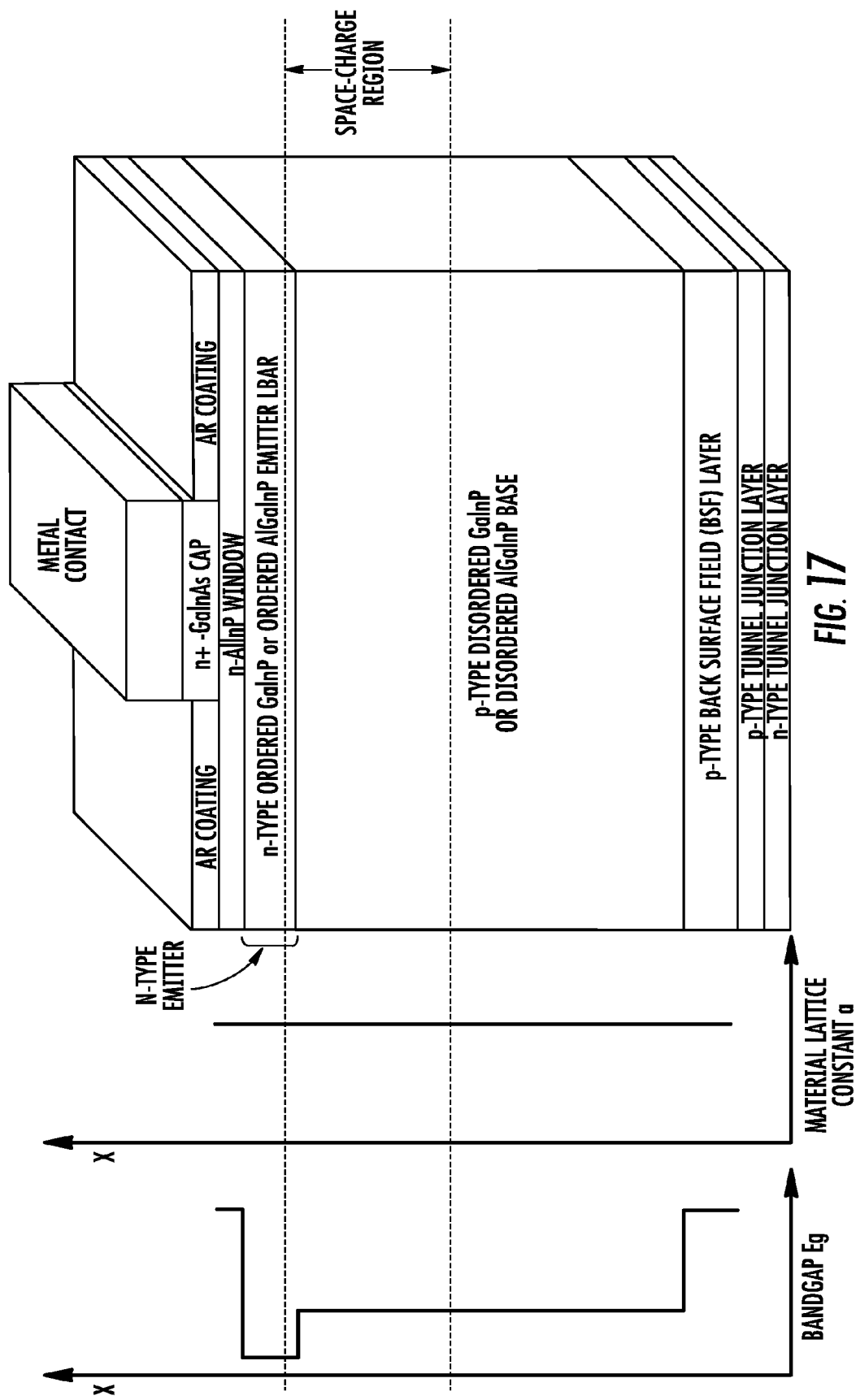
FIG. 17 illustrates a device according to one implementation described herein.

FIG. 17 illustrates an example of a subcell within a solar cell, with a GaInP or AlGaInP base that is largely or completely disordered on the group-III sublattice (disordered (Al)GaInP or d-(Al)GaInP), and an emitter composed of GaInP or AlGaInP with some degree of ordering on the group-III sublattice (ordered (Al)GaInP or o-(Al)GaInP), resulting in lower bandgap in the ordered material with respect to the disordered material, forming a low bandgap absorber region (LBAR) in the emitter, and/or an improved transport (IT) layer or layers in the emitter or base, due to the degree of order or disorder on the group-III sublattice.

Figure 18:
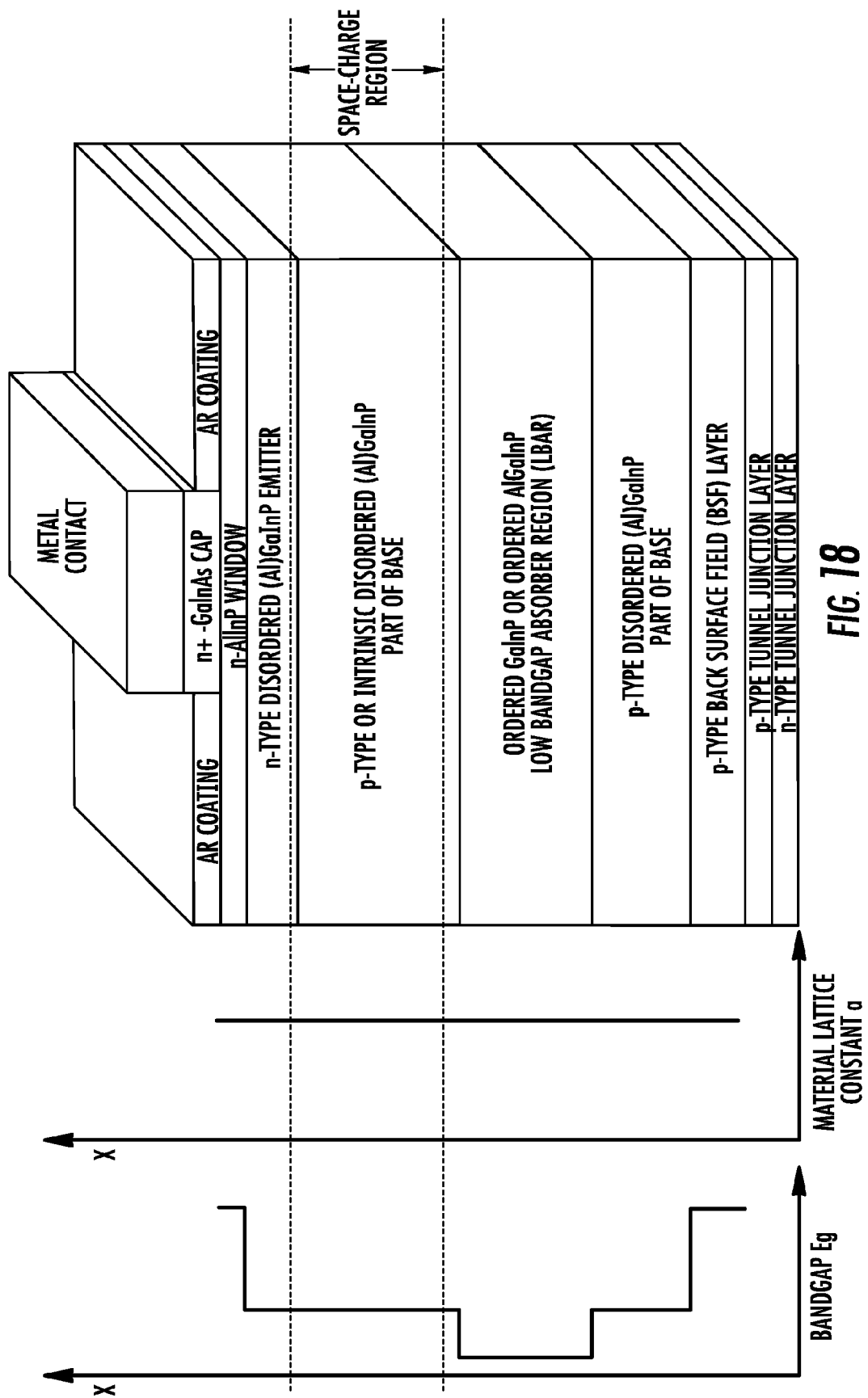
FIG. 18 illustrates a device according to one implementation described herein.

FIG. 18 illustrates an example of a subcell within a solar cell, with a disordered (Al)GaInP (meaning GaInP or AlGaInP) emitter, and with an ordered GaInP or AlGaInP layer within the quasi-neutral region of the base, having lower bandgap than for disordered material and forming an LBAR, and/or an improved transport (IT) layer or layers in the emitter or base, due to the degree of order or disorder on the group-III sublattice.

Figure 19:
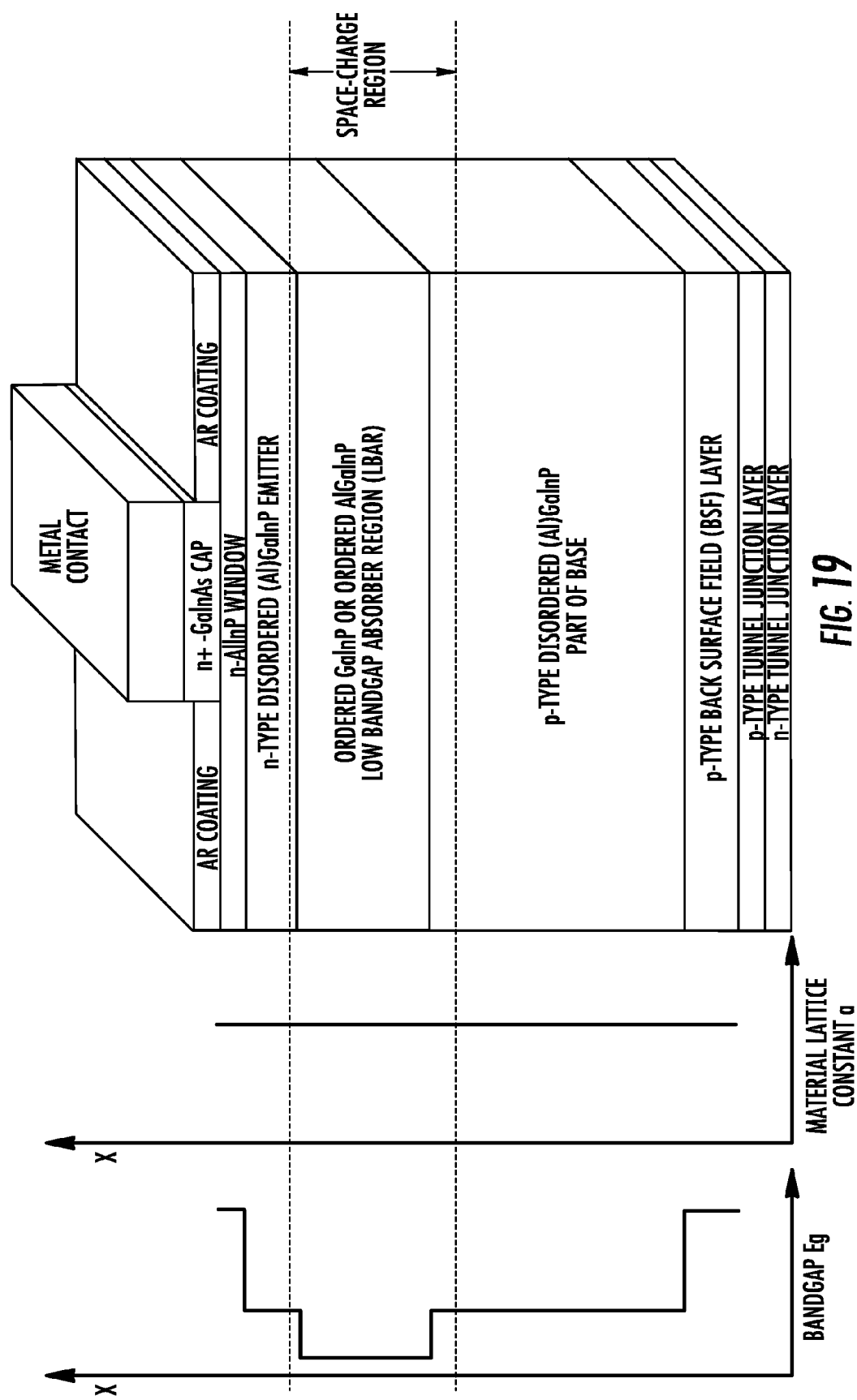
FIG. 19 illustrates a device according to one implementation described herein.

FIG. 19 illustrates an example of a subcell within a solar cell, with a disordered (Al)GaInP (meaning GaInP or AlGaInP) emitter, and with an ordered GaInP or AlGaInP layer within the space-charge region of the base, having lower bandgap than for disordered material and forming an LBAR, and/or an improved transport (IT) layer or layers in the emitter or base, due to the degree of order or disorder on the group-III sublattice.

Figure 20:
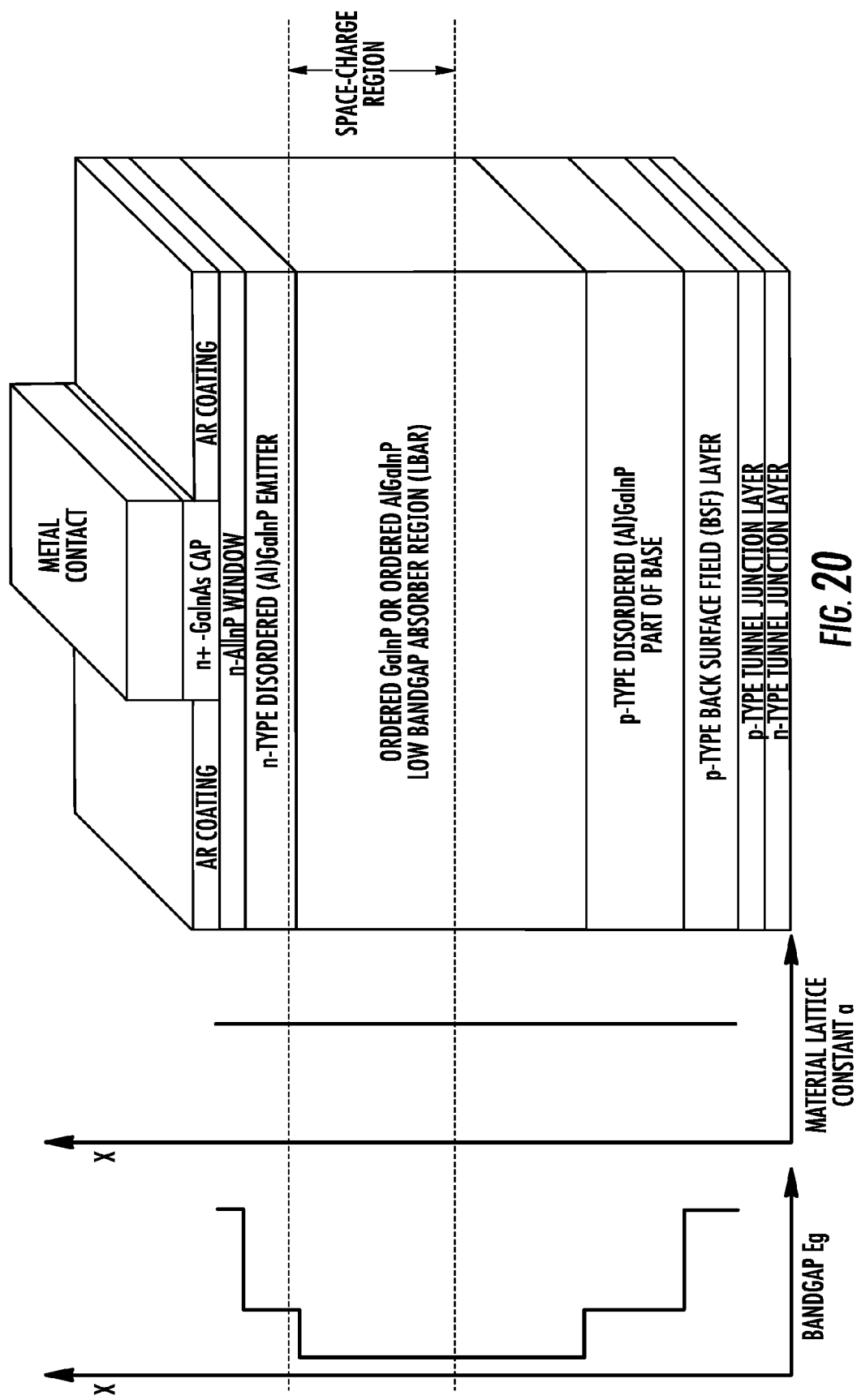
FIG. 20 illustrates a device according to one implementation described herein.

FIG. 20 illustrates an example of a subcell within a solar cell, with a disordered (Al)GaInP (meaning GaInP or AlGaInP) emitter, and with an ordered GaInP or AlGaInP layer partly within the quasi-neutral region of the base and partly within the space-charge region of the base, having lower bandgap than for disordered material and forming an LBAR, and/or an improved transport (IT) layer or layers in the emitter or base, due to the degree of order or disorder on the group-III sublattice.

Figure 21:
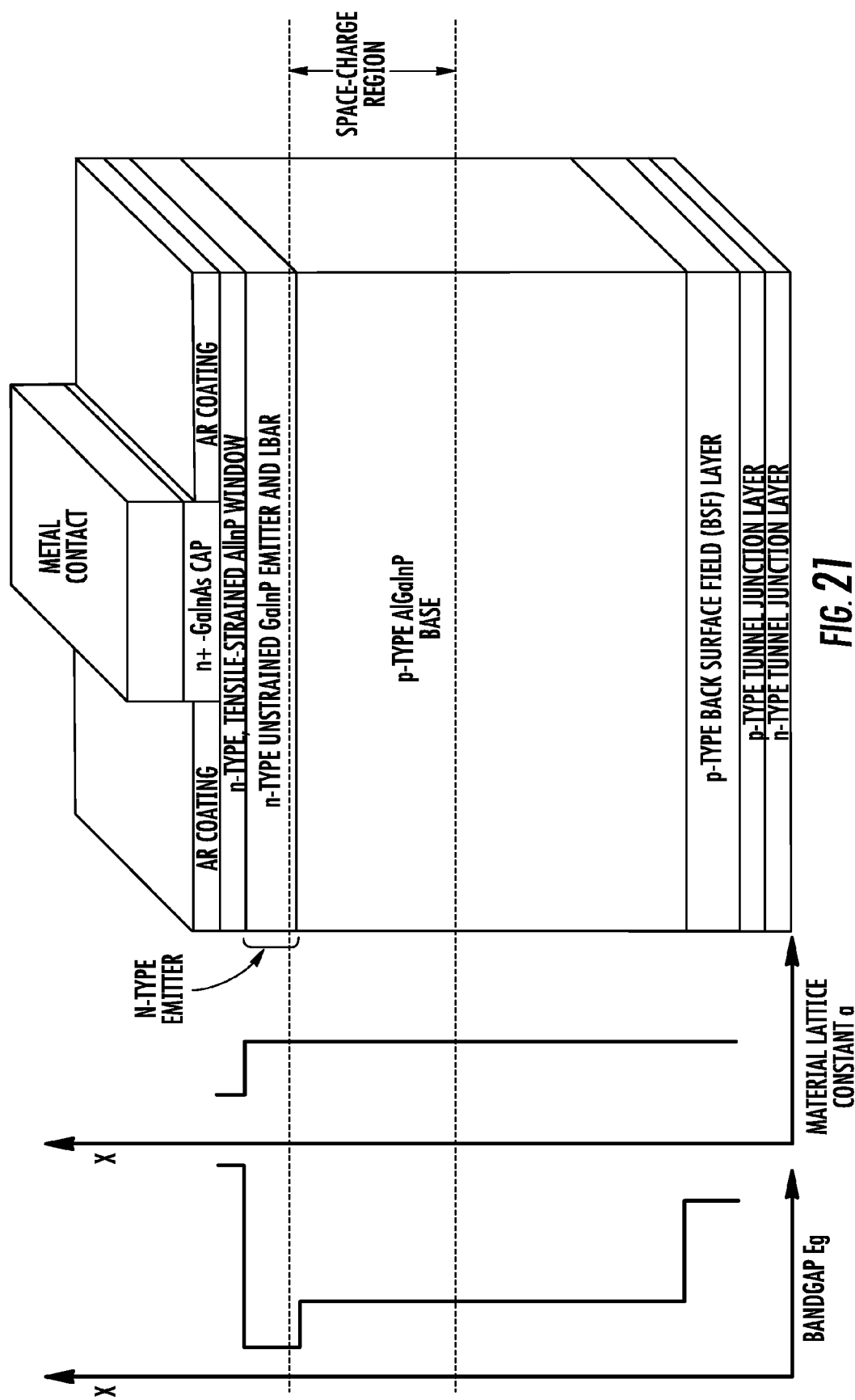
FIG. 21 illustrates a device according to one implementation described herein.

FIG. 21 illustrates an example of a subcell within a solar cell, with a p-type AlGaInP base, and with an n-type Al-free GaInP emitter faulting an LBAR and improved transport (IT) layer in the emitter, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the GaInP emitter is lattice-matched and unstrained with respect to the AlGaInP solar cell base.

Figure 22:
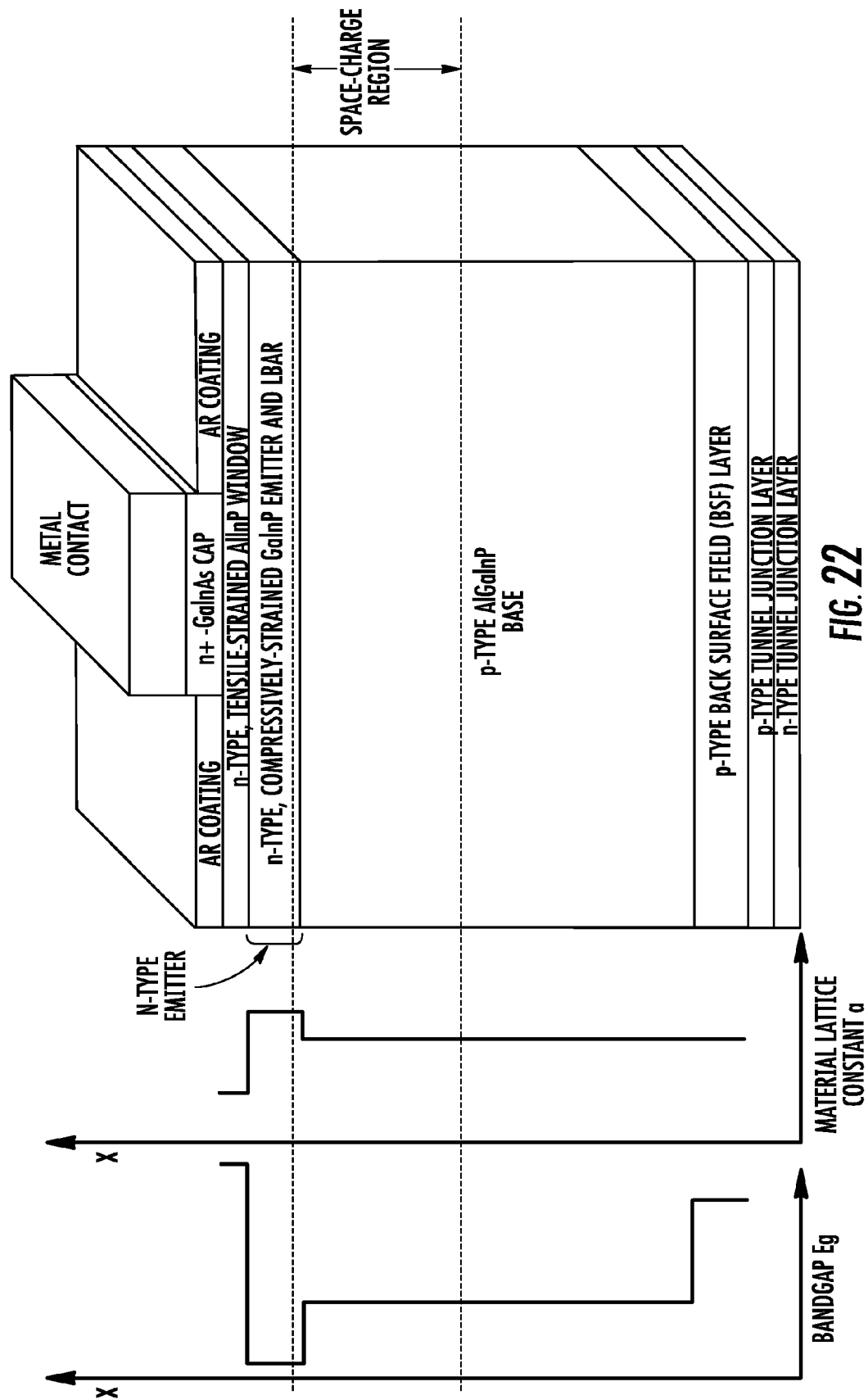
FIG. 22 illustrates a device according to one implementation described herein.

FIG. 22 illustrates an example of a subcell within a solar cell, with a p-type AlGaInP base, and with an n-type, pseudomorphic, Al-free GaInP emitter in compressive strain with respect to the AlGaInP base, forming an LBAR and improved transport (IT) layer in the emitter, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the compressively-strained GaInP emitter balances the tensile strain in the AlInP window.

Figure 23:
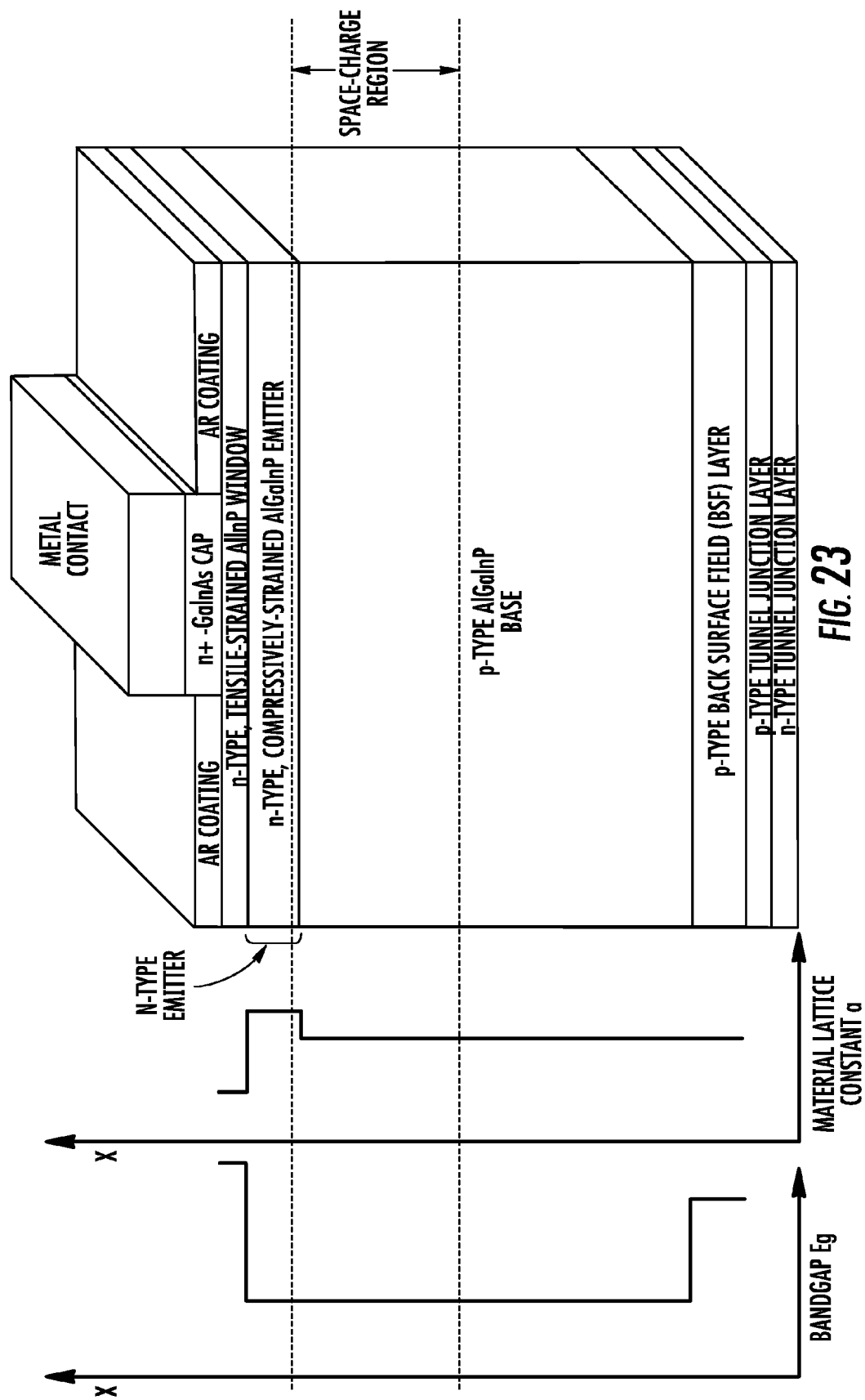
FIG. 23 illustrates a device according to one implementation described herein.

FIG. 23 illustrates an example of a subcell within a solar cell, with a p-type AlGaInP base, and with an n-type, pseudomorphic, AlGaInP emitter in compressive strain with respect to the AlGaInP base and with Al content in the emitter such that the emitter bandgap may be less than, the same as, or greater than the AlGaInP base, in combination with a high-Al-content, pseudomorphic, AlInP window in tensile strain with respect to the emitter to achieve higher bandgap and greater transparency of the window. Here high-Al-content in the AlInP emitter means that the Al content is higher than the AlInP composition with the same material lattice constant as the AlGaInP base, and the compressively-strained AlGaInP emitter balances the tensile strain in the AlInP window.

Figure 24:
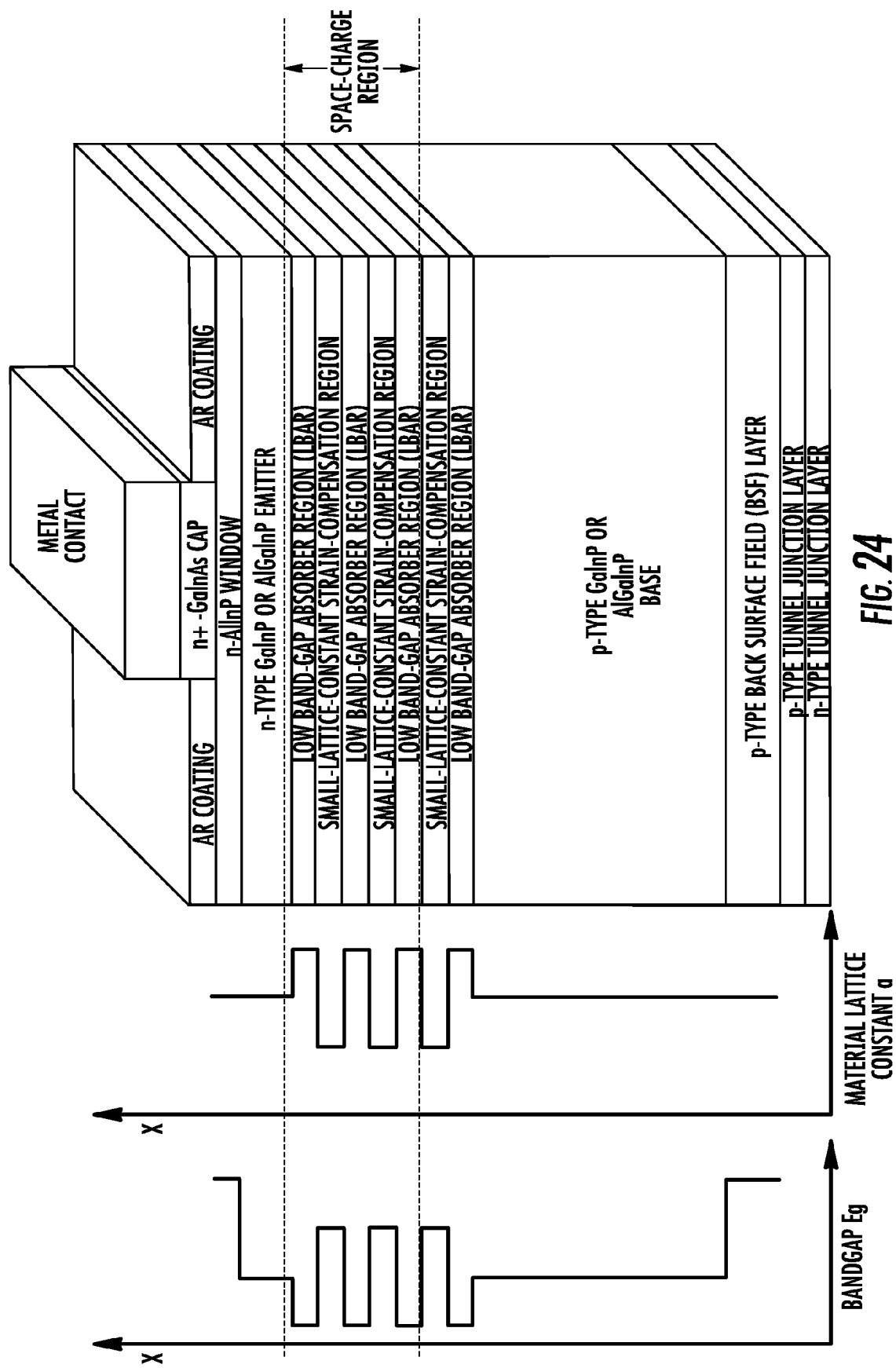
FIG. 24 illustrates a device according to one implementation described herein.

FIG. 24 illustrates an example of a subcell within a solar cell, with a GaInP or AlGaInP base and with LBARs and strain compensation regions (SCRs) which may take the form of layers. The LBARs and strain compensation regions may be partly in the space-charge region and partly in the quasi-neutral region of the base as shown, or may be partly in the space-charge region and partly in the quasi-neutral region of the emitter, or may be partly in the space-charge region and partly in the quasi-neutral regions of both the emitter and the base, or may be entirely in the quasi-neutral region of the base, or may be entirely in the quasi-neutral region of the emitter, or may be entirely in the space-charge region. Any of the examples disclosed herein with an improved transport (IT) and/or LBAR layer in the cell structure may instead use a combination of LBARs and strain compensation regions.

Figure 25:
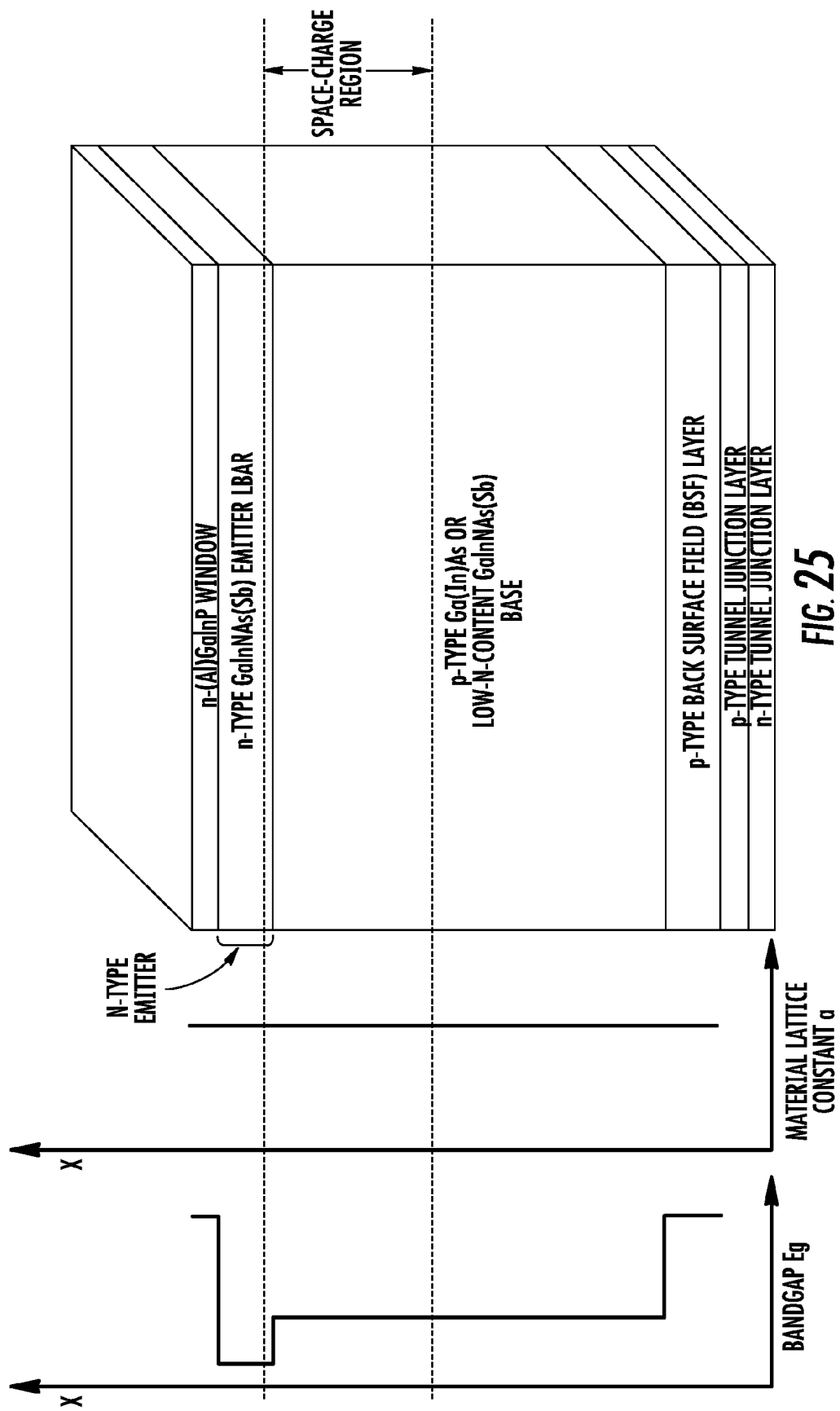
FIG. 25 illustrates a device according to one implementation described herein.

FIG. 25 illustrates an example of a subcell within a solar cell, with an n-type dilute nitride GaInNAs(Sb) emitter layer forming an LBAR in the emitter due to the reduction in bandgap due to nitrogen incorporation, and a GaAs, GaInAs, or low-nitrogen-content GaInNAs(Sb) base, with lower N content and higher bandgap with respect to the emitter, forming an improved transport (IT) layer in the base, due to the absence or lower concentration of N in the base layers.

Figure 26:
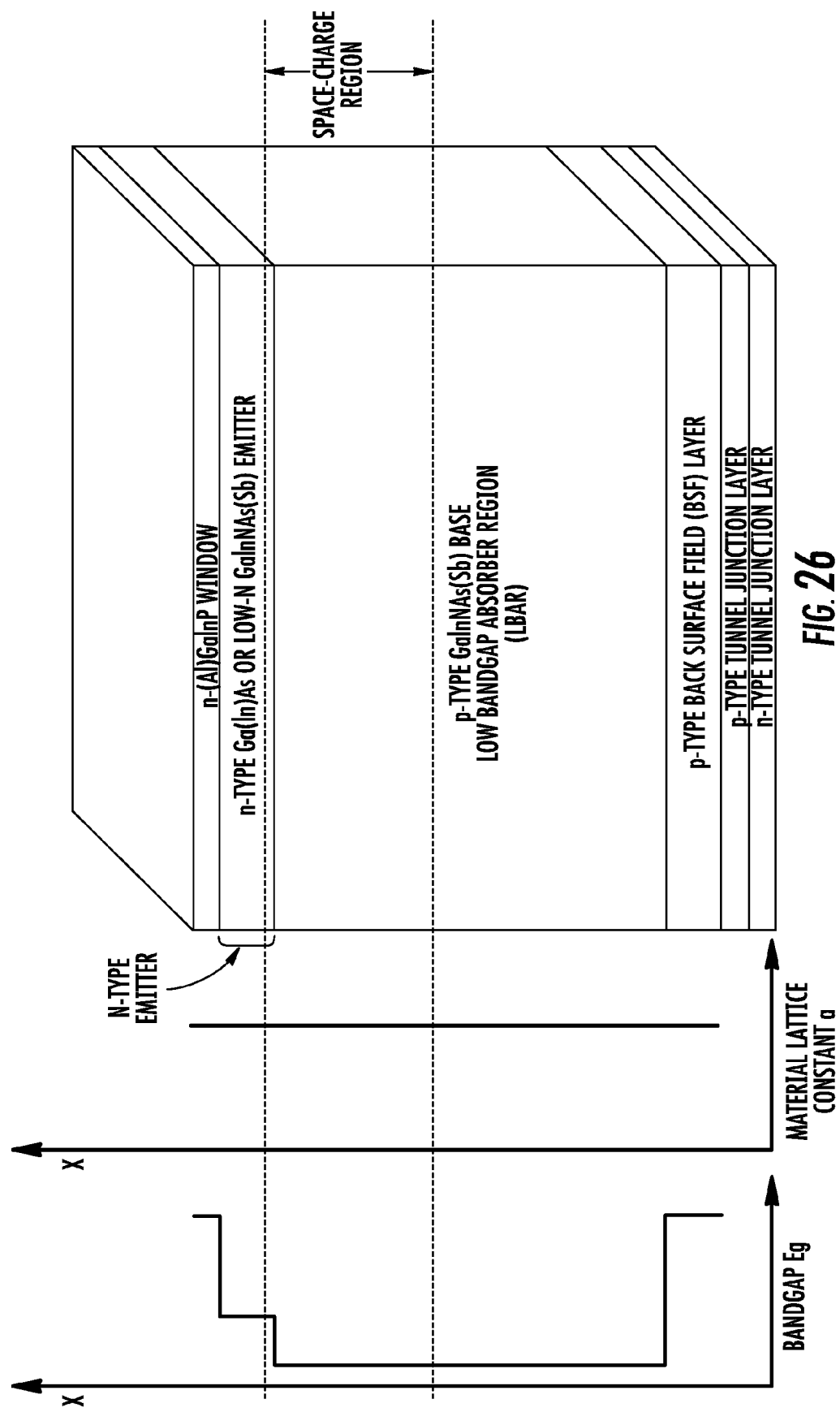
FIG. 26 illustrates a device according to one implementation described herein.

FIG. 26 illustrates an example of a subcell within a solar cell, with a p-type dilute nitride GaInNAs(Sb) base layer forming an LBAR in the base due to the reduction in bandgap due to nitrogen incorporation, and a GaAs, GaInAs, or low-nitrogen-content GaInNAs(Sb) emitter, with lower N content and higher bandgap with respect to the base, forming an improved transport (IT) layer in the emitter, due to the absence or lower concentration of N in the emitter layers.

Figure 27:
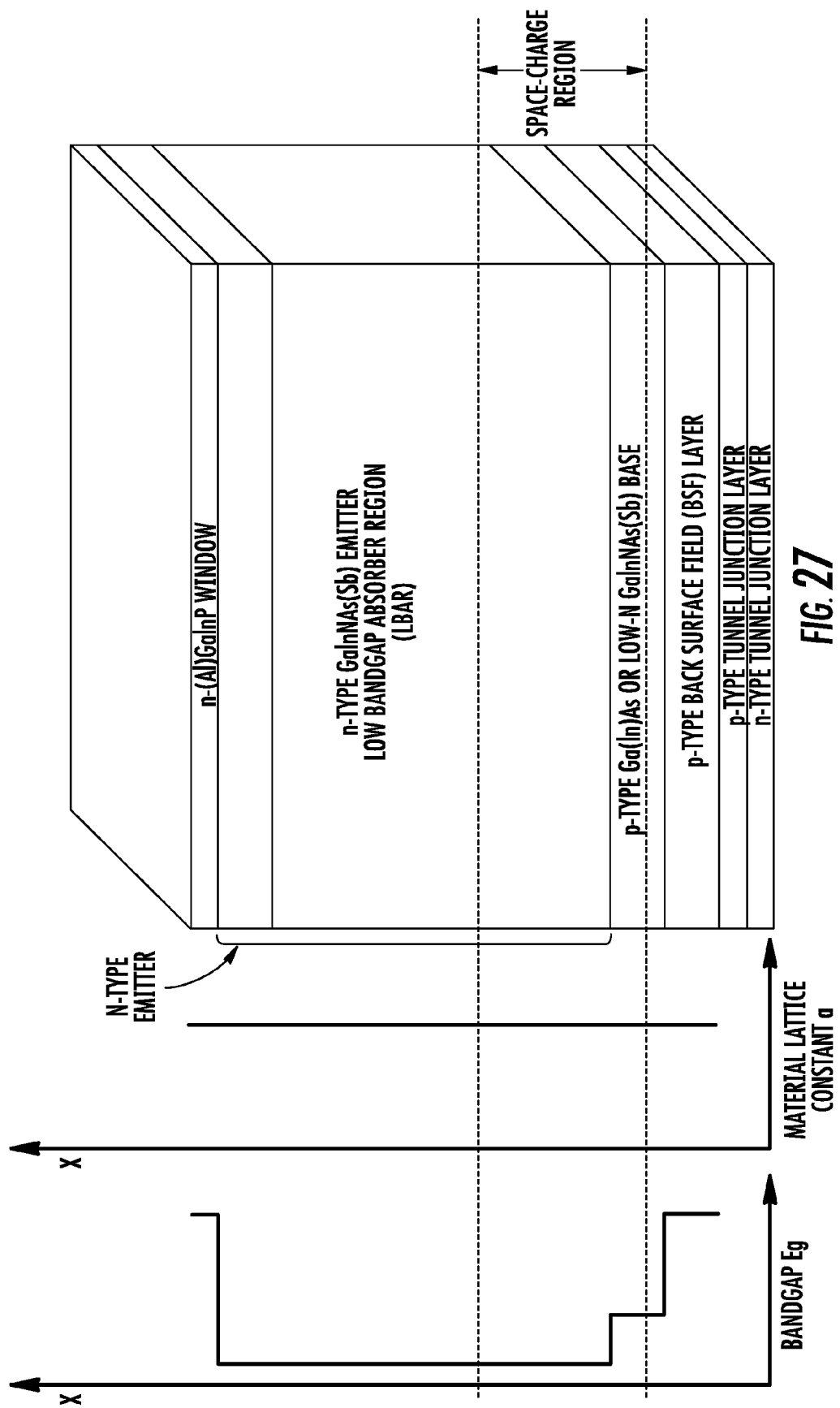
FIG. 27 illustrates a device according to one implementation described herein.

FIG. 27 illustrates an example of a subcell within a solar cell, with a thick, n-type dilute nitride GaInNAs(Sb) emitter layer, forming an LBAR due to the reduction in bandgap due to nitrogen incorporation, such that the emitter layer is a major photoabsorbing region of the solar cell, such that 30-100%, and preferably 50-100%, of the photogeneration in the solar cell comes from the emitter layer, and with an optional GaAs, GaInAs, or low-nitrogen-content GaInNAs(Sb) base, with lower N content and higher bandgap with respect to the emitter.

Figure 28:
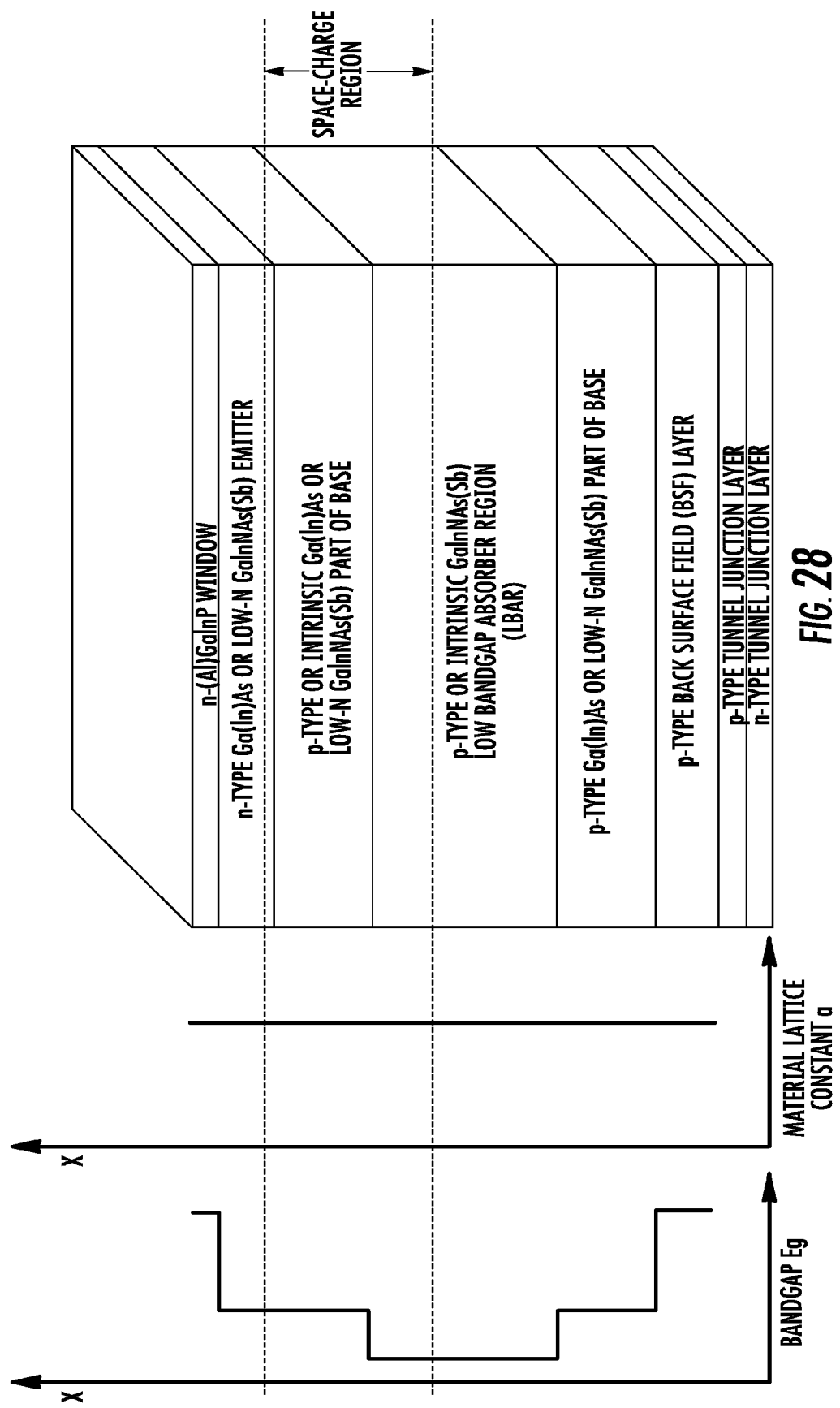
FIG. 28 illustrates a device according to one implementation described herein.

FIG. 28 illustrates an example of a subcell within a solar cell, with a p-type dilute nitride GaInNAs(Sb) layer within the base, forming an LBAR in the base due to the reduction in bandgap due to nitrogen incorporation, and with additional base layers and emitter layers composed of GaAs, GaInAs, or low-nitrogen-content GaInNAs(Sb), having lower N content and higher bandgap with respect to the base LBAR layer, forming improved transport (IT) layers in the base and emitter, due to the absence or lower concentration of N.

Figure 29:
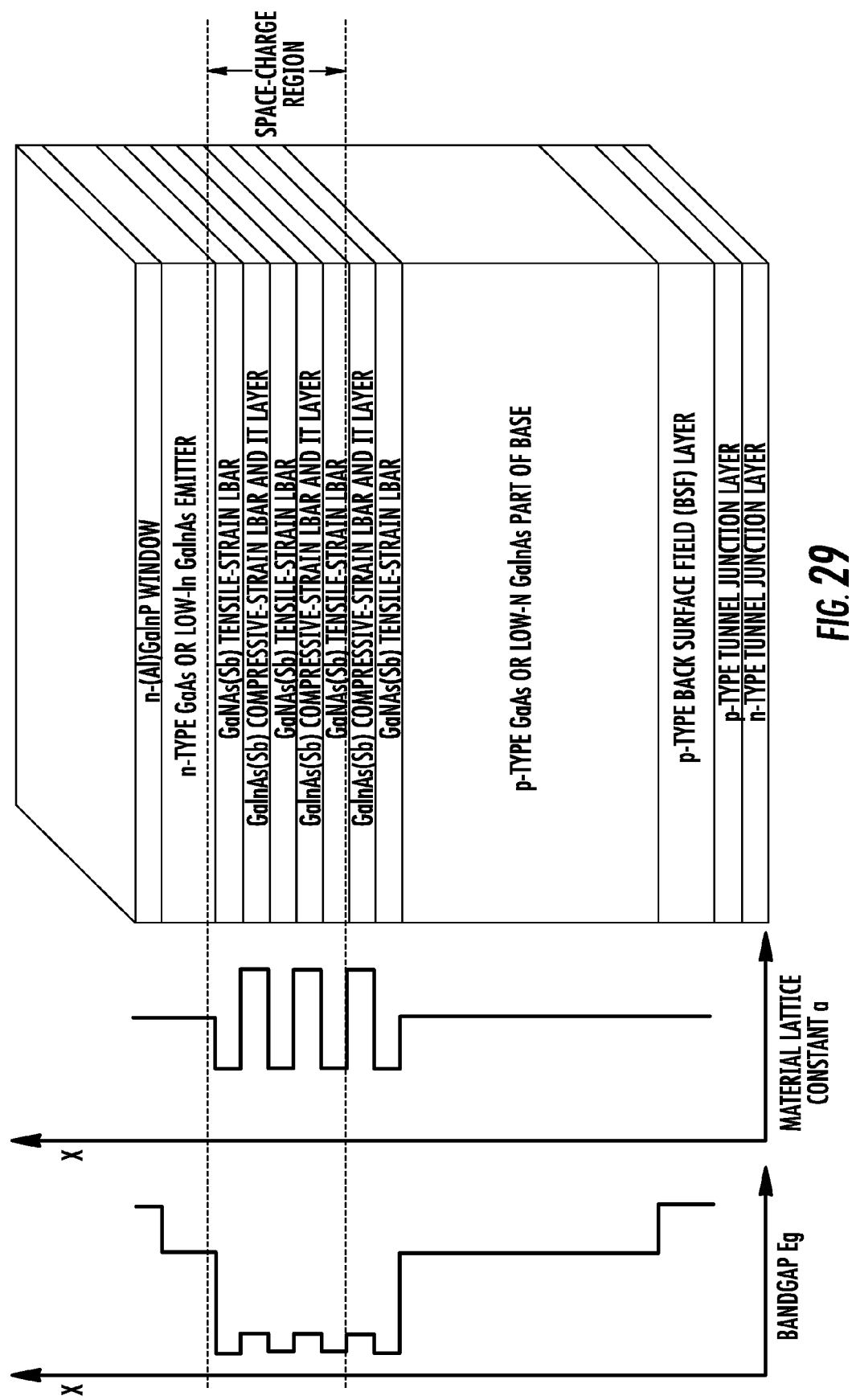
FIG. 29 illustrates a device according to one implementation described herein.

FIG. 29 illustrates an example of a subcell within a solar cell, with alternating GaNAs(Sb) layers in the base in tensile strain, and GaInAs(Sb) layers in the base in compressive strain balancing the strain in the tensile-strain layers, such that both tensile and compressive layers have lower bandgap than a GaAs or low-indium-content GaInAs base layer, forming LBARs in both the tensile GaNAs(Sb) and compressive GaInAs(Sb) layers in the base, and additionally forming improved transport (IT) layers in the compressive GaInAs(Sb) layers, due partly to the absence of nitrogen.

Figure 30:
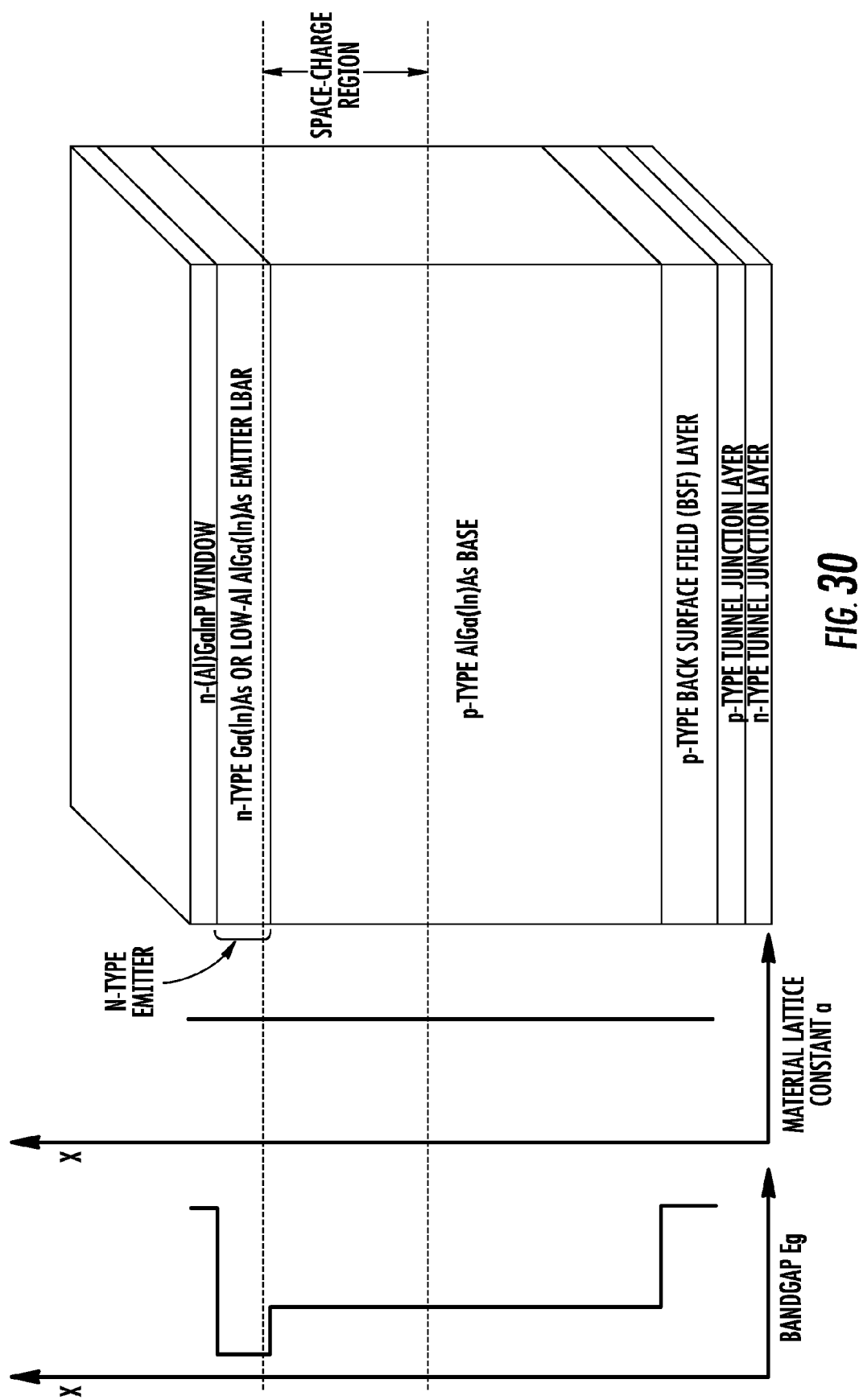
FIG. 30 illustrates a device according to one implementation described herein.

FIG. 30 illustrates an example of a subcell within a solar cell, with an AlGa(In)As base, and with an Al-free Ga(In)As or low-Al-content AlGa(In)As layer within the emitter and/or base, forming an LBAR and/or improved transport (IT) layer, where the improved charge carrier transport properties may result from the absence or low concentration of aluminum (Al) in the LBAR and/or IT layer. The example diagram shows a case in which the LBAR and IT layer is partly in the emitter quasi-neutral region and partly in the emitter space-charge region, and in which the LBAR and IT layer forms 100% of the emitter layer. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

Figure 31:
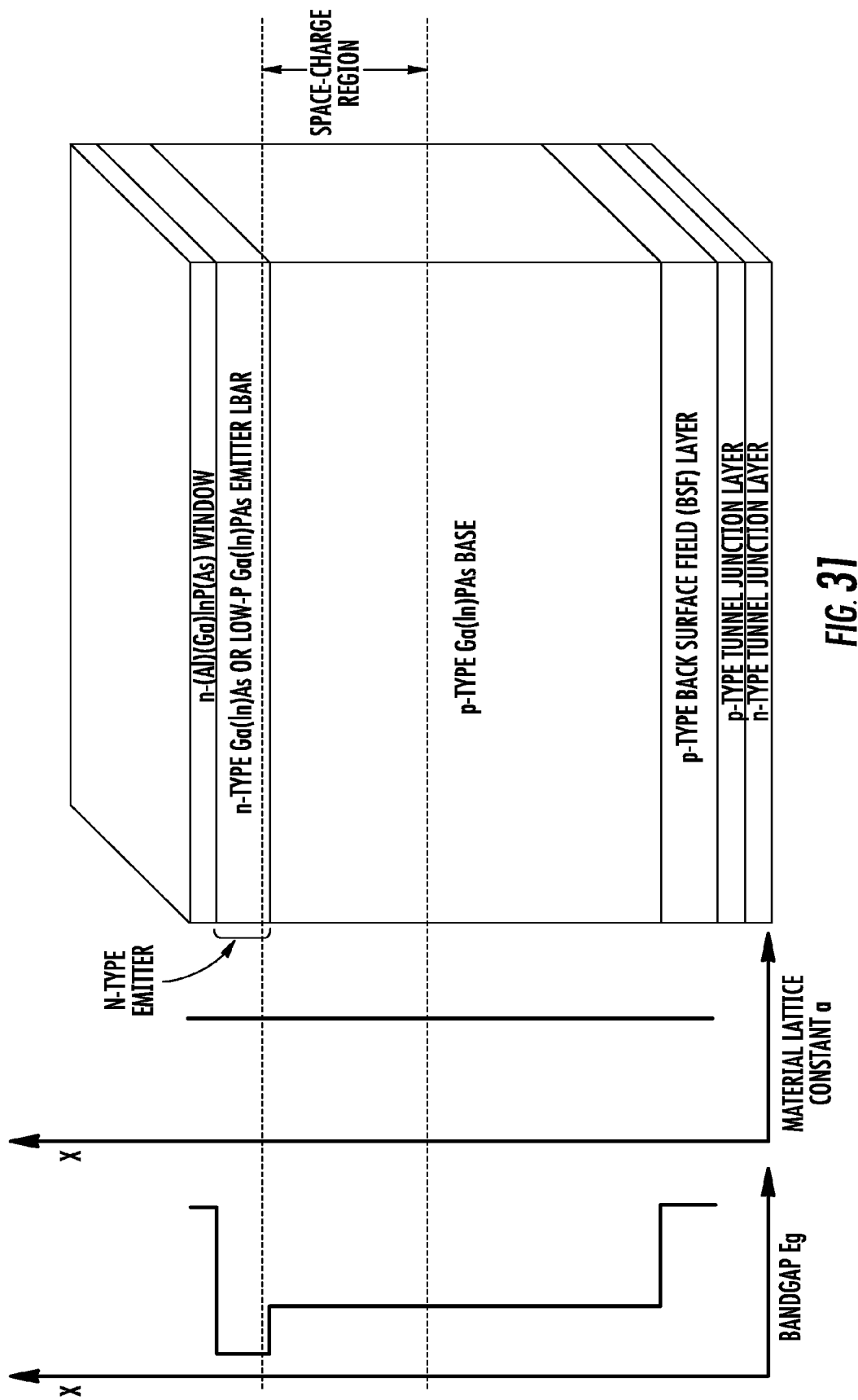
FIG. 31 illustrates a device according to one implementation described herein.

FIG. 31 illustrates an example of a subcell within a solar cell, with a Ga(In)PAs base, and with an P-free Ga(In)As or low-P-content Ga(In)PAs layer within the emitter and/or base, forming an LBAR and/or improved transport (IT) layer, where the improved charge carrier transport properties may result from the absence or low concentration of phosphorus (P) in the LBAR and/or IT layer. The example diagram shows a case in which the LBAR and IT layer is partly in the emitter quasi-neutral region and partly in the emitter space-charge region, and in which the LBAR and IT layer forms 100% of the emitter layer. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

Figure 32:
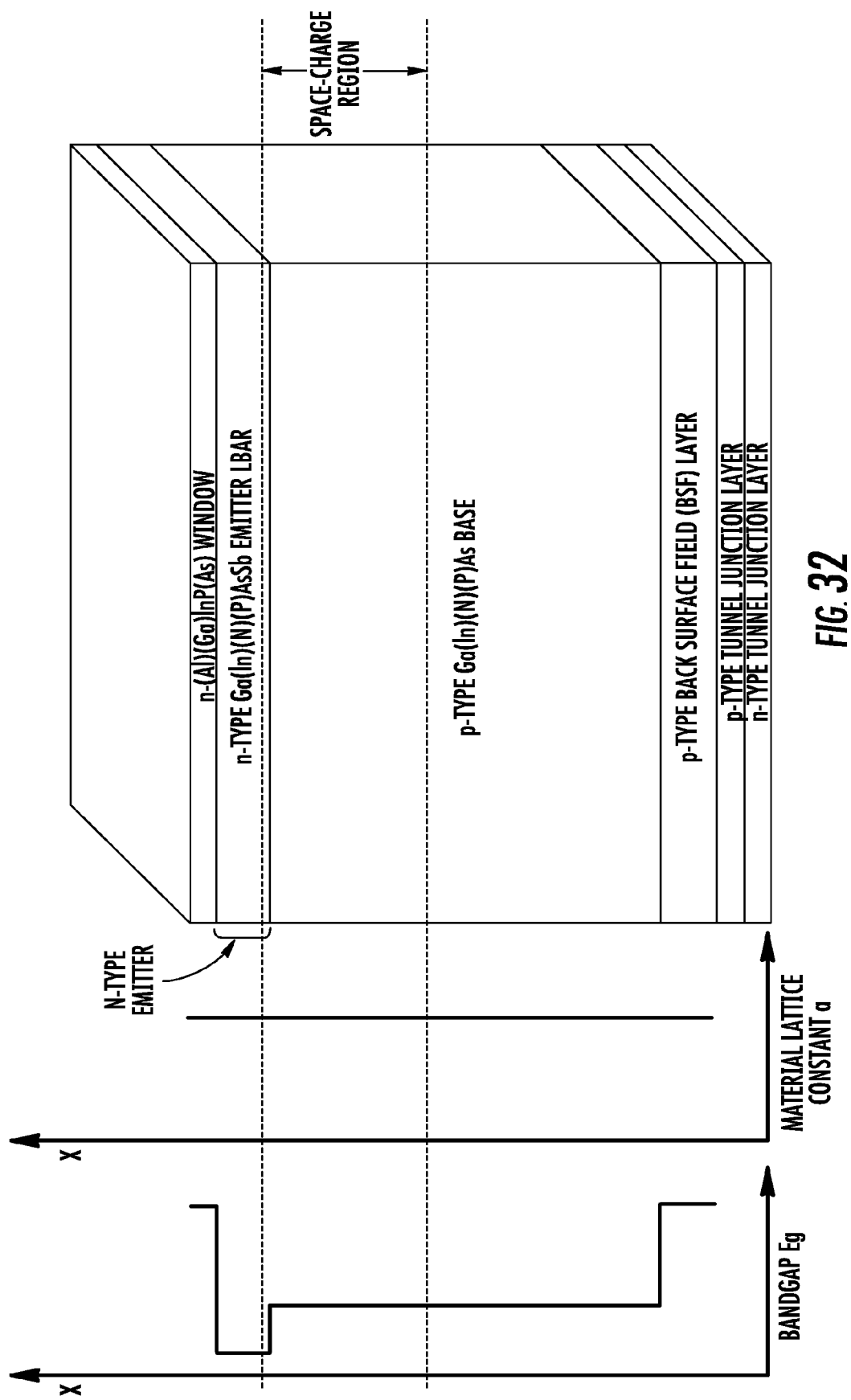
FIG. 32 illustrates a device according to one implementation described herein.

FIG. 32 illustrates an example of a subcell within a solar cell, with a Ga(In)(N)(P)As base, and with an Sb-containing Ga(In)(N)(P)AsSb layer within the emitter and/or base, forming an LBAR and/or improved transport (IT) layer, where the improved charge carrier transport properties may result from the presence of antimony (Sb) in the LBAR and/or IT layer, or during the growth of the LBAR and/or IT layer. The example diagram shows a case in which the LBAR and IT layer is partly in the emitter quasi-neutral region and partly in the emitter space-charge region, and in which the LBAR and IT layer forms 100% of the emitter layer. The LBAR and/or IT layer thickness may be varied to affect current balance in the multijunction cell, for example, the thickness may range from 0% to 100% of the total emitter thickness. In addition, the emitter thickness may vary from 0% (no emitter case) to 100% (all emitter case) of the combined emitter thickness plus the base thickness. In general, the LBAR and/or IT layer or layers may have any of the configurations described herein.

Figure 33:
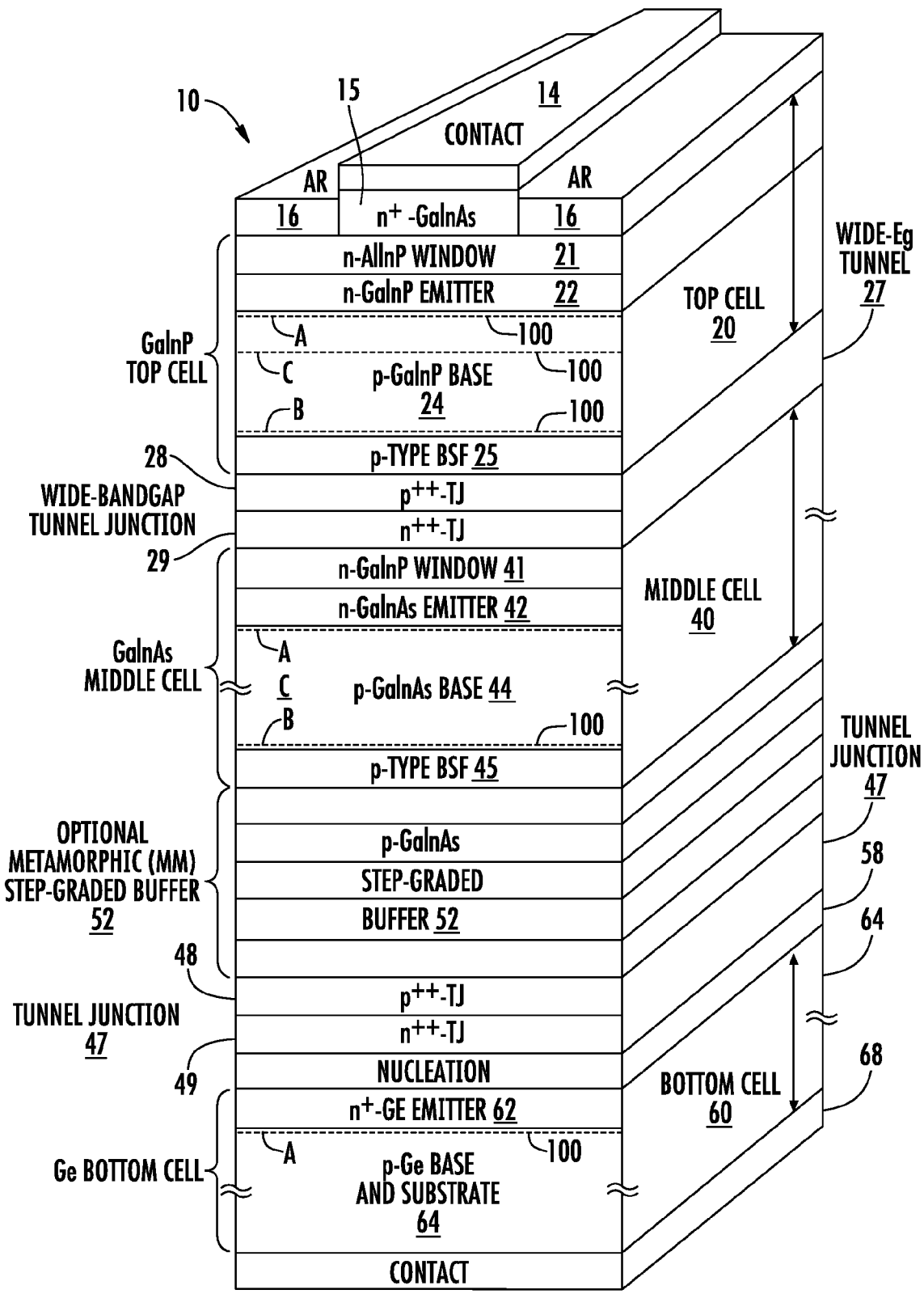
FIG. 33 illustrates a device according to one implementation described herein.

FIG. 33 shows a diagram of a multijunction cell, showing features of a general multijunction solar cell structure. In the example shown in the figure, the multijunction (MJ) cell is a 3-junction solar cell that has a GaInP top cell (cell 1 or C1) base, a GaInAs cell 2 (C2) base, and a Ge cell 3 (C3) base which also serves as a growth substrate or growth wafer. Also shown in the example in the figure is an optional metamorphic (MM) step-graded buffer. When such a metamorphic buffer is included, the component cells of the MJ cell (e.g., cell 1, cell 2, cell 3, etc., also referred to as subcells) and layers grown after or on top of the metamorphic buffer are also referred to as metamorphic cells or layers. When the component cells of the MJ cell are grown with the same material lattice constant as the growth substrate or as the subcell upon which they are grown (or with the same lattice constant due to pseudomorphic strain) they are referred to as being lattice-matched (LM) to the growth substrate or subcell upon which they are grown, and the optional metamorphic buffer is typically excluded in this lattice-matched case.

Referring again to FIG. 33, this figure illustrates a cross-sectional view of a lattice-matched (LM) multijunction photovoltaic solar cell, and of a metamorphic (MM) multijunction (MJ) photovoltaic solar cell (MJ cell) 10. The MJ cell 10 includes a top subcell 20, a middle subcell 40, and bottom subcell 60, connected in electrical series. The top, middle and bottom subcells 20, 40, 60 may be referred to according to the material of their respective base layers 24, 44, 64, or a GaInP subcell 20, a GaInAs subcell 40, and a Ge subcell 60. The cell 10 may be composed of a GaInP subcell 20 including a GaInP base layer 24, a Ga(In)As subcell 40 including a Ga(In)As base layer 44 (where the parentheses around In indicates that In is an optional element), and a Ge subcell 60 including a Ge base layer 64. The Ge base layer 64 is formed from a Ge growth substrate.

In another implementation, the cell 10 may be formed from: group III-V semiconductors, group IV semiconductors, group II-VI semiconductors, group I-III-VI semiconductors, and/or other semiconductor families. In another implementation, the cell 10 may be formed from semiconductor materials selected from the group including GaAs, GaInAs, GaInP, AlGaAs, AlInAs, AlGaInAs, AlInP, AlGaInP, GaInPAs, AlInPAs, AlGaInPAs, GaPAs, InPAs, AlGaAsSb, AlInAsSb, GaInAsSb, GaAsSb, GaP, InP, AlAs, GaAs, InAs, AlSb, GaSb, InSb, GaNAs, GaInNAs, GaInNPAs, GaInNAsSb, AlGaInN, AlGaN, AlInN, GaInN, AlN, GaN, InN, Ge, Si, SiGe, SiGeSn, SiC.

The top, middle and bottom subcells 20, 40, 60 may also be referred to by the order in which light strikes each subcell as it enters the cell 10. Accordingly, the top subcell 20 may also be referred to as subcell 1, the middle subcell 40 may be referred to as subcell 2, and the bottom subcell 60 as subcell 3. In general, n subcells may be connected in series, where n may be equal to 1 for a single junction cell, or n may be any integer greater than or equal to 2 for a multijunction cell. The growth substrate may be electrically inactive, or, it may be electrically active, thereby forming one of the n subcells in the multijunction cell.

In one implementation, the cell 10 is a metamorphic (MM) MJ cell and the middle cell 40 is a MM middle cell and the top cell 20 is a MM top cell. In another implementation, the cell 10 is a MM MJ cell and the middle cell 40 is a GaInAs middle cell and the top cell 20 is a MM GaInP top cell.

In one implementation, the Ge subcell 60 may be formed from a Ge wafer that serves as a substrate for epitaxial growth of the semiconductor layers that form the upper subcells. The Ge wafer further serves as the main mechanical support for the cell, in addition to serving as one of the three active subcells in cell 10. The epitaxial growth of semiconductor layers on the substrate may be initiated with a nucleation layer 58. The nucleation layer 58 can also serve as a window layer for the Ge subcell 60.

A tunnel junction 47 is faulted atop the nucleation layer 58. The tunnel junction 47 includes a $n^{++}$ tunnel layer 48 and a $p^{++}$ tunnel layer 48. The tunnel junction 47 may be formed between the lowermost epitaxial subcell and the above, beneath, or in the body of the metamorphic buffer region 52.

The metamorphic buffer layer 52 includes 5 layers of transitioning lattice constant buffer layers between the bottom subcell 60 and the middle subcell 40. In another implementation, the metamorphic buffer layer 52 may contain one or more buffer layers. Such growth typically occurs between the nucleation layer 58 and the lowermost epitaxial subcell (such as the middle cell 40).

The bottom and middle subcells 60, 40 are lattice mismatched to one another, i.e., have a different lattice constant from one another. Additionally, the middle and top subcells 40, are lattice mismatched to one another. In an implementation, the cell 10 is a metamorphic structure. As used herein, the term "lattice matched" means that the lattice constants are within 1% of each other. Also as used herein, the term "lattice mismatched" means the lattice constants are different by more than 1%.

In one implementation, the lattice constant of adjacent subcells differs by 0.5% or less. The difference between the lattice constants may also be in the range between 0.5% and 1.5%; between 1.5% and 2.5%; between 2.5% and 4.5%; or may be greater than 4.5%.

In one implementation, the lattice constant of adjacent subcells is equal to or is within approximately 0.1% of the lattice constant of GaAs, or 5.6533 angstroms. In another implementation, the lattice constant of adjacent subcells is equal to or is within approximately 0.1% of the lattice constant of Ge, or 5.6575 angstroms. In another implementation, the value of the lattice constant of adjacent subcells is equal to or is within approximately 0.1% of the lattice constant of InP, or 5.8688 angstroms. In another implementation, the value of, the lattice constant of adjacent subcells is equal to or is within approximately 0.1% of the lattice constant of Si, or 5.4307 angstroms. In another implementation, the value of the lattice constant of adjacent subcells is equal to or is within approximately 0.1% of the lattice constant of GaSb, or 6.09593 angstroms. In another implementation, the lattice constant of adjacent subcells is equal to or is within approximately 0.1% of that of GaN with a wurtzite crystal lattice structure, characterized by lattice constants of 3.189 angstroms and 5.185 angstroms. In another implementation, the lattice constant of adjacent subcells is equal to or is within approximately 0.1% of the lattice constant of GaN with a zincblende crystal lattice structure, or 4.50 angstroms. In another implementation, the lattice constant of adjacent subcells is equal to or is within approximately 0.1% of the lattice constant of InAs, or 6.0584 angstroms. In another implementation, the lattice constant of adjacent subcells is equal to or is within approximately 0.1% of the lattice constant of InSb, or 6.47937 angstroms. In another implementation, the lattice constant of adjacent subcells is equal to or is within approximately 0.1% of the lattice constant of CdTe, or 6.482 angstroms.

In this exemplary implementation, the lattice constant is increasing in the growth direction, or in other words, increasing in the direction from the bottom cell 60 toward the top cell 20 (the lattice constant transition takes place in the metamorphic buffer between the bottom cell and the middle cell). The increase in lattice constant in the growth direction may be referred to as a grade in the compressive direction.

In another implementation, the lattice constant may decrease in the growth direction, or in other words, decreasing in the direction from the bottom cell 60 toward the top cell 20 (the lattice constant transition takes place in the metamorphic buffer between the bottom cell and the middle cell). The decrease in lattice constant in the growth direction may be referred to as a grade in the tensile direction. In such an implementation, some material may change, for instance, the middle cell 40 may be GaPAs instead of GaInAs, which allows the middle cell 40 to have a lattice constant smaller than that of GaAs.

The tunnel junction 27 connects the top subcell 20 and the middle subcell 40 in electrical series, and the tunnel junction 47 connects the middle subcell 40 and the bottom subcell 60 in electrical series. In general, each of the n subcells in a MJ cell, such as cell 10, may be connected in series to the adjacent subcell(s) by a tunnel junction in order to form a monolithic, two-terminal, series-interconnected MJ cell. In a two-terminal configuration it can be desirable to design the subcell thicknesses and bandgaps such that each subcell has nearly the same current at the maximum power point of the current-voltage curve of each subcell, in order that one subcell does not severely limit the current of the other subcells. Alternatively, the top, middle and bottom subcells 20, 40, 60 may be contacted by means of additional terminals, for instance, metal contacts to laterally conductive semiconductor layers between the subcells, to form 3-terminal, 4-terminal, and in general, m-terminal MJ cells (m being an integer greater than or equal to 2, and less than or equal to 2n, where n is the number of active subcells in the MJ cell). The top, middle and bottom subcells 20, 40, 60 may be interconnected in circuits using these additional terminals such that most of the available photogenerated current density in each subcell can be used effectively. Such effective use may lead to high efficiency for the cell 10, even if the photogenerated current densities are very different in the various subcells.

A window 21, emitter 22, base 24, and back-surface field (BSF) layer 25 is shown in the top cell 20, a window 41, emitter 42, base 44 and BSF layer 45 are shown in the middle cell 40, and an emitter 62 and base 63 are shown the bottom cell 60.

A variety of different semiconductor materials may be used for the window layers 21, 41, and the buffer layer 52 and the nucleation layer 58. The buffer layer 52 and nucleation layer 58 also serve as window layers for the bottom cell 60. The variety of different semiconductor materials may be used for the window layers 21, 41, and the buffer layer 52 and the nucleation layer 58 may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present disclosure.

The emitter layers 22, 42, 62 may typically be thinner than the corresponding base layers 24, 44, 64 and positioned on the sunward side of the base layers, though some specialized cells also make use of back surface illumination incident on the back of the base. Most of the photogeneration of electron-hole pairs responsible for the cell current typically takes place in the base layers, though the photogenerated current density from the emitter layers 22, 42, 62 can also be significant in most cells, and in some specialized cells may exceed that in the base layers 24, 44, 64.

The emitter layer 62 of the Ge subcell 60 can be formed by diffusion into the p-type Ge substrate of column-V elements (which are n-type dopants in Ge) from the epitaxial growth of the III-V semiconductors on top of the Ge substrate. The base 64 of the Ge subcell 60 consists of the bulk of the p-type Ge wafer which also serves as the growth substrate and mechanical support for the rest of the cell 10. Although, no BSF layer appears on the back of the Ge subcell 60, a BSF layer (such as a diffused p+ region, or an epitaxially-grown group-IV or III-V semiconductor layer) may be positioned in such a location to improve the efficiency of the Ge subcell 60, as well as the overall cell 10 efficiency.

Additionally, while the base layer 64 and growth substrate may preferably be a p-Ge base layer 64 and growth substrate, other semiconductor materials may be used as the base layer 64 and growth substrate, or only as a growth substrate. These include, but are not limited to, GaAs, InP, GaSb, InAs, InSb, GaP, Si, SiGe, SiC, $Al_2O_3$, Mo, stainless steel, soda-lime glass, and $SiO_2$.

The cap layer 15 is disposed upon the top cell 20. The cap layer 15 is a semiconductor layer that fortes a low resistance electrical contact to the top surface of the top cell 20, i.e., to the window of the top cell, and also forms a low resistance electrical contact to the metal electrode or grid pattern on the top of the cell, in order for current to be conducted from the top cell to the metal electrode which forms the top electrical terminal of the solar cell with a minimum of resistive power loss. It is typically heavily doped, designated by $n^+$-doping or $p^+$-doping, in order to achieve low contact resistance to the metal electrode. The cap also serves to separate the active top cell layers from the metal layers in the top electrode, which can have deleterious effects if those metals are allowed to diffuse into or otherwise enter the active top cell layers. The cap layer 15 may be a $n^+$-doped GaInAs layer. In other implementations, the cap layer 15 may be composed of GaAs, GaInAs, GaNAs, GaInNAs, GaAsSb, AlGaAs, AlGaInAs, GaPAs, GaInP, GaInPAs, Ge, SiGe, and other III-V or group-IV semiconductors, and combinations of these materials. In other implementations, the cap layer 15 may have very high n-type doping, designated $n^+$-doping, or very high p-type doping, designated $p^+$-doping, where very high doping typically indicates doping $>10^{18}$ cm$^{-3}$, and preferably $>10^{19}$ cm$^{-3}$, and more preferably $>10^{20}$ cm$^{-3}$, particularly at the interface with the metal electrode, in order to minimize contact resistance to the metal electrode. In other implementations, the cap layer 15 may comprise multiple layers, each of which may have a different function in the cap, such a cap comprising a heavily-doped layer near the metal interface and a less heavily-doped layer contacting the top cell window; a cap comprising one or more layers used as a lateral conductance layer; a cap comprising one or more metal diffusion barrier layers; a cap comprising one or more strained layers, e.g., to balance strain elsewhere in the cell, to create strain elsewhere in the cell, or to achieve a lower bandgap to make low resistance contact formation easier; and a cap comprising one or more high bandgap layers or thinned layers to facilitate light transmission through the cap into the solar cell.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 20 are the cap layer 18 on the front of the subcell 20 (which in turn is contacted by the metal grid pattern 14 on the top of the cell 10), and the $p^{++}$-doped side 28 of the tunnel junction 27 on the back surface of the top subcell 20. The contacting layers for the middle subcell 40 are the $n^{++}$-doped side 29 of the tunnel junction 27 on front of the middle subcell 40, and the $p^{++}$-doped side 48 of the tunnel junction 47 on the back surface of the middle subcell 40. The contacting layers for the Ge bottom subcell 60 are the $n^{++}$-doped side 49 of the tunnel junction 47 on front of the buffer region 52 (provided that the buffer region 52 is considered to be part of the window structure for the Ge subcell 60), and the back metal contact 68 on the back surface of the bottom subcell 60 (which can also be considered the back surface of the entire cell 10). These contacting layers may be unpatterned, as in the case of the back metal contact 68 on the bottom subcell 60, or a transparent conductive oxide contacting the top cell window 21 or emitter 22, in place of a more conventional solar cell grid. The contacting layers may also be patterned, as in the case of the patterned heavily-doped cap 18 and metal contact 14 that form the front grid of most solar cells. An anti-reflection coating 16 can be provided on the PV cell's 10 front (sunward) surface (and, for example, disposed above the AlInP window layer 21), and may be typically made up of one, two, or more dielectric layers with thicknesses optimized to maximize transmission of light through the front surface over the range of wavelengths to which the PV cell can be responsive.

The lateral conductivity of the emitter and window layers between gridlines can be important, since after minority carriers in the base (minority electrons in the case of the p-type top cell base 24) are collected at the base/emitter p-n junction between the gridlines, the collected carriers, which are now majority carriers in the emitter (majority electrons in the n-type top cell emitter 22), must be conducted to the gridlines with minimum resistive loss. Both the top cell emitter layer 22 and window layer 21 take part in this lateral majority-carrier conduction to the gridlines. While maintaining this high conductivity, the window 21 and emitter layers 22 should remain highly transmissive to photon energies that can be used effectively by the base 24 of the top cell 20 and by the other active subcells 40, 60 in the cell 10. Further, the window 21 and emitter layers 22 should have a long diffusion length for minority-carriers that are photo-generated in the window 21 and emitter layer 22 (minority holes in the case of the n-type emitter 22), so that they may be collected at the p-n junction before recombining. Since the transmittance and diffusion length both tend to decrease for high doping levels, an optimum doping level typically exists at which cell efficiency can be maximized, for which the conductivity of the window 21 and emitter layer 22 can be high enough that resistive losses are small compared to the power output of the cell 20, and yet the transmittance and minority-carrier collection in the window 21 and emitter layer 22 are high enough that most of the photons incident on the cell 20 generate useful current.

The highly-doped layers that form the tunnel junctions between cells, with their very low sheet resistance, also serve as lateral conduction layers. Such conduction layers help to make the current density across the cell 10 more uniform in the case of spatially non-uniform intensity or spectral content of the light incident on the cell. Laterally-conductive layers between the subcells 20, 40, and on the back of the bottom cell 60, are also very important in the case of MJ cell designs which have more than two terminals. For example, in mechanically-stacked or monolithically-grown MJ cells, with 3, 4, or more terminals, the subcells operate at current densities that are not all necessarily the same in order to optimize the efficiency of each subcell and hence of the entire MJ cell. Laterally-conductive regions between the subcells 20, 40 and at the back of the bottom cell 60 are also important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

Figure 34:
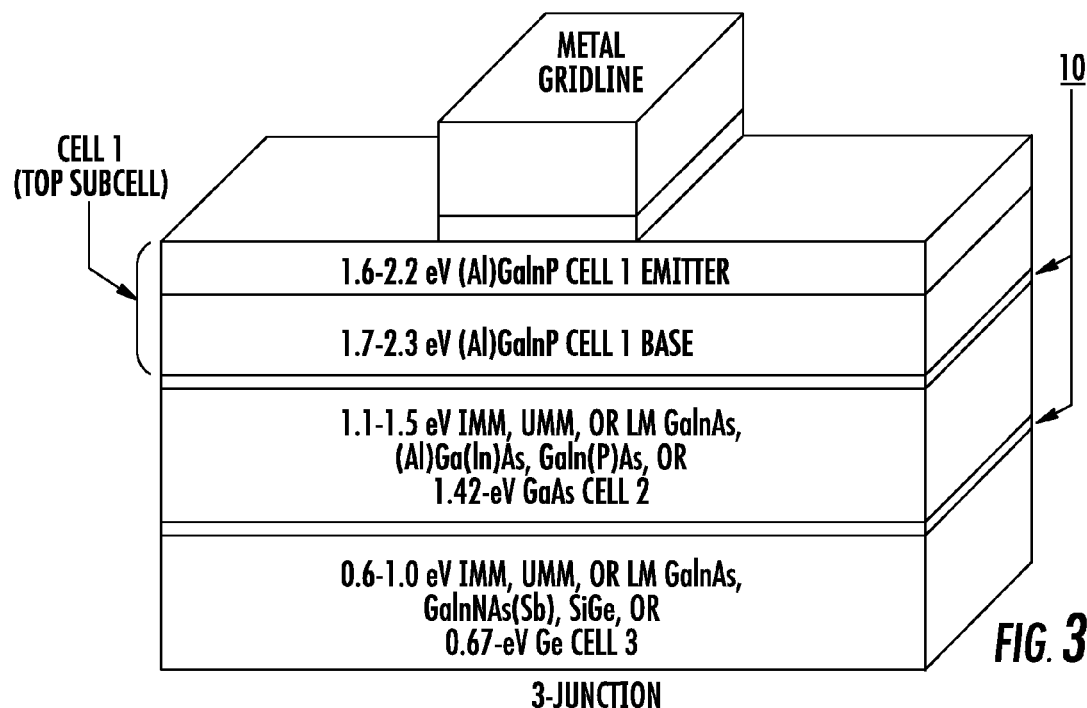
FIG. 34 illustrates a device according to one implementation described herein.
Figure 35:
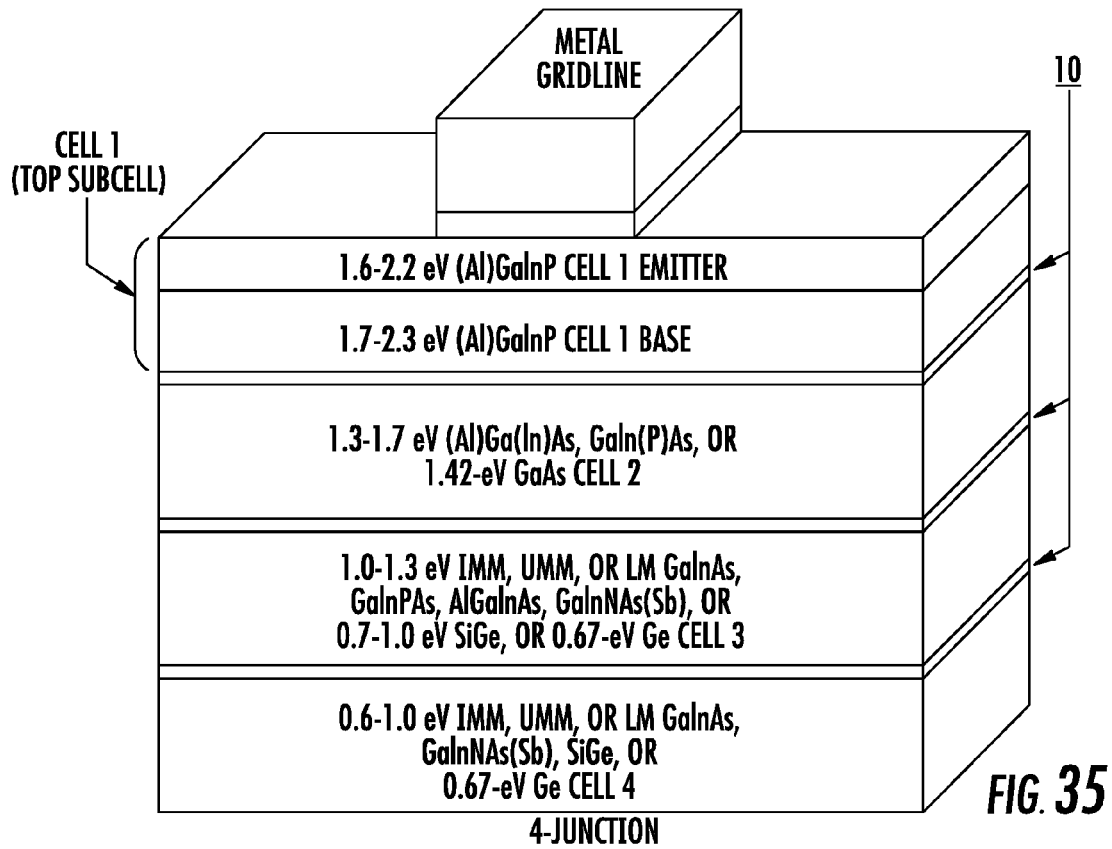
FIG. 35 illustrates a device according to one implementation described herein.

FIGS. 34-35 illustrate examples of a 3-junction solar cell (FIG. 34) and a 4-junction solar cell (FIG. 35), incorporating a GaInP or low-Al-content AlGaInP emitter LBAR or improved transport (IT) layer and a GaInP or AlGaInP base in cell 1, i.e., the top subcell of the multijunction cell. Preferred bandgap ranges for the subcells are given in the diagram, though the subcells may have bandgaps outside of these ranges. Some possible semiconductor compositions for the main photoabsorbing layer in each subcell are shown, but other compositions may be used. The LBAR or IT layers incorporated in the multijunction cells may be in any of the subcells, and may be of any of the types described elsewhere herein. In addition, the layers 10 can be tunnel junction layers between subcells, and optional graded buffer layers in IMM cells, or bonding layers in transparent layer/metal bonded or semiconductor bonded cells.

Figure 36:
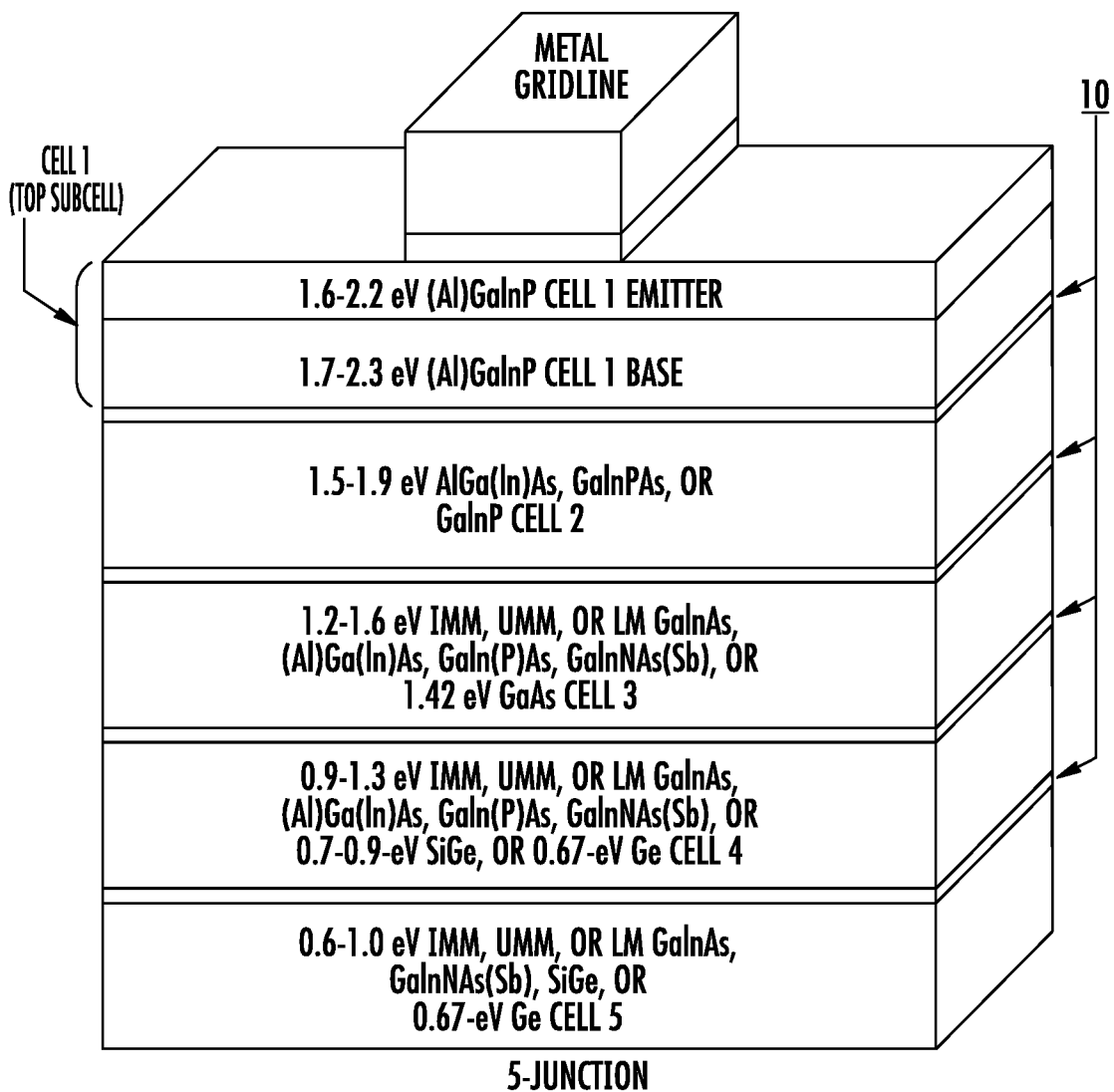
FIG. 36 illustrates a device according to one implementation described herein.
Figure 37:
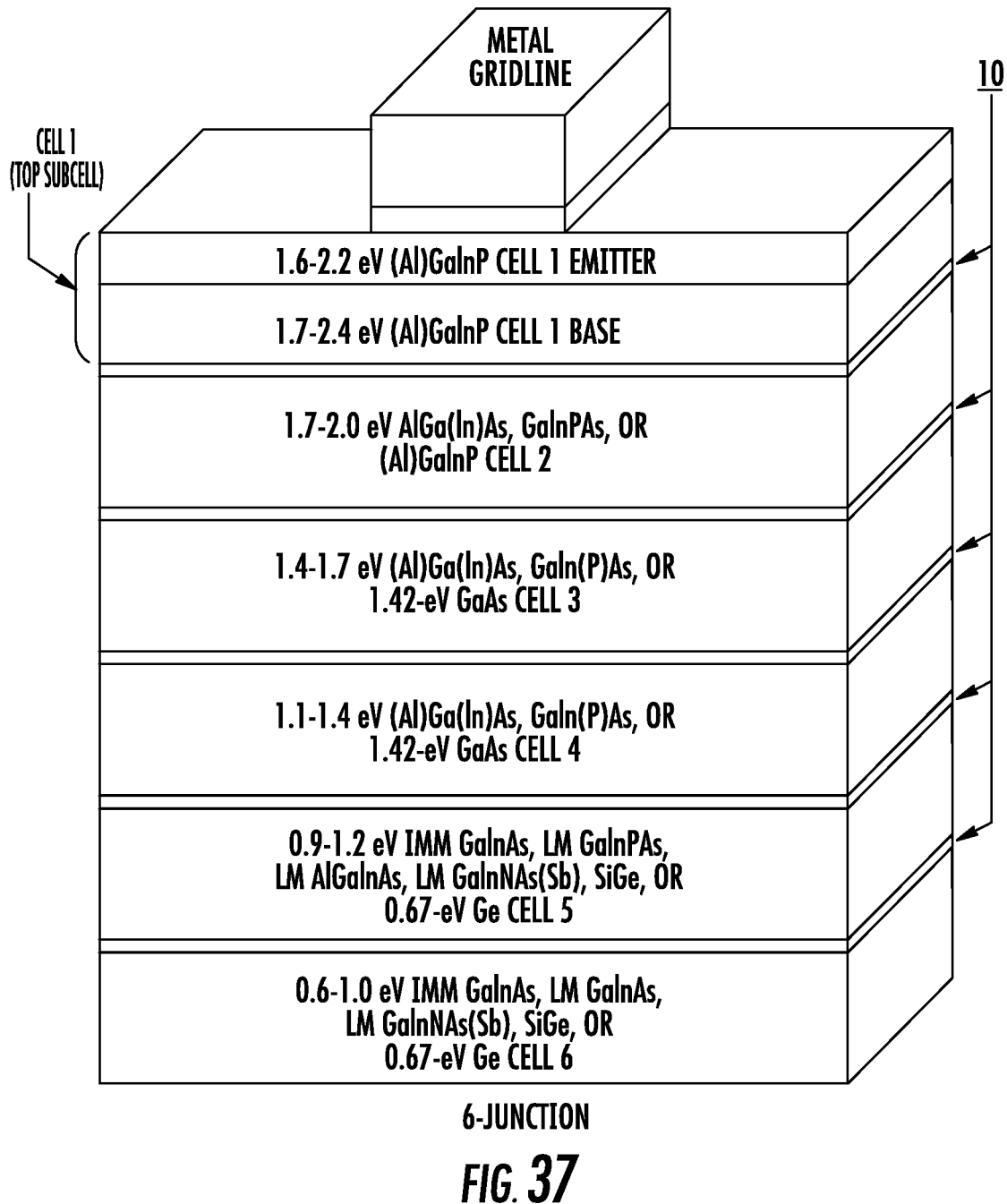
FIG. 37 illustrates a device according to one implementation described herein.

FIGS. 36-37 illustrate examples of a 5-junction solar cell (FIG. 36) and a 6-junction solar cell (FIG. 37), incorporating a GaInP or low-Al-content AlGaInP emitter LBAR or improved transport (IT) layer and a GaInP or AlGaInP base in cell 1, i.e., the top subcell of the multijunction cell. Preferred bandgap ranges for the subcells are given in the diagram, though the subcells may have bandgaps outside of these ranges. Some possible semiconductor compositions for the main photoabsorbing layer in each subcell are shown, but other compositions may be used. The LBAR or IT layers incorporated in the multijunction cells may be in any of the subcells, and may be of any of the types described elsewhere herein. In addition, the layers 10 can be tunnel junction layers between subcells, and optional graded buffer layers in IMM cells, or bonding layers in transparent layer/metal bonded or semiconductor bonded cells.

Figure 39:
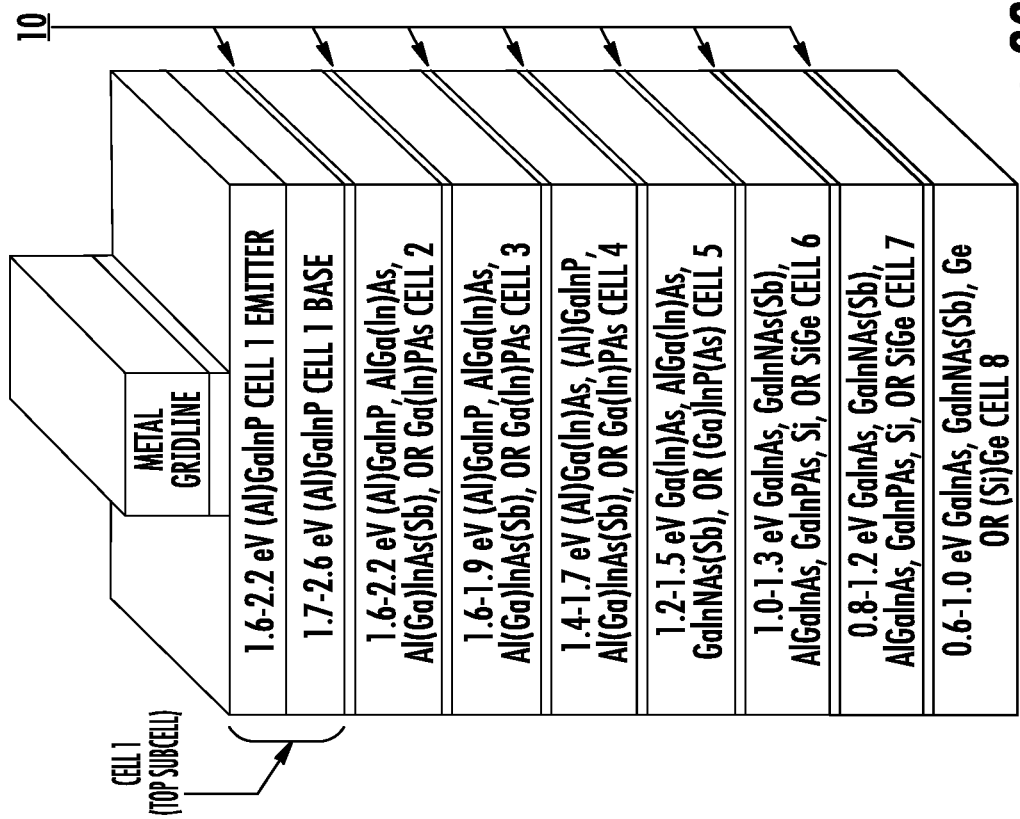
FIG. 39 illustrates a device according to one implementation described herein.
Figure 38:
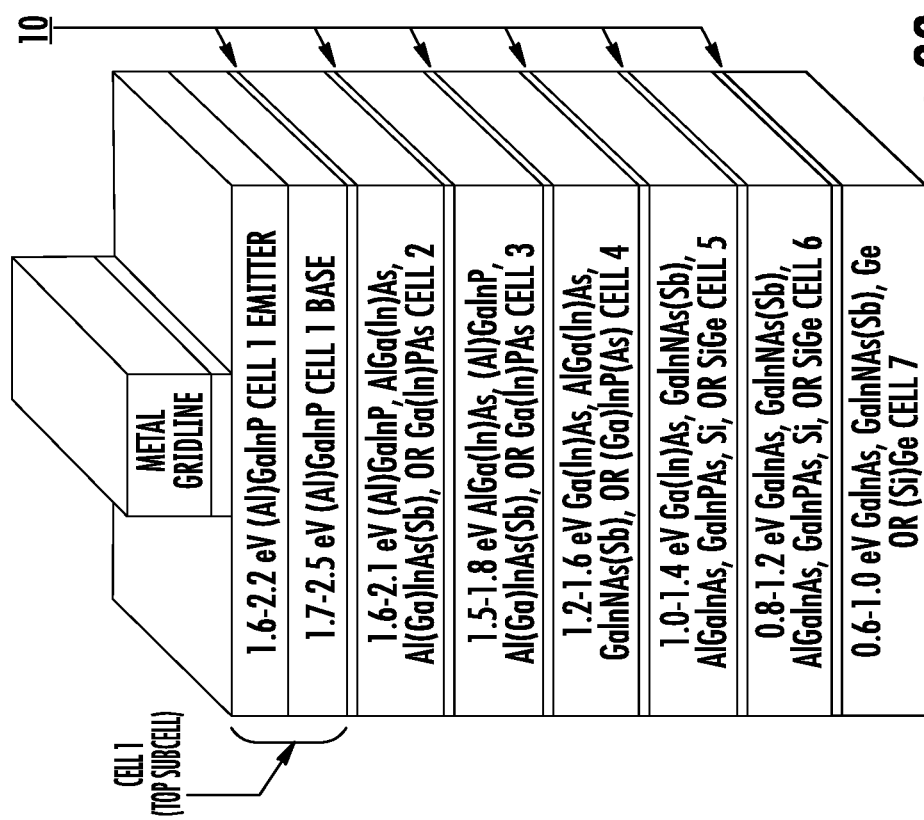
FIG. 38 illustrates a device according to one implementation described herein.
Figure 40:
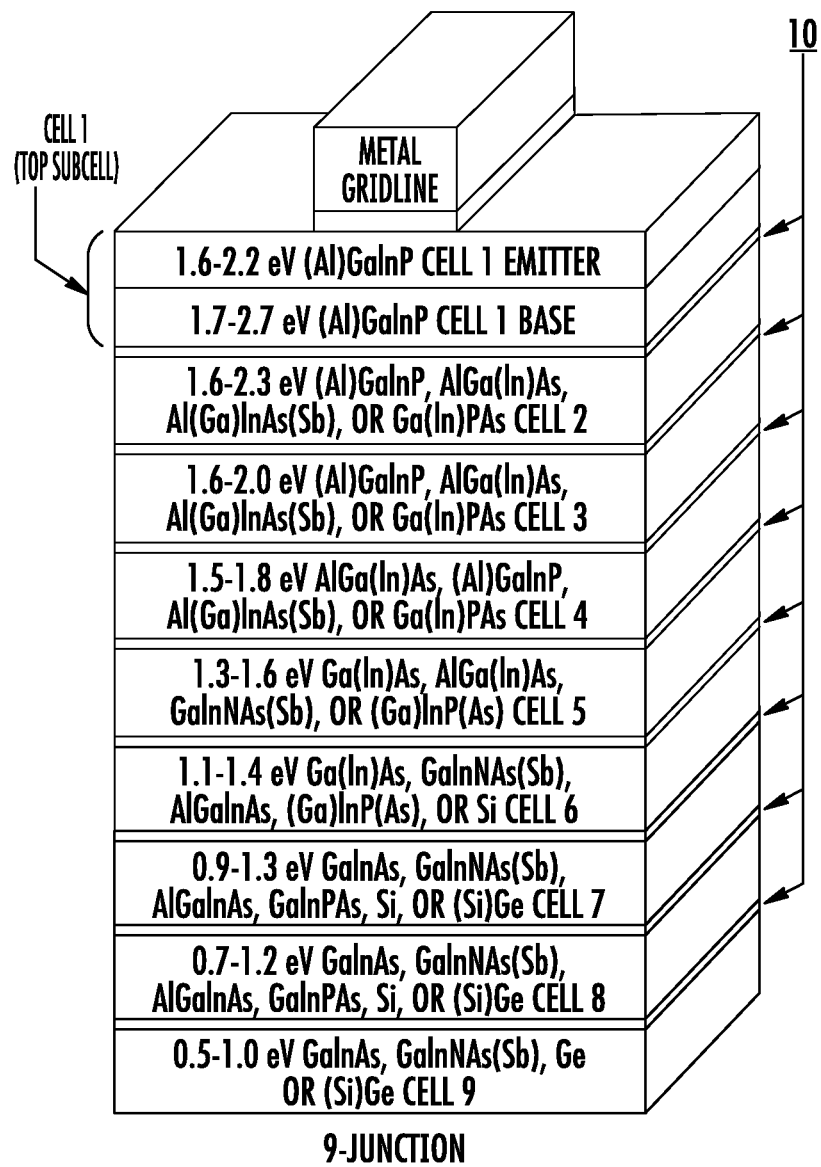
FIG. 40 illustrates a device according to one implementation described herein.

FIGS. 38-40 illustrate examples of a 7-junction solar cell (FIG. 38), an 8-junction solar cell (FIG. 39), and a 9-junction solar cell (FIG. 40), incorporating a GaInP or low-Al-content AlGaInP emitter LBAR or improved transport (IT) layer and a GaInP or AlGaInP base in cell 1, i.e., the top subcell of the multijunction cell. Preferred bandgap ranges for the subcells are given in the diagram, though the subcells may have bandgaps outside of these ranges. Some possible semiconductor compositions for the main photoabsorbing layer in each subcell are shown, but other compositions may be used. The LBAR or IT layers incorporated in the multijunction cells may be in any of the subcells, and may be of any of the types described elsewhere herein. In addition, the layers 10 can be tunnel junction layers between subcells, and optional graded buffer layers in IMM cells, or bonding layers in transparent layer/metal bonded or semiconductor bonded cells.

Figure 42:
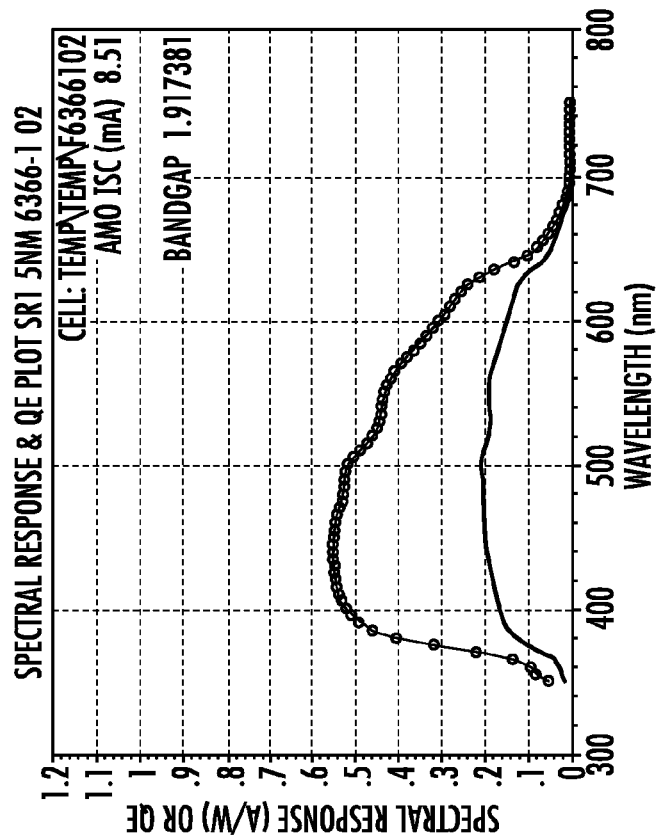
FIG. 42 illustrates a plot of the external quantum efficiency of a device according to one implementation described herein.
Figure 41:
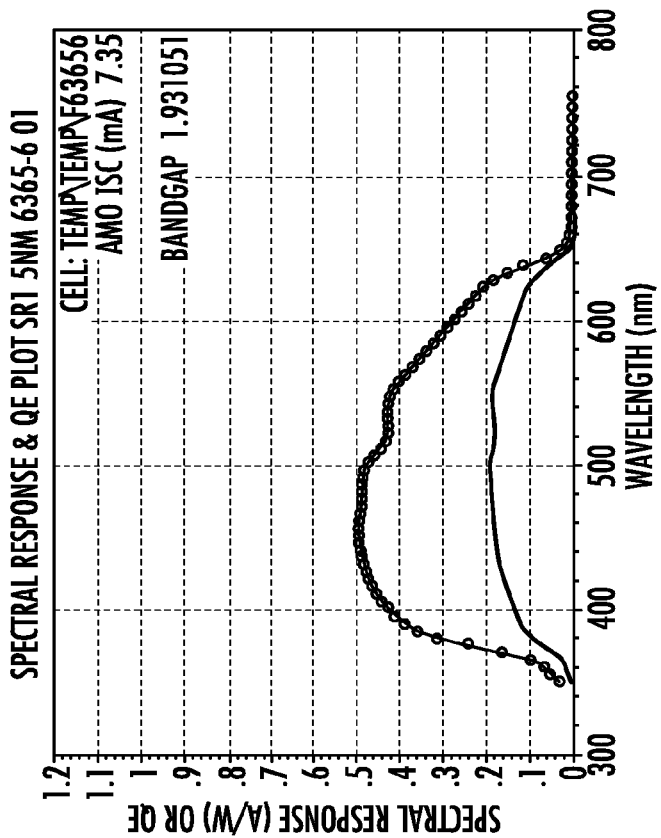
FIG. 41 illustrates a plot of the external quantum efficiency of a control device.

FIGS. 41-42 plot the measured external quantum efficiency of solar cells with a 10%-Al AlGaInP top cell base, and a 10%-Al AlGaInP top cell emitter, with no LBAR in the emitter (control case) (FIG. 41), and an Al-free GaInP (0%-Al AlGaInP) top cell emitter forming a low bandgap absorber region (LBAR) in the emitter (LBAR case) (FIG. 42) that is primarily in the quasi-neutral region of the emitter. The thickness of the LBAR in this experiment is approximately 750 angstroms, such that the LBAR thickness is significantly greater than the energy well thickness (~200 angstroms) below which the separation of electron and hole energy levels is significantly increased due to quantum mechanical effects. The LBAR in the emitter of the LBAR case benefits the current collected in both the short wavelength and long wavelength regions of the external quantum efficiency (EQE) curves for these non-anti-reflection-coated top cells. Compared to the control case with ~42% EQE at 400 nm, ~6% EQE at 640 nm, and ~0% EQE at 660 nm, while the LBAR case exhibits ~52% EQE at 400 nm, ~12% EQE at 640 nm, and 5% EQE at 660 nm, due to the photogeneration of charge carriers at lower photon energies by the LBAR and the improved transport (IT) of minority carriers (minority holes in this case of an n-type emitter) due to the Al-free composition of the emitter LBAR.

Figure 43:
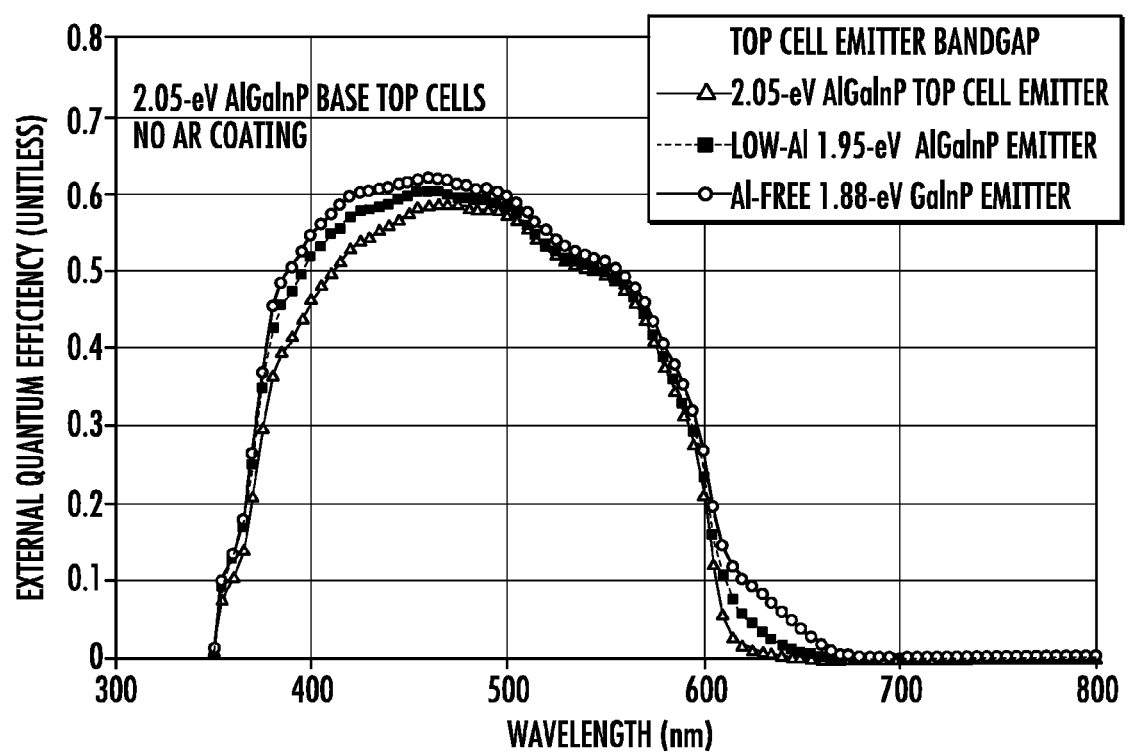
FIG. 43 illustrates a plot of the external quantum efficiency of devices, including devices according to some implementations described herein.

FIG. 43 plots the measured external quantum efficiency of solar cells with 2.05-eV AlGaInP top cell bases, and with 3 different LBAR cases in the top cell emitter: 1) a homo-junction 2.05-eV AlGaInP emitter with no LBAR in the emitter (control case); 2) a low-Al 1.95-eV AlGaInP emitter LBAR (low-Al case); and 3) an Al-free 1.88-eV GaInP emitter LBAR (Al-free case). The LBAR in the emitter for both the low-Al and Al-free cases benefits the current collected in both the short wavelength and long wavelength regions of the external quantum efficiency (EQE) curves for these non-anti-reflection-coated top cells. Compared to the control case with ~46% EQE at 400 nm and ~4% EQE at 625 nm, the low-Al case has ~52% EQE at 400 nm and ~4% EQE at 625 nm, while the Al-free emitter LBAR case has ~55% at 400 and ~9% EQE at 625 nm, due to the photogeneration of charge carriers at lower photon energies by the LBAR and the improved transport (IT) of minority carriers (minority holes in this case of an n-type emitter) due to the Al-free or low-Al composition of the emitter LBAR.

Various implementations of the disclosure have been described in fulfillment of the various objectives of the disclosure. It should be recognized that these implementations are merely illustrative of the principles of the present disclosure. Numerous modifications and adaptations thereof will be readily apparent to those skilled in the art without departing from the spirit and scope of the disclosure.

That which is claimed is:

1. An optoelectronic device comprising a photovoltaic cell, the photovoltaic cell comprising:
 a space-charge region;
 a quasi-neutral region; and
 a low bandgap absorber region (LBAR) layer or an improved transport (IT) layer at least partially positioned in the quasi-neutral region of the cell,
 wherein the LBAR layer or the IT layer forms a first portion of a base layer of the cell and the cell further comprises:
  a window layer;
  a back-surface-field (BSF) layer;
  an emitter layer;
  a second portion of the base layer; and
  a third portion of the base layer,
 wherein the first portion of the base layer is disposed between the second portion of the base layer and the third portion of the base layer, the second portion of the base layer is adjacent the emitter layer, the third portion of the base layer is disposed between the first portion of the base layer and the BSF layer, and the first portion of the base layer is positioned entirely in the quasi-neutral region of the base layer, entirely in the space-charge region, or partly in the quasi-neutral region and partly in the space-charge region, wherein the first portion of the base layer has a lower aluminum mole percent and lower bandgap than the second and third portions of the base layer.

2. The device of claim 1, wherein the LBAR layer has a lower bandgap than an immediately adjacent semiconductor layer of the cell.

3. The device of claim 1, wherein the IT layer has a higher collected photogenerated current density than a replacement layer having the composition of an immediately adjacent photogeneration layer.

4. The device of claim 1, wherein the cell comprises an LBAR layer and an IT layer at least partially positioned in the quasi-neutral region.

5. The device of claim 4, wherein the LBAR layer and the IT layer are the same layer.

6. The device of claim 1, wherein the LBAR layer or the IT layer is free or substantially free of aluminum and at least one semiconductor layer immediately adjacent the LBAR layer or the IT layer includes aluminum and has a higher bandgap than the LBAR layer or the IT layer.

7. The device of claim 1, wherein the LBAR layer or the IT layer includes nitrogen and at least one semiconductor layer immediately adjacent the LBAR layer or the IT layer is free or substantially free of nitrogen and has a higher bandgap than the LBAR layer or the IT layer.

8. The device of claim 1, wherein the LBAR layer or the IT layer comprises one or more of GaInP, AlGaInP, GaAs, AlGaAs, GaInAs, GaAsSb, AlGaInAs, AlGaAsSb, GaInPAs, and AlGaInPAs.

9. The device of claim 1, wherein the device is an inorganic semiconductor device.

10. The device of claim 1, wherein the device comprises a plurality of photovoltaic cells.

11. The device of claim 10, wherein the device comprises a multi junction photovoltaic device and each photovoltaic cell forms a subcell of the photovoltaic device.

12. The device of claim 11, wherein at least two of the cells of the device comprise:
    a space-charge region;
    a quasi-neutral region; and
    a low bandgap absorber region (LBAR) layer or an improved transport (IT) layer at least partially positioned in the quasi-neutral region of the cell.

13. The device of claim 1, wherein the device comprises a photodiode.

14. An optoelectronic device comprising a photovoltaic cell, the photovoltaic cell comprising:
    a space-charge region;
    a quasi-neutral region; and
    a low bandgap absorber region (LBAR) layer or an improved transport (IT) layer at least partially positioned in the quasi-neutral region of the cell,
wherein the LBAR layer or the IT layer forms a first portion of a base layer of the cell and the cell further comprises:
    a window layer;
    a back-surface-field (BSF) layer;
    an emitter layer;
    a second portion of the base layer; and
    a third portion of the base layer,
wherein the first portion of the base layer is disposed between the second portion of the base layer and the third portion of the base layer, the second portion of the base layer is adjacent the emitter layer, the third portion of the base layer is disposed between the first portion of the base layer and the BSF layer, and wherein the first portion of the base layer has a greater degree of group-III sublattice ordering and a lower bandgap than the second and third portions of the base layer.

15. The device of claim 14, wherein the LBAR layer has a lower bandgap than two immediately adjacent semiconductor layers of the cell.

16. The device of claim 14, wherein the IT layer has a higher collected photogenerated current density than a replacement layer having the composition of either of the two immediately adjacent photogeneration layers.

17. The device of claim 14, wherein the LBAR layer or the IT layer comprises no more than about 15 mole percent aluminum relative to the total amount of group III elements present in the layer and wherein at least one semiconductor layer immediately adjacent the LBAR layer or the IT layer includes a higher mole percent of aluminum than the LBAR layer or the IT layer and has a higher bandgap than the LBAR layer or the IT layer.

18. The device of claim 14, wherein the LBAR layer or the IT layer includes nitrogen and at least one semiconductor layer immediately adjacent the LBAR layer or the IT layer includes a non-zero amount of nitrogen, the immediately adjacent semiconductor layer having a higher bandgap than the LBAR layer or the IT layer and a lower mole percent of nitrogen than the LBAR layer or the IT layer.

19. The device of claim 14, wherein the LBAR layer or the IT layer comprises one or more of GaNAs, GaInNAs, GaNAsSb, and GaInNAsSb.

20. An optoelectronic device comprising a photovoltaic cell, the photovoltaic cell comprising:
    a space-charge region;
    a quasi-neutral region; and
    a low bandgap absorber region (LBAR) layer or an improved transport (IT) layer at least partially positioned in the quasi-neutral region of the cell,
wherein the LBAR layer or the IT layer comprises one or more layers of a first layer type having a first bandgap and a first amount of strain with respect to the average lattice constant of the photovoltaic cell, and further comprises one or more layers of a second layer type having a second bandgap that is greater than the first bandgap, and a second amount of strain such that the layers of the second layer type are in tensile strain with respect to the layers of the first layer type, and wherein the strain of the layers of the first layer type is balanced with the strain of the layers of the second layer type such that both types of layers remain pseudomorphic and retain a coherent lattice structure with a crystal defect areal density lower than $10^6$ cm$^{-2}$.

21. The device of claim 20, wherein the LBAR layer or the IT layer is positioned entirely in the quasi-neutral region of the cell.

22. The device of claim 20, wherein the LBAR layer or the IT layer is positioned partly in the quasi-neutral region of the cell and partly in the space-charge region of the cell.

23. The device of claim 20, wherein the cell further comprises an emitter layer and the LBAR layer or the IT layer is positioned at least partially in the quasi-neutral region of the emitter layer.

24. The device of claim 20, wherein the cell further comprises a base layer and the LBAR layer or the IT layer is positioned at least partially in the quasi-neutral region of the base layer.

25. The device of claim 20, wherein the LBAR layer or the IT layer forms the entirety of a functional layer of the cell.

26. The device of claim 25, wherein the functional layer comprises an emitter layer, base layer, window layer, or back-surface-field (BSF) layer.

27. The device of claim 25, wherein the functional layer comprises an emitter layer.

28. The device of claim 27, wherein the emitter layer has a thickness that is between about 50% and about 100% of the total thickness of a photoabsorber of the cell.

29. The device of claim 27, wherein the cell further comprises a base layer and wherein the emitter layer has a thickness that is up to about 20% of the sum of the emitter layer thickness plus the base layer thickness.

30. The device of claim 12, wherein the cell further comprises:
a window layer;
a BSF layer; and
a base layer,
wherein the base layer and the emitter layer form a photoabsorber layer disposed between the window layer and the BSF layer.

31. The device of claim 20, wherein the LBAR layer or the IT layer forms a first portion of an emitter layer of the cell and the cell further comprises:
a window layer;
a back-surface-field (BSF) layer;
a base layer; and
a second portion of the emitter layer,
wherein the first portion of the emitter layer is disposed between the base layer and the second portion of the emitter layer, and the first portion of the emitter layer is positioned partially in the space-charge region of the emitter layer and partially in the quasi-neutral region of the emitter layer.

32. The device of claim 20, wherein the LBAR layer or the IT layer forms a first portion of an emitter layer of the cell and the cell further comprises:
a window layer;
a back-surface-field (BSF) layer;
a base layer; and
a second portion of the emitter layer,
wherein the second portion of the emitter layer is disposed between the base layer and the first portion of the emitter layer, the first portion of the emitter layer is adjacent the window layer, and the first portion of the emitter layer is positioned entirely in the quasi-neutral region of the emitter layer.

33. The device of claim 20, wherein the LBAR layer or the IT layer forms a first portion of a base layer of the cell and the cell further comprises:
a window layer;
a back-surface-field (BSF) layer;
an emitter layer; and
a second portion of the base layer,
wherein the first portion of the base layer is disposed between the emitter layer and the second portion of the base layer, the second portion of the base layer is adjacent the BSF layer, and the first portion of the base layer is positioned partially in the space-charge region of the base layer and partially in the quasi-neutral region of the base layer.

34. The device of claim 20, wherein the LBAR layer or the IT layer forms a first portion of a base layer of the cell and the cell further comprises:
a window layer;
a back-surface-field (BSF) layer;
an emitter layer;
a second portion of the base layer; and
a third portion of the base layer,
wherein the first portion of the base layer is disposed between the second and third portions of the base layer, and the first portion of the base layer is positioned partially in the space-charge region of the base layer and partially in the quasi-neutral region of the base layer.

35. The device of claim 20, wherein the LBAR layer or the IT layer forms a first portion of a base layer of the cell and the cell further comprises:
a window layer;
a back-surface-field (BSF) layer;
an emitter layer; and
a second portion of the base layer,
wherein the first portion of the base layer is disposed between the BSF layer and the second portion of the base layer, the second portion of the base layer is adjacent the emitter layer, and the first portion of the base layer is positioned entirely in the quasi-neutral region of the base layer.

36. The device of claim 20, wherein the LBAR layer or the IT layer forms a first portion of a base layer of the cell and the cell further comprises:
a window layer;
a back-surface-field (BSF) layer;
an emitter layer;
a second portion of the base layer; and
a third portion of the base layer,
wherein the first portion of the base layer is disposed between the second portion of the base layer and the third portion of the base layer, the second portion of the base layer is adjacent the emitter layer, the third portion of the base layer is disposed between the first portion of the base layer and the BSF layer, and the first portion of the base layer is positioned entirely in the quasi-neutral region of the base layer.

37. The device of claim 20, wherein the cell further comprises an emitter layer and a base layer, and wherein the LBAR layer or the IT layer comprises no more than about 15 mole percent aluminum relative to the total amount of group III elements present in the layer, and is positioned in or composes the entirety of the emitter layer, and wherein the base layer includes a higher mole percent of aluminum than the LBAR layer or the IT layer and has a higher bandgap than the LBAR layer or the IT layer.

38. The device of claim 20, wherein the cell further comprises:
an emitter layer; and
a base layer having a higher bandgap than the emitter layer,
wherein an LBAR layer including nitrogen is disposed in the emitter layer, and the base layer has a lower nitrogen content than the LBAR layer and forms an IT layer.

39. The device of claim 20, wherein the cell further comprises:
a base layer; and
an emitter layer having a higher bandgap than the base layer,
wherein an LBAR layer including nitrogen is disposed in the base layer and an emitter layer having a higher bandgap and a lower nitrogen content than the LBAR layer forms an IT layer.

* * * * *